(12) United States Patent
Funatsu et al.

(10) Patent No.: US 9,704,844 B2
(45) Date of Patent: Jul. 11, 2017

(54) METHOD OF MANUFACTURING SEMICONDUCTOR DEVICE

(71) Applicant: Renesas Electronics Corporation, Tokyo (JP)

(72) Inventors: Katsuhiko Funatsu, Kawasaki (JP); Tomoaki Uno, Kawasaki (JP); Toru Ueguri, Kawasaki (JP); Yukihiro Sato, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/133,032

(22) Filed: Apr. 19, 2016

(65) Prior Publication Data

US 2016/0233204 A1  Aug. 11, 2016

Related U.S. Application Data

(60) Continuation of application No. 14/685,145, filed on Apr. 13, 2015, now Pat. No. 9,343,451, which is a
(Continued)

(30) Foreign Application Priority Data

Sep. 26, 2012 (JP) ................................. 2012-212494

(51) Int. Cl.
*H01L 23/495* (2006.01)
*H01L 25/00* (2006.01)
(Continued)

(52) U.S. Cl.
CPC .......... *H01L 25/50* (2013.01); *H01L 21/4835* (2013.01); *H01L 21/4839* (2013.01);
(Continued)

(58) Field of Classification Search
None
See application file for complete search history.

(56) References Cited

U.S. PATENT DOCUMENTS

| 6,756,689 B2 | 6/2004 | Nam et al. |
| 6,992,385 B2 | 1/2006 | Satou et al. |

(Continued)

FOREIGN PATENT DOCUMENTS

| CN | 101595560 A | 12/2009 |
| JP | 11-274194 | 10/1999 |

(Continued)

OTHER PUBLICATIONS

Office Action issued Mar. 1, 2016, in Japanese Patent Application No. 2012-212494.

(Continued)

*Primary Examiner* — Benjamin Sandvik
(74) *Attorney, Agent, or Firm* — Shapiro, Gabor and Rosenberger, PLLC

(57) ABSTRACT

To improve the reliability in applying a tape to the rear surface of a substrate while securing the heat resistance of the tape applied to the rear surface of the substrate. There is a gap between a bottom surface of a ditch provided in a support member and an upper surface of a driver IC chip. On the other hand, the upper surface side of a lead frame is supported by the support member so that the bottom surface of the ditch contacts the upper surface of a Low-MOS clip mounted over a Low-MOS chip. Thus, even in a state where the driver IC chip and the Low-MOS chip are mounted on the upper surface side of the lead frame, the tape can be reliably applied to the rear surface of the lead frame (in particular, to the rear surface of the product region).

14 Claims, 71 Drawing Sheets

Related U.S. Application Data division of application No. 14/037,360, filed on Sep. 25, 2013, now Pat. No. 9,029,197.

(51) Int. Cl.

| | | |
|---|---|---|
| *H01L 21/56* | (2006.01) | |
| *H01L 21/48* | (2006.01) | |
| *H01L 23/00* | (2006.01) | |
| *H01L 23/31* | (2006.01) | |
| *H01L 21/683* | (2006.01) | |
| *H01L 21/78* | (2006.01) | |
| *H01L 25/18* | (2006.01) | |

(52) U.S. Cl.
CPC ............ *H01L 21/56* (2013.01); *H01L 21/561* (2013.01); *H01L 21/6836* (2013.01); *H01L 21/78* (2013.01); *H01L 23/3107* (2013.01); *H01L 23/495* (2013.01); *H01L 23/49503* (2013.01); *H01L 23/49537* (2013.01); *H01L 23/49541* (2013.01); *H01L 23/49548* (2013.01); *H01L 23/49562* (2013.01); *H01L 23/49575* (2013.01); *H01L 24/34* (2013.01); *H01L 24/36* (2013.01); *H01L 24/37* (2013.01); *H01L 24/40* (2013.01); *H01L 24/83* (2013.01); *H01L 24/97* (2013.01); *H01L 25/18* (2013.01); *H01L 2221/68327* (2013.01); *H01L 2221/68331* (2013.01); *H01L 2224/05554* (2013.01); *H01L 2224/0603* (2013.01); *H01L 2224/29139* (2013.01); *H01L 2224/37147* (2013.01); *H01L 2224/40095* (2013.01); *H01L 2224/40245* (2013.01); *H01L 2224/45144* (2013.01); *H01L 2224/48091* (2013.01); *H01L 2224/48137* (2013.01); *H01L 2224/48247* (2013.01); *H01L 2224/49171* (2013.01); *H01L 2224/49175* (2013.01); *H01L 2224/73221* (2013.01); *H01L 2224/73265* (2013.01); *H01L 2224/83851* (2013.01); *H01L 2224/92247* (2013.01); *H01L 2924/1306* (2013.01); *H01L 2924/13091* (2013.01); *H01L 2924/181* (2013.01); *H01L 2924/30107* (2013.01)

(56) References Cited

U.S. PATENT DOCUMENTS

| | | | |
|---|---|---|---|
| 7,145,224 B2 | 12/2006 | Kawashima et al. | |
| 7,351,612 B2 | 4/2008 | Gai | |
| 7,396,701 B2 | 7/2008 | Shigemura et al. | |
| 7,508,012 B2 | 3/2009 | Otremba | |
| 7,679,173 B2 | 3/2010 | Uno et al. | |
| 8,023,279 B2 | 9/2011 | Qian et al. | |
| 8,330,252 B2 | 12/2012 | Mahler et al. | |
| 9,029,197 B2* | 5/2015 | Funatsu | H01L 24/37 438/112 |
| 9,343,451 B2* | 5/2016 | Funatsu | H01L 21/56 |
| 2001/0007780 A1* | 7/2001 | Minamio | H01L 21/565 438/106 |
| 2005/0161785 A1* | 7/2005 | Kawashima | H01L 23/49562 257/678 |
| 2007/0072339 A1 | 3/2007 | Chen et al. | |
| 2008/0173991 A1 | 7/2008 | Cruz et al. | |
| 2009/0079051 A1* | 3/2009 | Amano | H01L 23/49503 257/676 |
| 2009/0212405 A1 | 8/2009 | Liu et al. | |
| 2009/0215230 A1* | 8/2009 | Muto | H01L 21/565 438/124 |
| 2010/0148346 A1 | 6/2010 | Quinones et al. | |
| 2010/0258924 A1* | 10/2010 | Cruz | H01L 23/49524 257/676 |
| 2010/0311208 A1* | 12/2010 | Sirinorakul | H01L 21/4832 438/113 |

FOREIGN PATENT DOCUMENTS

| | | |
|---|---|---|
| JP | 2001-257291 | 9/2001 |
| JP | 2004-266096 | 9/2004 |
| JP | 2007-266218 | 10/2007 |
| JP | 2008-053748 | 3/2008 |
| JP | 2010-114454 | 5/2010 |

OTHER PUBLICATIONS

Office Action issued Apr. 27, 2017, in Chinese Patent Application No. 201310439966.0.

* cited by examiner

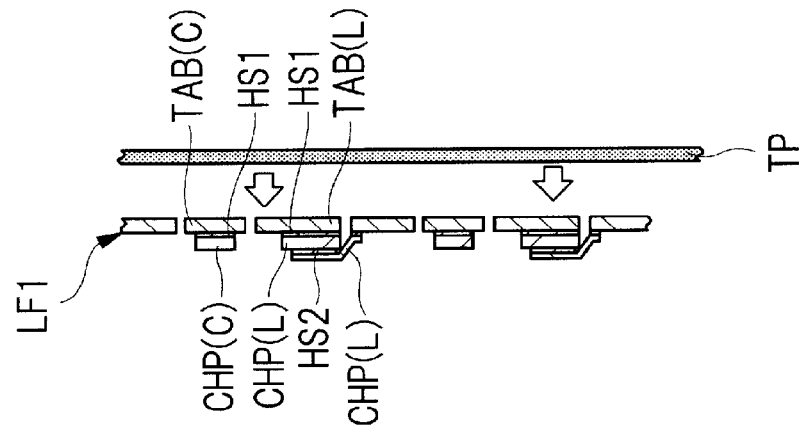
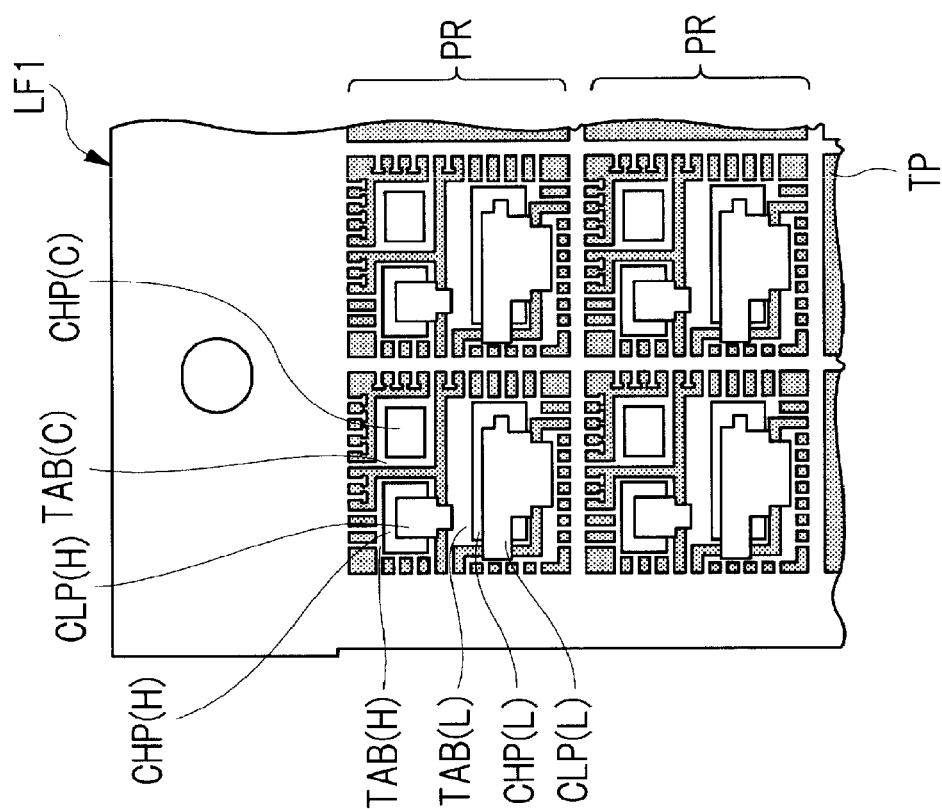
FIG. 20A / FIG. 20B

FIG. 22
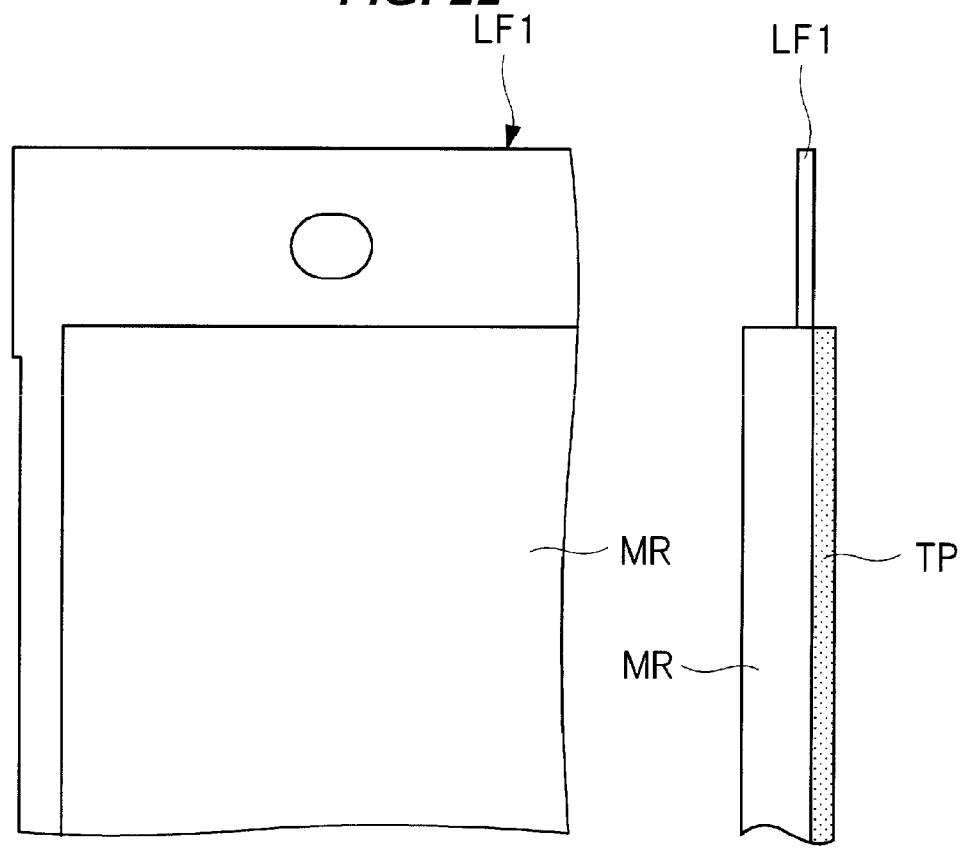
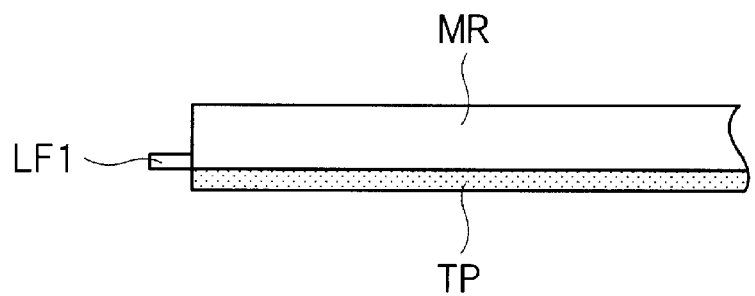

FIG. 31

| | BUFFER MATERIAL | | | SILICON (Si) | OXYGEN FREE COPPER | STAINLESS (SUS304) |
|---|---|---|---|---|---|---|
| | URETHANE RUBBER | SILICONE RUBBER | NITRILE RUBBER | | | |
| LONGITUDINAL ELASTIC MODULUS [MPa] | 24.0~29.4 | 5~7 | 8.1~20.2 | 185000 | 220 | 620 |
| SHORE A HARDNESS [Hs] | 50~90 | 50~70 | 50~70 | — | — | — |
| VICKERS HARDNESS [HV] | — | — | — | 1040 | 105 | 196 |

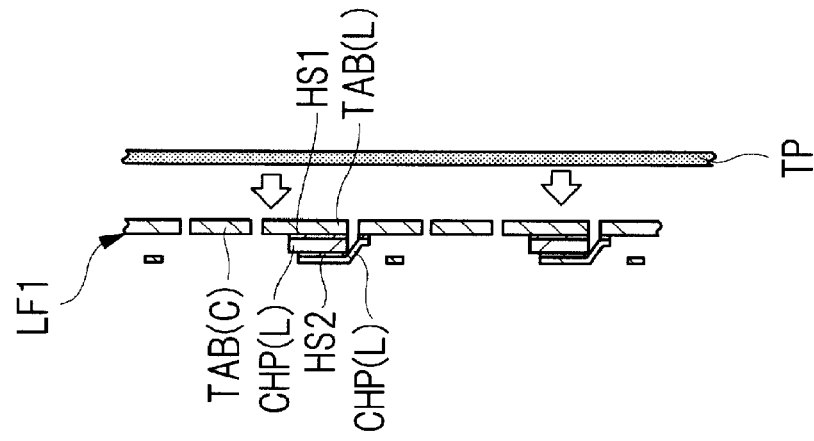
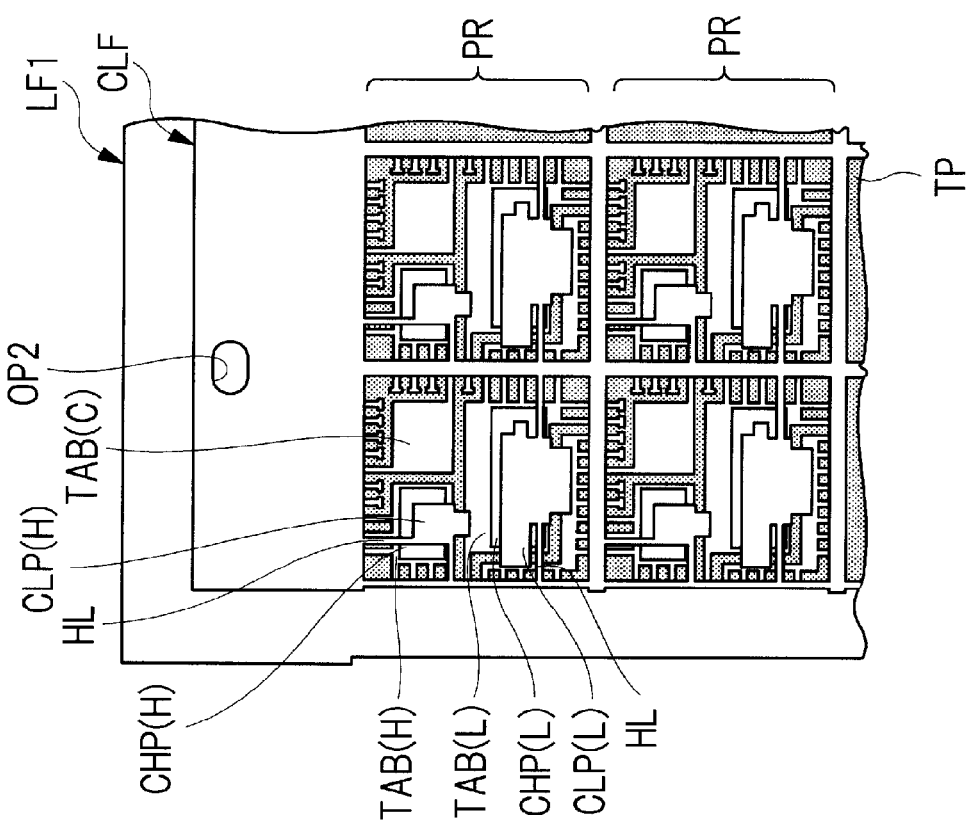

METHOD OF MANUFACTURING SEMICONDUCTOR DEVICE

CROSS-REFERENCE TO RELATED APPLICATION

The disclosure of Japanese Patent Application No. 2012-212494 filed on Sep. 26, 2012 including the specification, drawings and abstract is incorporated herein by reference in its entirety.

BACKGROUND

The present invention relates to techniques for manufacturing semiconductor devices, and relates to a technique effectively applied to the technique for manufacturing resin-sealed semiconductor devices, for example.

Japanese Patent Laid-Open No. 2001-257291 describes a technique, in which a brazing material, such as solder, is used for coupling between one conductive path and one circuit element, while a conductive paste, such as an Ag paste, is used for coupling between the other conductive path and the other circuit element.

In Japanese Patent Laid-Open No. 2010-114454, one semiconductor chip is mounted over a wiring substrate, and the wiring substrate and one semiconductor chip are coupled to each other using a first solder. This first solder is formed by a high melting point solder (e.g., a Pb(lead)-Sn(tin) solder containing Pb(lead)) that is in a liquid state at temperatures equal to or greater than 280° C., for example. Furthermore, the other semiconductor chip is also mounted over the wiring substrate, and the wiring substrate and the other semiconductor chip are coupled to each other using a second solder. This second solder is formed, for example, by a Pb free solder (e.g., a Sn(tin)-silver(Ag)-copper(Cu) solder) which does not contain Pb(lead) that is in a liquid state at temperatures equal to or greater than 200° C.

Japanese Patent Laid-Open No. 2008-53748 describes a technique, in which a control power MOSFET chip and a synchronous power MOSFET chip are provided. Then, drain terminals on the respective rear surfaces of the control power MOSFET chip and the synchronous power MOSFET chip are bonded to an input side plate-like lead portion and an output side plate-like lead portion, respectively, via a die bonding material, such as a silver paste, for example.

SUMMARY

A semiconductor device is formed, for example, from a semiconductor chip having a semiconductor element, such as a MOSFET (Metal Oxide Semiconductor Field Effect Transistor), formed therein, and a package that is formed so as to cover this semiconductor chip. The package structure of such a semiconductor device includes various types, such as a BGA (Ball Grid Array) package, a QFP (Quad Flat Package) package, and a QFN (Quad Flat Non-leaded Package) package.

Here, attention is focused on the QFN package, for example. In a technique for manufacturing the QFN package using a MAP molding technique, employed is a technique which suppresses the leakage of resin into a rear surface terminal by applying a tape to the rear surface of a substrate.

Here, for example, there may be a case where there exists a step that heats at a first temperature an adhesive for bonding a semiconductor chip to a chip mounting portion formed on the substrate. In this case, if the tape is applied to the rear surface of the substrate in advance prior to this heating step, the tape might not be able to withstand the heat treatment at the above-described first temperature when the first temperature is higher than a heat-resisting temperature of the tape.

Therefore, it can be considered that the tape is applied to the rear surface of the substrate after the above-described heating step is carried out. However, in this case, a semiconductor chip is already mounted on the upper surface side of the substrate, and thus it may be difficult to stably apply the tape to the rear surface of the substrate while supporting the upper surface side of the substrate.

The other purposes and the new feature of the present invention will become clear from the description of the present specification and the accompanying drawings.

According to an embodiment, after a heating step of heating a first conductive adhesive and a second conductive adhesive at a first temperature is carried out, a tape applying step of applying a tape to a face opposite to a face, over which a first semiconductor chip is mounted, of a first lead frame is carried out. Here, the tape applying step applies the tape to the first lead frame while supporting a first metal plate.

Moreover, according to an embodiment, after the heating step of heating the first conductive adhesive and the second conductive adhesive at the first temperature is carried out, a tape applying step of applying a tape to a face opposite to a face, over which a first semiconductor chip is mounted, of a first lead frame is carried out. Subsequently, after a second semiconductor chip is mounted onto a second chip mounting portion via a third conductivity adhesive, the third conductive adhesive is heated at a second temperature. Here, the second temperature is lower than the first temperature.

According to an embodiment, it is possible to improve the reliability in applying a tape to the rear surface of a substrate while securing the heat resistance of the tape applied to the rear surface of the substrate.

BRIEF DESCRIPTION OF THE DRAWINGS

FIGS. 20A and 20B show the manufacturing process of the semiconductor device following FIG. 19, FIG. 20A being a plan view showing the process and FIG. 20B being a cross-sectional view showing the process;

FIG. 22 is a view showing the manufacturing process of the semiconductor device following FIGS. 21A and 21B;

FIG. 31 is a view showing the modulus of longitudinal elasticity, Shore A hardness, and Vickers hardness of various materials;

FIGS. 55A and 55B show the manufacturing process of the semiconductor device following FIG. 54, FIG. 55A being a plan view showing the process and FIG. 55B being a cross-sectional view showing the process;

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, and the like (including the number, a numeric value, an amount, a range, and the like, they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for the case where it is clearly instructed in particular and where it is considered to be clearly indispensable from a theoretical point of view, or the like.

Similarly, in the following embodiments, when shape, position relationship, or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

<Circuit Configuration and Operation of DC/DC Converter>

Figure 1:
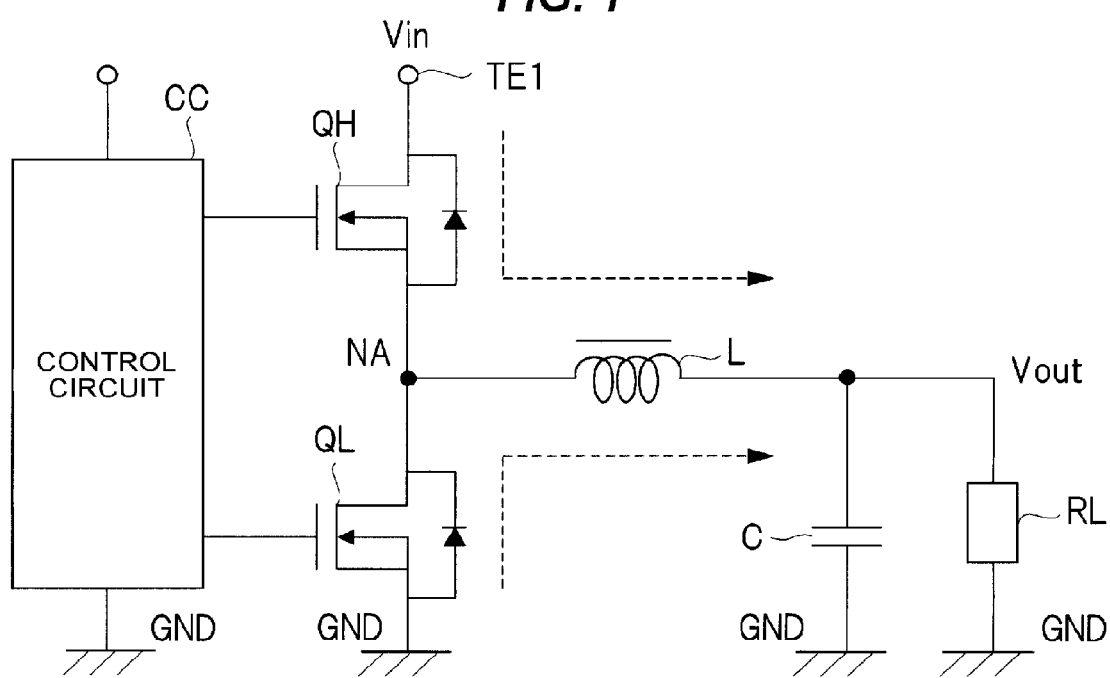
FIG. 1 is a view showing the circuit configuration of a step-down DC/DC converter.

FIG. 1 is a view showing a circuit configuration of a step-down DC/DC converter. As shown in FIG. 1, in the step-down DC/DC converter, a High-MOS transistor QH and a Low-MOS transistor QL are coupled in series between an input terminal TE1 and a ground GND. Then, an inductor L and a load RL are coupled in series between a node NA between the High-MOS transistor QH and the Low-MOS transistor QL, and the ground GND, and a capacitor C is coupled in parallel with the load RL.

Moreover, a gate electrode of the High-MOS transistor QH, and a gate electrode of the Low-MOS transistor QL are coupled to a control circuit CC, and the on/off of the High-MOS transistor QH and the on/off of the Low-MOS transistor QL are controlled by the control circuit CC. Specifically, the control circuit CC controls so as to turn off the Low-MOS transistor QL in turning on the High-MOS transistor QH and turn on the Low-MOS transistor QL in turning off the High-MOS transistor QH.

Here, for example, when the High-MOS transistor QH is on and the Low-MOS transistor QL is off, a current flows from the input terminal TE1 into the load RL via the High-MOS transistor QH and the inductor L. Subsequently, if the High-MOS transistor QH is turned off and the Low-MOS transistor QL is turned on, then first because the High-MOS transistor QH is off, the current flowing from the input terminal TE1 through the High-MOS transistor QH and the inductor L to the load RL is cut off. That is, the current flowing into the inductor L is cut off. However, if the current is reduced (cut off), the inductor L attempts to maintain the current flowing therethrough. Then, because the Low-MOS transistor QL is on, the current will then flow from the ground GND through the Low-MOS transistor QL and the inductor L to the load RL. Subsequently, again, the High-MOS transistor QH is turned on and the Low-MOS transistor QL is turned off. In the step-down DC/DC converter shown in FIG. 1, when an input voltage Vin is input to the input terminal TE1, an output voltage Vout lower than the input voltage Vin will be output across both ends of the load RL by repeating such an operation.

In the following, the reason is briefly described, why the output voltage Vout lower than the input voltage Vin is output across the both ends of the load RL by repeating the above-described switching operation when the input voltage Vin is input to the input terminal TE1. Note that, in the following, it is assumed that the current flowing through the inductor L is not intermittent.

First, it is assumed that the High-MOS transistor QH performs a switching operation in an ON period $T_{ON}$ and an OFF period $T_{OFF}$ under the control of the control circuit CC. The switching frequency in this case is $f=1/(T_{ON}+T_{OFF})$.

Here, for example, in FIG. 1, the capacitor C inserted in parallel with the load RL has a function not to allow the output voltage Vout to significantly vary within a short period of time. That is, in the step-down DC/DC converter shown in FIG. 1, because the capacitor C with a relatively large capacitance value is inserted in parallel with the load RL, in a steady state a ripple voltage contained in the output voltage Vout has a small value as compared with the output voltage Vout. Therefore, it is assumed that a fluctuation of the output voltage Vout within one cycle of switching operation can be neglected.

First, a case where the High-MOS transistor QH is on is considered. Because it is assumed that the output voltage Vout will not fluctuate within one cycle, the voltage applied to the inductor L is (Vin-Vout) and can be regarded as constant. As a result, if the inductance of the inductor L is denoted by L1, an increment $\Delta I_{on}$ in the current in the ON period $T_{ON}$ is given by Formula (1).

$$\Delta I_{on}=(Vin-Vout)/L1 \times T_{ON} \quad (1)$$

Next, a case where the High-MOS transistor QH is off is considered. In this case, because the Low-MOS transistor QL is on, the voltage applied to the inductor L is 0−Vout=−Vout. Accordingly, an increment $\Delta I_{OFF}$ in the current in the OFF period $T_{OFF}$ is given by Formula (2).

$$\Delta I_{OFF}=-Vout/L1 \times T_{OFF} \quad (2)$$

Then, in a steady state, the current flowing through the inductor L will neither increase nor decrease within one cycle of switching operation. In other words, when the current flowing through the inductor L increases or decreases within one cycle, this means the state has not reached the steady state yet. Accordingly, in the steady state, Formula (3) is satisfied.

$$\Delta I_{on}+\Delta I_{OFF}=0 \quad (3)$$

If the relationship of Formula (1) and the relationship of Formula (2) are substituted in this Formula (3), the Formula (4) shown below can be obtained.

$$Vout=Vin \times T_{ON}/(T_{ON}+T_{OFF}) \quad (4)$$

In this Formula (4), because $T_{ON} \geq 0$ and $T_{OFF} \geq 0$, Vout<Vin holds. That is, the step-down DC/DC converter shown in FIG. 1 is a circuit that outputs the output voltage Vout lower than the input voltage Vin. Then, an arbitrary output voltage Vout lower than the input voltage Vin can be obtained by varying the ON period $T_{ON}$ and the OFF period $T_{OFF}$ through control of the switching operation by the control circuit CC according to Formula (4). In particular, if the control is made so that the ON period $T_{ON}$ and the OFF period $T_{OFF}$ become constant, a fixed output voltage Vout can be obtained.

In this manner, with the step-down DC/DC converter shown in FIG. 1, the output voltage Vout lower than the input voltage Vin can be output through control of the on/off of the High-MOS transistor QH and the on/off of the Low-MOS transistor QL by the control circuit CC.

<Packaging Configuration of DC/DC Converter>

The control circuit CC, the Low-MOS transistor QL, and the High-MOS transistor QH included in the above-described DC/DC converter are commercialized as a single-packaged semiconductor device, for example. This single-packaged semiconductor device, including neither the inductor L nor the capacitor C shown in FIG. 1, is a semiconductor device constituting a part of the DC/DC converter, but for convenience, this may be referred to as a semiconductor device constituting the DC/DC converter.

A semiconductor device is formed from a semiconductor chip having a semiconductor element, such as a MOSFET (Metal Oxide Semiconductor Field Effect Transistor) formed therein, and a package formed so as to cover this semiconductor chip. The package has a function (1) to electrically couple a semiconductor element formed in a semiconductor chip to an external circuit and a function (2) to protect a semiconductor chip from external environments, such as humidity and temperature, and prevent the damage due to vibration or impact and/or the degradation of the characteristics of the semiconductor chip. Furthermore, the package also has functions, such as a function (3) to facilitate the handling of the semiconductor chip and function (4) to radiate the heat generated during the operation of the semiconductor chip and maximize the function of the semiconductor element.

The package structure of a semiconductor device includes various types, such as a BGA (Ball Grid Array) package, a QFP (Quad Flat Package) package, and a QFN (Quad Flat Non-leaded Package) package, for example. Among such variety of packaging forms, for example, a semiconductor device constituting a part of the above-described DC/DC converter is packaged and configured as a QFN package. Then, hereinafter, the packaging configuration of a semiconductor device including a QFN package constituting a part of the DC/DC converter is described.

Figure 2:
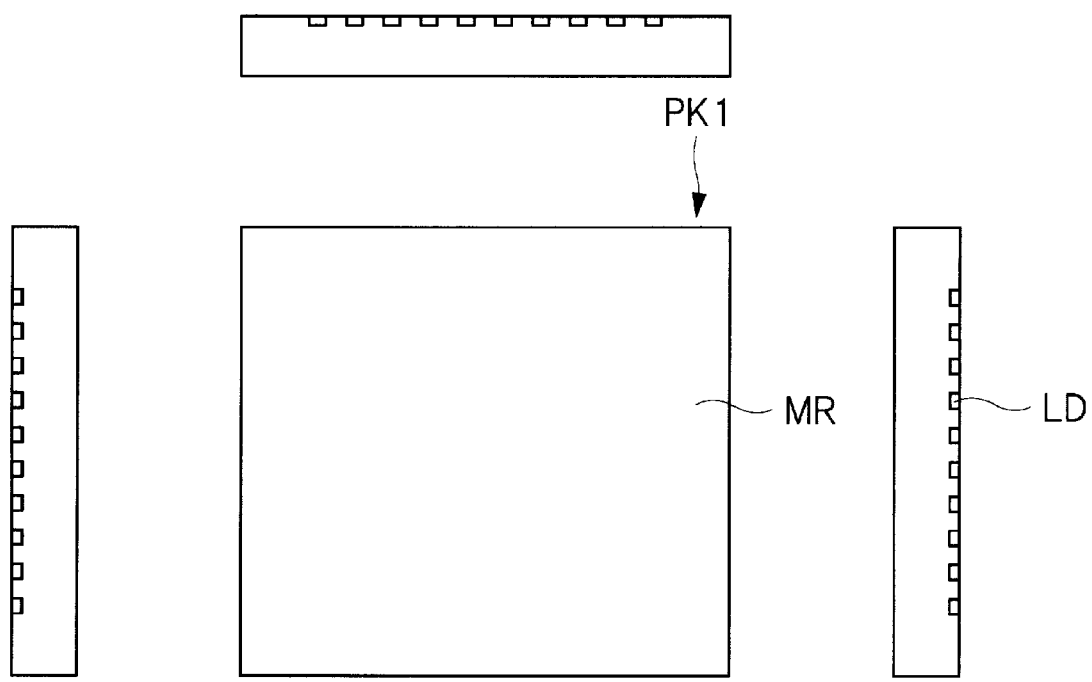
FIG. 2 is a view showing the packaging configuration of a semiconductor device in a first embodiment.

FIG. 2 is a view showing the packaging configuration of a semiconductor device PK1 in the present first embodiment. In FIG. 2, a drawing shown in the center is a plan view of the semiconductor device PK1 seen from the upper surface, and on each of all sides thereof is shown a side view. As shown in FIG. 2, the semiconductor device PK1 in the present first embodiment is covered with a resin MR having a rectangular shape. Then, as can be seen from the side views, a lead LD is exposed from the resin MR on the side surface of the semiconductor device PK1.

Figure 3:
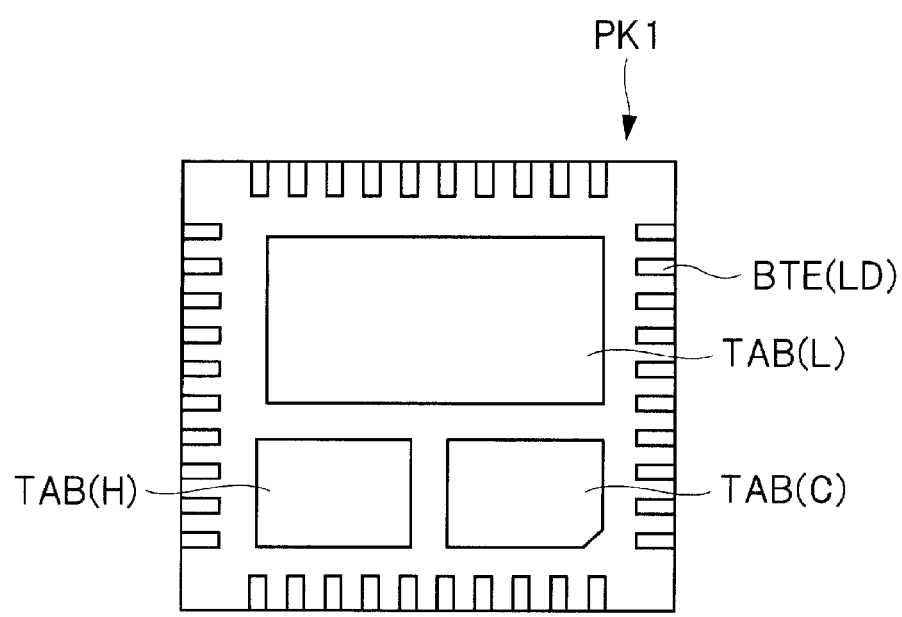
FIG. 3 is a plan view seen from a lower surface (rear surface) of the semiconductor device in the first embodiment.

Next, FIG. 3 is a plan view of the semiconductor device PK1 in the present first embodiment seen from a lower surface (rear surface). As shown in FIG. 3, the rear surface of the semiconductor device PK1 is also covered with the resin MR whereas a chip mounting portion TAB(L), a chip mounting portion TAB(H), and a chip mounting portion TAB(C) are exposed from the resin MR. Because the chip mounting portion TAB(L), the chip mounting portion TAB (H), and the chip mounting portion TAB(C) are exposed from the rear surface of the semiconductor device PK1 in this manner, the heat radiation efficiency of the semiconductor device PK1 can be improved. Moreover, a plurality of rear surface terminals BTE is exposed to an outer peripheral region (outer peripheral portion) of the semiconductor device PK1 having a rectangular shape. This rear surface terminal BTE constitutes a part of the lead LD.

Figure 4:
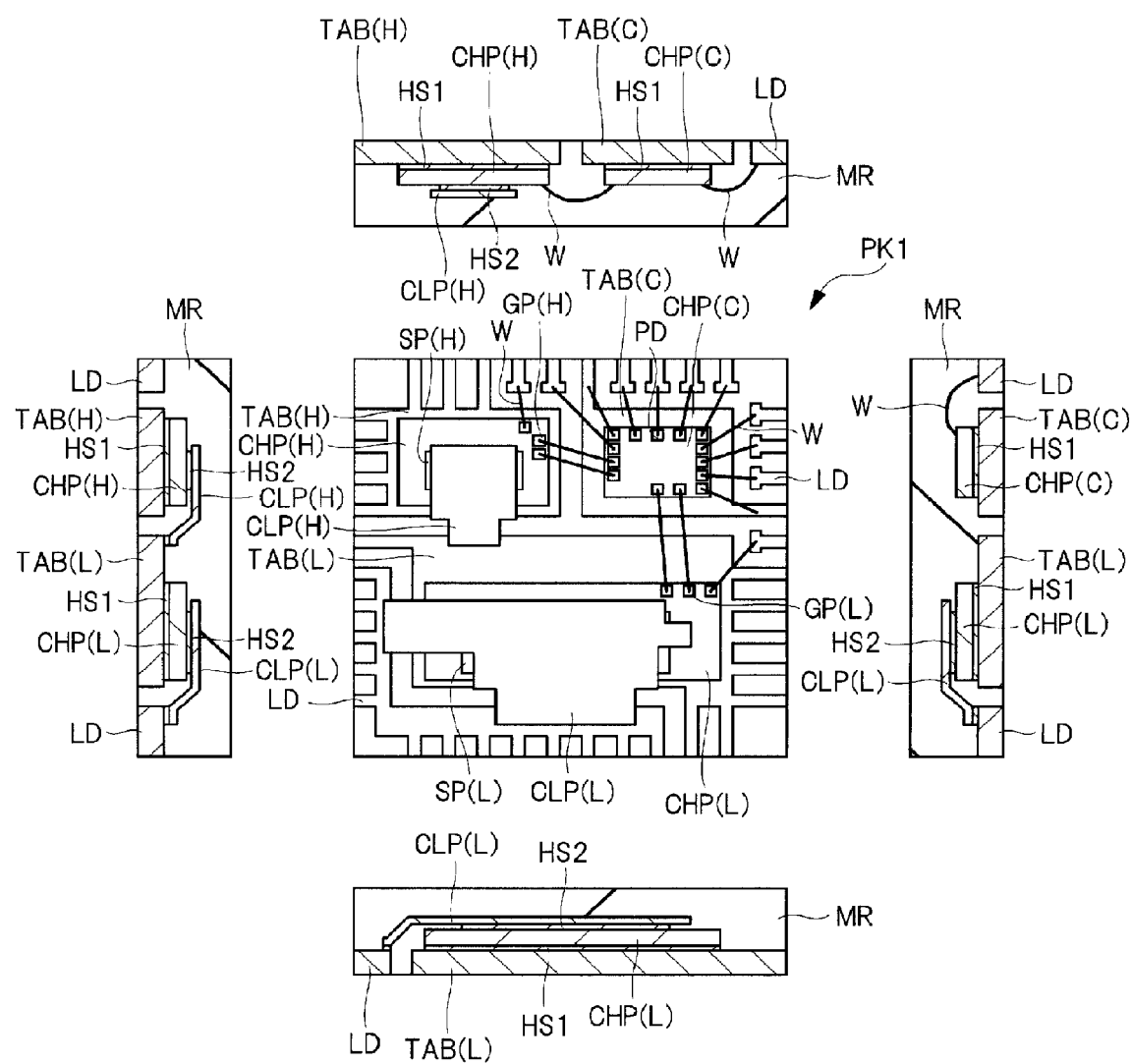
FIG. 4 is a view showing the internal configuration of the semiconductor device in the first embodiment.

Subsequently, the internal configuration of the semiconductor device PK1 is described. FIG. 4 is a view showing the internal configuration of the semiconductor device PK1 in the present first embodiment. In FIG. 4, a drawing shown in the center is a plan view of the inside of the semiconductor device PK1 seen through the resin MR from the upper surface side, and on each of all sides thereof is shown a cross-sectional view.

In the drawing shown in the center of FIG. 4, a Low-MOS chip CHP(L) mainly formed by silicon, for example, is mounted over the chip mounting portion TAB(L). Then, a source electrode pad SP(L) and a gate electrode pad GP(L) each constituted by an aluminum film, for example, are formed on the upper surface of the Low-MOS chip CHP(L). Note that, over the source electrode pad SP(L), a nickel (Ni)-gold (Au) film, here, is formed so as to electrically couple a Low-MOS clip CLP(L) described later onto the source electrode pad SP(L) via a high melting point solder HS2.

The lead LD is arranged on a part of the outside of the chip mounting portion TAB(L), and this lead LD and the source electrode pad SP(L) of the Low-MOS chip CHP(L) are electrically coupled to each other by the Low-MOS clip CLP(L). That is, over the source electrode pad SP(L) of the Low-MOS chip CHP(L), the Low-MOS clip CLP(L) formed by a copper material, for example, is mounted, and an end of this Low-MOS clip CLP(L) is coupled to the lead LD. Specifically, as shown in a cross-sectional view on the lower side of FIG. 4, the Low-MOS chip CHP(L) is mounted over the chip mounting portion TAB(L) via a high melting point solder HS1, and the Low-MOS clip CLP(L) is mounted via the high melting point solder HS2 so as to span from over this Low-MOS chip CHP(L) to over the lead LD.

Next, in the drawing shown in the center of FIG. 4, over the chip mounting portion TAB(H), the High-MOS chip CHP(H) mainly formed by silicon, for example, is mounted. Then, on the upper surface of this High-MOS chip CHP(H), a source electrode pad SP(H) and a gate electrode pad GP(H) each constituted by an aluminum film, for example, are formed. Note that, over the source electrode pad SP(H), a nickel (Ni)-gold (Au) film, here, is formed so as to electrically couple a High-MOS clip CLP(H) described later onto the source electrode pad SP(H) via the high melting point solder HS2.

The chip mounting portion TAB(L) is arranged so as to be adjacent to the chip mounting portion TAB(H). This chip mounting portion TAB(L) and the source electrode pad SP(H) of the High-MOS chip CHP(H) are electrically coupled to each other by the High-MOS clip CLP(H). That is, over the source electrode pad SP(H) of the High-MOS chip CHP(H), the High-MOS clip CLP(H) formed by a copper material, for example, is mounted, and an end of this High-MOS clip CLP(H) is coupled to the chip mounting portion TAB(L). Specifically, as shown in a cross-sectional view on the left side of FIG. 4, the High-MOS chip CHP(H) is mounted over the chip mounting portion TAB(H) via the high melting point solder HS1, and the High-MOS clip CLP(H) is mounted via the high melting point solder HS2 so as to span from over this High-MOS chip CHP(H) to over the chip mounting portion TAB(L).

Subsequently, in the drawing shown in the center of FIG. 4, over the chip mounting portion TAB(C), a driver IC chip CHP(C) mainly formed by silicon, for example, is mounted. Specifically, as shown in the cross-sectional view on the right side or on the upper side of FIG. 4, the driver IC chip CHP(C) is mounted over the chip mounting portion TAB(C) via the high melting point solder HS1. The control circuit CC shown in FIG. 1 is formed inside this driver IC chip CHP(C). Then, an electrode pad PD constituted by an aluminum film, for example, is formed on the upper surface of the driver IC chip CHP(C). The lead LD is arranged at a part of the outside of the chip mounting portion TAB(C), and this lead LD and the electrode pad PD formed on the upper surface of the driver IC chip CHP(C) are electrically coupled to each other by a wire W constituted by a gold wire, for example. Moreover, as shown in FIG. 4, the gate electrode pad GP(L) formed in the Low-MOS chip CHP(L) and the electrode pad PD formed in the driver IC chip CHP(C) are coupled to each other by the wire W. Similarly, the gate electrode pad GP(H) formed in the High-MOS chip CHP(H) and the electrode pad PD formed in the driver IC chip CHP(C) are coupled to each other by the wire W.

How the semiconductor device PK1 in the present first embodiment formed in this manner constitutes a part of the DC/DC converter is described. In the drawing shown in the center of FIG. 4, inside the Low-MOS chip CHP(L) mounted over the chip mounting portion TAB(L), the Low-MOS transistor QL shown in FIG. 1 is formed. Then, the source electrode pad SP(L) is formed on the upper surface of the Low-MOS chip CHP(L), and this source electrode pad SP(L) is electrically coupled to a source region of the Low-MOS transistor QL formed inside the Low-MOS chip CHP(L). Moreover, the gate electrode pad GP(L) is formed on the upper surface of the Low-MOS chip CHP(L), and this gate electrode pad GP(L) is electrically coupled to the gate electrode of the Low-MOS transistor QL formed inside the Low-MOS chip CHP(L). Furthermore, the rear surface of the Low-MOS chip CHP(L) functions as a drain region (drain electrode) of the Low-MOS transistor QL.

Similarly, in the drawing shown in the center of FIG. 4, inside the High-MOS chip CHP(H) mounted over the chip mounting portion TAB(H), the High-MOS transistor QH shown in FIG. 1 is formed. Then, the source electrode pad SP(H) is formed on the upper surface of the High-MOS chip CHP(H), and this source electrode pad SP(H) is electrically coupled to a source region of the High-MOS transistor QH formed inside the High-MOS chip CHP(H). Moreover, the gate electrode pad GP(H) is formed on the upper surface of the High-MOS chip CHP(H), and this gate electrode pad GP(H) is electrically coupled to the gate electrode of the High-MOS transistor QH formed inside the High-MOS chip CHP(H). Furthermore, the rear surface of the High-MOS chip CHP(H) functions as a drain region (drain electrode) of the High-MOS transistor QH.

Here, as shown in FIG. 4, the rear surface (drain electrode) of the Low-MOS chip CHP(L) is electrically coupled to the chip mounting portion TAB(L). Then, this chip mounting portion TAB(L) and the source electrode pad SP(H) formed in the High-MOS chip CHP(H) are coupled to each other by the High-MOS clip CLP(H). From this, it can be seen that the drain electrode of the Low-MOS chip CHP(L) and the source electrode pad SP(H) of the High-MOS chip CHP(H) will be electrically coupled to each other, thus realizing the series connection between the High-MOS transistor QH and the Low-MOS transistor QL shown in FIG. 1.

Then, the source electrode pad SP(L) formed on the upper surface of the Low-MOS chip CHP(L) is electrically coupled to the lead LD via the Low-MOS clip CLP(L). Therefore, by coupling the lead LD, which is electrically coupled to the Low-MOS clip CLP(L), to the ground, it is possible to couple the source region of the Low-MOS transistor QL shown in FIG. 1 to the ground GND.

On the other hand, the rear surface (drain electrode) of the High-MOS chip CHP(H) is electrically coupled to the chip mounting portion TAB(H) via the high melting point solder HS1. Accordingly, by electrically coupling the chip mounting portion TAB(H) to the input terminal TE1, it is possible to couple the drain region (drain electrode) of the High-MOS transistor QH shown in FIG. 1 to the input terminal TE1. In this manner, the semiconductor device PK1 in the present first embodiment shown in FIG. 4 constitutes a part of the DC/DC converter.

In the semiconductor device PK1 in the present first embodiment, for example as shown in FIG. 4, the Low-MOS clip CLP(L) is used for the electric coupling between the Low-MOS chip CHP(L) and the lead LD instead of using a wire. Similarly, in the present first embodiment, the High-MOS clip CLP(H) is used also for the electric coupling between the High-MOS chip CHP(H) and the chip mounting portion TAB(L) instead of using a wire.

This is because the semiconductor device PK1 in the present first embodiment is used as a component of the DC/DC converter and a high current flows into a current path that is coupled by the Low-MOS clip CLP(L) or by the High-MOS clip CLP(H) and thus the on-resistance needs to be reduced as much as possible. That is, in the Low-MOS chip CHP(L) or the High-MOS chip CHP(H), the Low-MOS transistor QL or High-MOS transistor QH for feeding a high current is formed, and in order to make full use of the characteristics of these transistors (power transistors), the Low-MOS clip CLP(L) or the High-MOS clip CLP(H) is used instead of using a wire. In particular, for the Low-MOS clip CLP(L) and the High-MOS clip CLP(H), a copper material with a low resistivity is used and also the contact area can be increased, and therefore the on-resistances of the Low-MOS transistor QL and the High-MOS transistor QH can be reduced.

Furthermore, from a viewpoint of reducing the on-resistance, for the coupling between the chip mounting portion TAB(L) and the Low-MOS chip CHP(L) mounted over this chip mounting portion TAB(L) or for the coupling between the Low-MOS chip CHP(L) and the Low-MOS clip CLP(L), solder is used instead of a silver paste. From the similar viewpoint, for the coupling between the chip mounting portion TAB(H) and the High-MOS chip CHP(H) mounted over this chip mounting portion TAB(H) or for the coupling between the High-MOS chip CHP(H) and the High-MOS clip CLP(H), solder is used instead of a silver paste. That is, in the silver paste, a silver filler is distributed inside a thermosetting resin, and thus the electric conductivity and the heat conductivity become small as compared with the solder that is a metallic material. From this, in the semiconductor device PK1 used for the DC/DC converter requiring reduction in the on-resistance, a solder having an electric conductivity larger than that of the silver paste is used, thereby reducing the on-resistances of the Low-MOS transistor QL and the High-MOS transistor QH. In particular, in the semiconductor device PK1 in the present first embodiment, because a current is also caused to flow through the rear surface of the Low-MOS chip CHP(L) and the rear surface of the High-MOS chip CHP(H), a reduction in the connection resistance by changing from the silver paste to solder is important from the viewpoint of reducing the on-resistance.

However, after the semiconductor device PK1 in the present first embodiment is completed as a product, it is mounted onto a circuit board (mounting board). In this case, the solder is used for coupling between the semiconductor device PK1 and the mounting board. In the case of coupling by solder, a heat treatment (reflow) is required in order to melt and couple the solder.

Here, when the solder used for the connection between the semiconductor device PK1 and the mounting board and the above-described solder used inside the semiconductor device PK1 are the same material, the solder used inside the semiconductor device PK1 will be also melted due to the heat treatment (reflow) applied in coupling the semiconductor device PK1 and the mounting board. In this case, the following failures will occur: a crack is generated in the resin sealing the semiconductor device PK1 due to the volume expansion caused by melting of the solder, and the melted solder leaks to the outside.

From this, the high melting point solder HS1 or the high melting point solder HS2 is used for the connection between the chip mounting portion TAB(L) and the Low-MOS chip CHP(L) mounted over this chip mounting portion TAB(L) or for the connection between the Low-MOS chip CHP(L) and the Low-MOS clip CLP(L). Similarly, the high melting point solder HS1 or the high melting point solder HS2 is used for the connection between the chip mounting portion TAB(H) and the High-MOS chip CHP(H) mounted over this chip mounting portion TAB(H) or for the connection between the High-MOS chip CHP(H) and the High-MOS clip CLP(H). In this case, the high melting point solder HS1 or the high melting point solder HS2 used inside the semiconductor device PK1 will not be melted by the heat treatment (reflow) applied for connection between the semiconductor device PK1 and the mounting board. Accordingly, it is possible to prevent the failures, such as the one that a crack is generated in the resin sealing the semiconductor device PK1 due to the volume expansion caused by the melting of the high melting point solder HS1 or the high melting point solder HS2, and the one that the melted solder leaks to the outside.

Here, for the solder used for the connection between the semiconductor device PK1 and the mounting board, a solder represented by an Sn(tin)-silver(Ag)-copper(Cu) whose melting point is approximately 220° C., is used, and the semiconductor device PK1 is heated up to approximately 260° C. during reflow. Accordingly, for example, the high melting point solder referred to herein is intended to be a solder that will not melt even if heated up to approximately 260° C. The typical one is, for example, a solder containing 90% by weight or more of Pb(lead) whose melting point is equal to or greater than 300° C. and whose reflow temperature is approximately 350° C.

Note that, in the present first embodiment, for example, exists the high melting point solder HS1 used for the connection between the chip mounting portion TAB(L) and the Low-MOS chip CHP(L) or for the connection between the chip mounting portion TAB(H) and the High-MOS chip CHP(H). Moreover, exists the high melting point solder HS2 used for the connection between the Low-MOS chip CHP (L) and the Low-MOS clip CLP(L) or for the connection between the High-MOS chip CHP(H) and the High-MOS clip CLP(H). Basically, in the present first embodiment, it is assumed that the above-described high melting point solder HS1 and the high melting point solder HS2 have the same material component, but, for example, the high melting point solder HS1 and the high melting point solder HS2 each may be constituted by a different material component.

<Room for Improvement in Transitioning from Individual Molding Technique to MAP Molding Technique>

The packaging form of the semiconductor device PK1 in the present first embodiment is a QFN package, but in particular, the semiconductor device PK1 in the above-described present first embodiment corresponds to a form in which the package is manufactured by a MAP molding technique (MAP: Matrix Array Package, a collective molding technique).

The examples of the techniques for sealing a semiconductor chip with resin include the so-called individual molding technique for forming a sealing body for each product region provided in a substrate (a lead frame or a wiring substrate). However, in the individual molding technique, a path (a gate or a runner) for injecting resin needs to be formed for each product region and this space needs to be secured and therefore it is difficult to increase the acquisition number of products.

For this reason, in recent years, there is the a so-called MAP molding technique, in which a plurality of product regions is included in a cavity and the product regions are collectively sealed with resin. According to this MAP molding technique, the product regions can be densely arranged because there is no need to provide a path for injecting resin for each product region. Thus, according to the MAP molding technique, the acquisition number of products can be increased and thereby cost reduction of the product can be achieved.

Now, attention is focused on the QFN package employed also in the semiconductor device PK1 in the present first embodiment. For example, in transitioning from a case where a QFN package is manufactured by the individual molding technique to a case where it is manufactured by the MAP molding technique, the technique typically used in the individual molding technique cannot sufficiently correspond to this transition from a viewpoint of improving the reliability of the QFN package, and thus there is a room for improvement. This is described with reference to the accompanying drawings.

Figure 5:
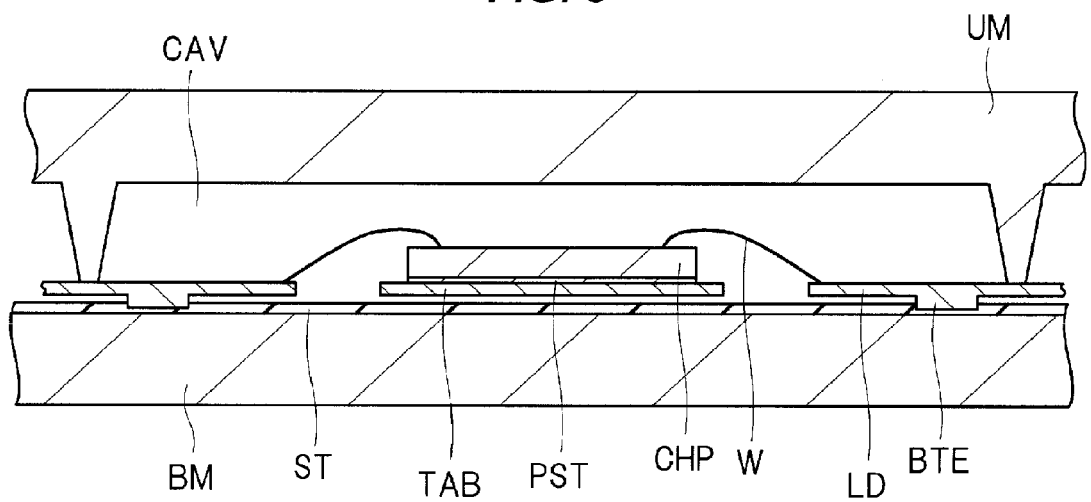
FIG. 5 is a cross-sectional view showing an example of a resin sealing step in a case where an ordinary QFN package is formed using an individual molding technique.

FIG. 5 is a cross-sectional view showing an example of a resin sealing step when an ordinary QFN package is formed using the individual molding technique. As shown in FIG. 5, a sheet ST is applied to the upper surface of a lower mold BM, and a lead frame is arranged over this sheet ST. Specifically, the chip mounting portion TAB and the lead LD which are the components of the lead frame are arranged over the sheet ST. Then, the rear surface terminal BTE protrudes from the rear surface of the lead LD. On the other hand, over the chip mounting portion TAB, the semiconductor chip CHP is mounted via a silver paste PST, for example, and a pad (not shown) formed in this semiconductor chip CHP and the lead LD are electrically coupled to each other by the wire W. Then, as shown in FIG. 5, in the individual molding technique, a lead frame having the semiconductor chip CHP mounted thereon is sandwiched by an upper mold UM and the lower mold BM via a cavity CAV. The cavity CAV formed at this time is separated for each product region, and the lead LD will be pressed by a protrusion provided in the upper mold UM used for separation.

In this manner, when a QFN package is manufactured by the individual molding technique, a lead frame (substrate) can be pressed by the upper mold UM for each product region, and therefore the protruding rear surface terminal BTE formed on the rear surface of the lead frame can be caused to bite into the sheet ST arranged over the lower mold BM (sheet molding technique). Thus, in forming a QFN package using the individual molding technique, a resin leakage (resin burr) into the rear surface terminal BTE can be prevented. That is, when a QFN package is manufactured by the individual molding technique, the resin leakage into the rear surface terminal BTE can be effectively suppressed by a sheet molding technique that is typically used in the individual molding technique. As a result, the reliability of the QFN package can be increased.

Figure 6:
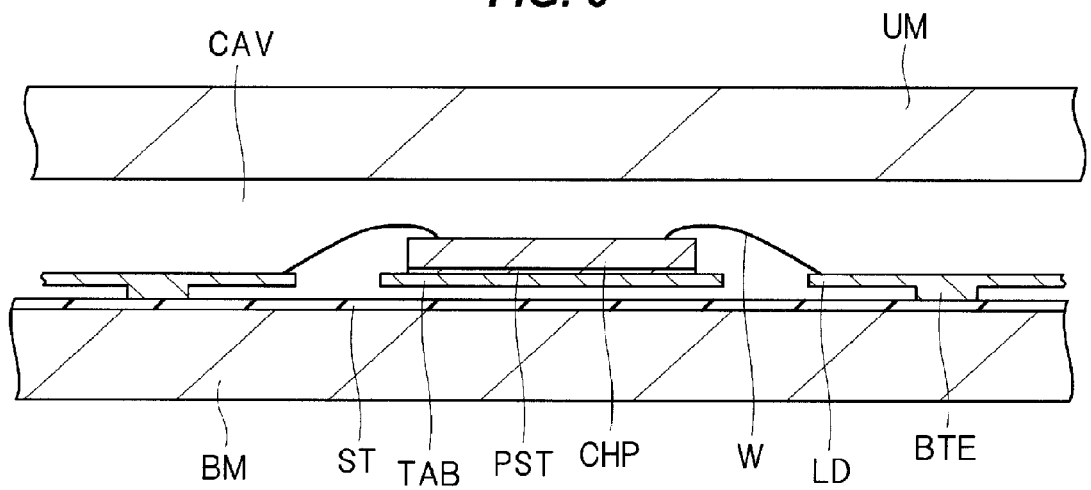
FIG. 6 is a cross-sectional view showing an example of a resin sealing step in a case where an ordinary QFN package is formed using a MAP molding technique.

Next, a case where a QFN package is manufactured by the MAP molding technique is considered. FIG. 6 is cross-sectional view showing an example of a resin sealing step when an ordinary QFN package is formed using the MAP molding technique. As shown in FIG. 6, the sheet ST is applied to the upper surface of the lower mold BM, and a lead frame is arranged over this sheet ST. Specifically, the chip mounting portion TAB and the lead LD which are the components of the lead frame are arranged over the sheet ST. Then, the rear surface terminal BTE protrudes from the rear surface of the lead LD. On the other hand, over the chip mounting portion TAB, the semiconductor chip CHP is mounted via the silver paste PST, for example, and a pad (not shown) formed in this semiconductor chip CHP and the lead LD are electrically coupled to each other by the wire W. Then, as shown in FIG. 6, in the MAP molding technique, a lead frame having the semiconductor chip CHP mounted thereon is sandwiched by the upper mold UM and the lower mold BM via the cavity CAV. The cavity CAV formed at this time is not separated for each product region, and a protrusion for separating the product region is not provided in the upper mold UM. That is, in the MAP molding technique, a plurality of product regions is included in the cavity CAV and thus the lead frame is not pressed by the upper mold UM for each product region. Therefore, when a QFN package is manufactured by the MAP molding technique, the rear surface terminal BTE cannot be caused to sufficiently bite into the sheet ST arranged over the lower mold BM and thus the resin leakage (resin burr) into the rear surface terminal BTE cannot be sufficiently suppressed. As a result, a manufacturing failure of the QFN package cannot be effectively suppressed.

As described above, in transitioning from a case where a QFN package is manufactured by the individual molding technique to a case where it is manufactured by the MAP molding technique, the sheet molding technique typically used in the individual molding technique cannot sufficiently correspond to this transition from a viewpoint of improving the reliability of the QFN package, and thus there is a room for improvement.

Figure 7:
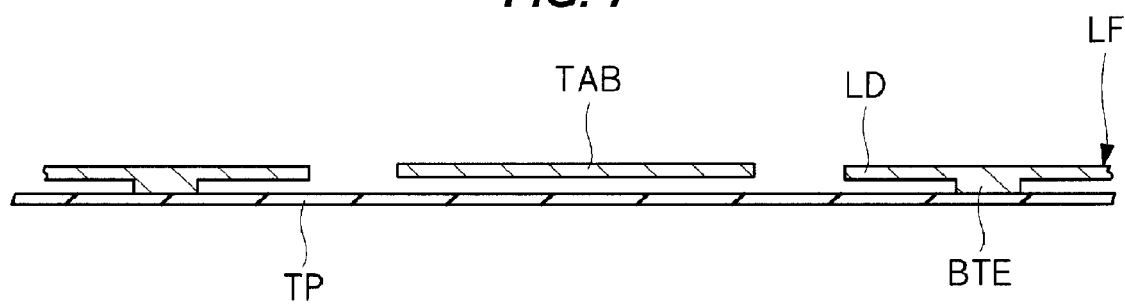
FIG. 7 is a cross-sectional view showing a configuration, in which a tape is applied to the rear surface of a lead frame in advance.

Then, when a QFN package is manufactured by the MAP molding technique, a technique replacing the sheet molding technique employed in the individual molding technique is under study. Specifically, as shown in FIG. 7, it is under study that an adhesive tape TP is applied to the rear surface of the lead frame LF when the lead frame LF is prepared. In this case, the tape TP can be reliably applied to the rear surface terminal BTE formed on the rear surface of the lead frame LF. Accordingly, also in the resin sealing step employing the MAP molding technique, a gap is not formed between the rear surface terminal BTE and the tape TP and thus the resin leakage (resin burr) into the rear surface terminal BTE can be sufficiently suppressed.

A configuration, in which the tape TP is applied to the rear surface of the lead frame LF in this way, is primarily intended to sufficiently suppress the resin leakage to the rear side of the rear surface terminal BTE when a QFN package is manufactured by the MAP molding technique, but also has a further advantage.

For example, attention is focused on a wire bonding step. In the case of the individual molding technique, because a space region is secured between the product regions, it is possible to carry out the wire bonding step while pressing the space region provided in a lead frame with a window clamper. Thus, the reliability of the wire bonding step can be improved.

However, in the case of the MAP molding technique, because a plurality of product regions is densely arranged, it is difficult to secure, in a lead frame, a space region sufficient for pressing with the window clamper. Then, in a lead frame corresponding to the MAP molding technique, in the wire bonding step, the lead frame is vacuum-sucked onto a heat block to be arranged, and thereby the wire bonding step is carried out while the lead frame is fixed to the heat block. In this case, because in the lead frame itself there is a region without any lead (a gap between patterns), the lead frame cannot be vacuum-sucked onto the heat block.

In contrast, in a state where the tape TP is applied to the rear surface of the lead frame, the lead frame having the tape TP applied thereto can be easily vacuum-sucked. As a result, even for a lead frame corresponding to the MAP molding technique, the wire bonding step can be carried out while the lead frame is reliably fixed by vacuum suction. As described above, the configuration, in which the tape TP is applied to the rear surface of the lead frame LF, has advantages in suppressing the resin leakage to the rear side of the rear surface terminal BTE and in increasing the easiness of the vacuum suction in the wire bonding step, in a lead frame corresponding to the MAP molding technique.

<Room for Further Improvement by Using High Melting Point Solder>

When a QFN package is manufactured by the MAP molding technique, for example, as shown in FIG. 7, the configuration, in which the tape TP is applied to the rear surface of the lead frame LF in advance, is useful. If such a configuration is employed, as shown in FIG. 8, the semiconductor chip CHP will be mounted over the chip mounting portion TAB in a state where the tape TP is applied to the rear surface of the lead frame LF.

Then, for example, consider a case where the chip mounting portion TAB and the semiconductor chip CHP are bonded together with a silver paste. The silver paste is formed by, for example, a thermosetting resin, such as an epoxy resin, dispersed with a silver filler, and is subjected to heat treatment to cure the silver paste. Accordingly, heat will be applied also to the tape TP applied to the rear surface of the lead frame LF. However, the temperature of the heat treatment for curing the silver paste is approximately 125° C. to approximately 200° C., and is lower than the heat-resisting temperature (e.g., approximately 250° C.) of the tape TP. Therefore, even if the heat treatment for curing the silver paste is carried out in the state where the tape TP is applied to the rear surface of the lead frame LF, the tape TP can withstand the heat treatment.

Figure 8:
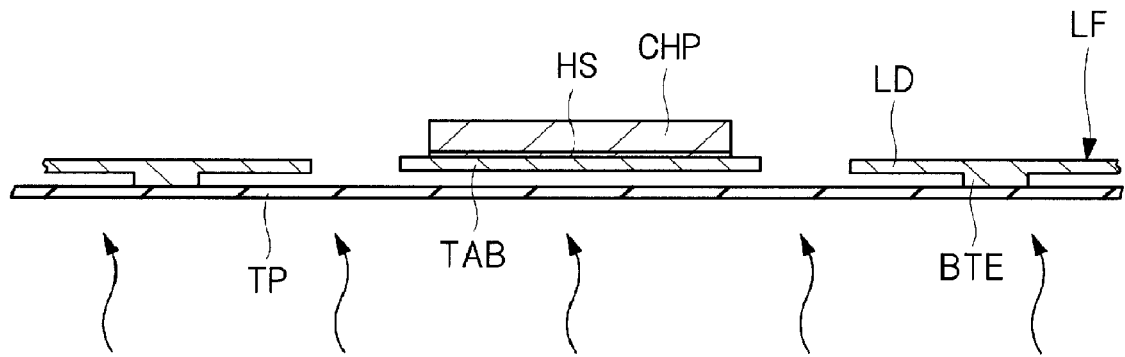
FIG. 8 is a cross-sectional view showing a configuration, in which a semiconductor chip is mounted over a chip mounting portion in a state where a tape is applied to the rear surface of a lead frame.

However, as shown in FIG. 8, when the chip mounting portion TAB and the semiconductor chip CHP are bonded with a high melting point solder HS, the situation will change completely. That is, when the chip mounting portion TAB and the semiconductor chip CHP are bonded with the high melting point solder HS, a heat treatment (reflow) for melting the high melting point solder HS is required. This reflow temperature is approximately 350° C., for example, and exceeds the heat-resisting temperature (e.g., approximately 250° C.) of the tape TP. Therefore, if the heat treatment for melting the high melting point solder HS is carried out in the state where the tape TP is applied to the rear surface of the lead frame LF, the tape TP will not be able to withstand the heat treatment.

Specifically, the tape TP is constituted mainly by a base material part and a paste part. For the base material part of the tape TP, typically, a polyimide resin is often used and thermal decomposition temperature of the polyimide resin is equal to or greater than 500° C. Therefore, thermal decomposition temperature of the polyimide resin is higher than the reflow temperature of the above-described high melting point solder HS and therefore the base material part of the tape TP can withstand the heat in the reflow of the high melting point solder HS. On the other hand, because the heat-resisting temperature of the paste part is lower than the reflow temperature of the high melting point solder HS, this paste part cannot withstand the reflow of the high melting point solder HS. That is, the heat-resisting temperature of the tape TP means the heat-resisting temperature of the paste part constituting the tape TP.

From the above, it can be seen that when a QFN package is manufactured by the MAP molding technique, configuration is useful, in which the tape TP is applied to the rear surface of the lead frame LF, but when the high melting point solder HS is used for connection between the chip mounting portion TAB and the semiconductor chip CHP, there is a room for further improvement from a viewpoint of maintaining the heat resistance of the tape TP. In particular, in the semiconductor device PK1 of the present first embodiment used for the DC/DC converter requiring a reduction of the on-resistance, a device for maintaining the heat resistance of the tape TP is needed because a high melting point solder having an electric conductivity higher than that of the silver paste is used.

Figure 9:
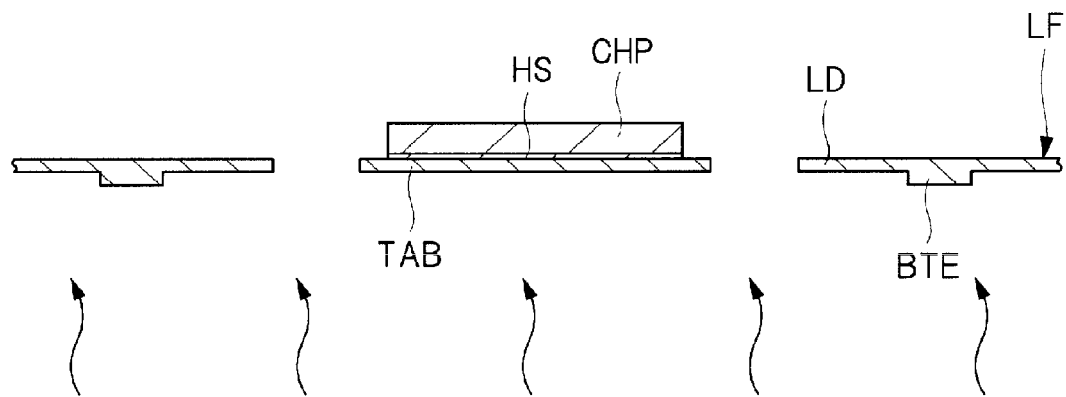
FIG. 9 is a cross-sectional view showing a configuration, in which a semiconductor chip is mounted over a chip mounting portion via a high melting point solder without applying a tape to the rear surface of a lead frame that is prepared in advance.

Regarding this point, in order to maintain the heat resistance of the tape TP, a technique shown below can be contemplated. That is, as shown in FIG. 9, the semiconductor chip CHP is mounted over the chip mounting portion TAB via the high melting point solder HS without applying the tape TP to the rear surface of the lead frame LF that is prepared in advance. Then, in this state, the heat treatment (reflow) for melting the high melting point solder HS is carried out. In this case, even if the reflow temperature of the high melting point solder HS is higher than the heat-resisting temperature of the tape TP, the heat resistance of the tape TP will not pose a problem because the tape TP is originally not applied to the rear surface of the lead frame LF. That is, as shown in FIG. 9, if the heat treatment (reflow) of the high melting point solder HS is carried out before the tape TP is applied to the rear surface of the lead frame LF, the tape TP will withstand the heat treatment regardless of the temperature of the heat treatment. Then, subsequently, as shown in FIG. 10, in the state where the semiconductor chip CHP is mounted over the chip mounting portion TAB via the high melting point solder HS, the tape TP will be applied to the rear surface of the lead frame LF.

In this case, unless the tape TP is applied to the rear surface of the lead frame LF in the state where the upper surface opposite to the rear surface, to which the tape TP is applied, of the lead frame LF is supported, for example, by a support member, it is difficult to firmly apply the tape TP to the rear surface of the lead frame LF. That is, if the tape TP is applied to the rear surface of the lead frame LF in the state where the upper surface opposite to the rear surface, to which the tape TP is applied, of the lead frame LF is not supported, for example, by a support member, the lead frame LF will not be fixed. Thus, it is difficult to reliably apply the tape TP to the rear surface of the lead frame LF without involving a void and the like.

Figure 10:
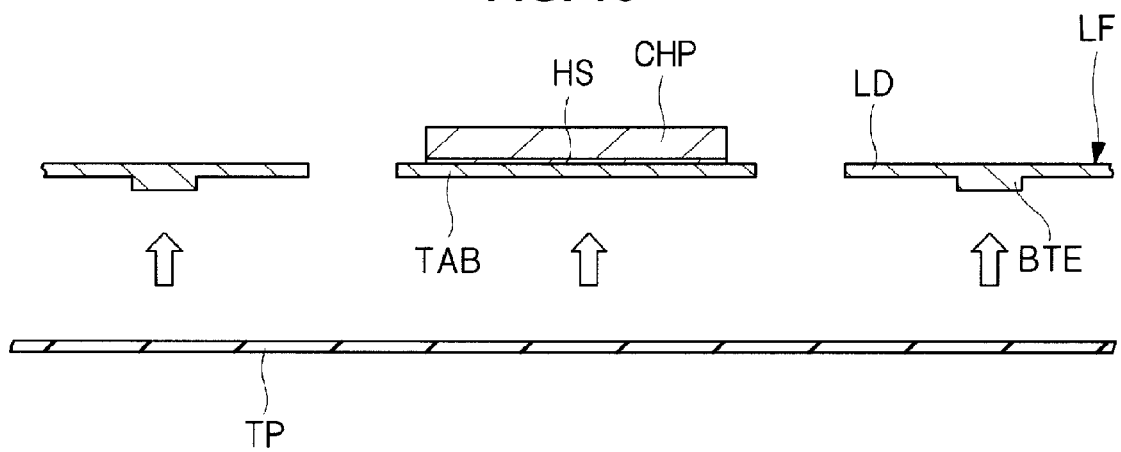
FIG. 10 is a cross-sectional view showing a configuration, in which a tape is applied to the rear surface of a lead frame in a state where a semiconductor chip is mounted over a chip mounting portion via a high melting point solder.

However, as shown in FIG. 10, the semiconductor chip CHP is mounted on the upper surface opposite to the rear surface, to which the tape TP is applied, of the lead frame LF. Therefore, when the upper surface opposite to the rear surface, to which the tape TP is applied, of the lead frame LF is directly supported by a support member, the upper surface of the semiconductor chip CHP will be also supported by the support member, and thus a pressing pressure from the support member transmits to the semiconductor chip CHP, and the semiconductor chip CHP might be damaged.

In summary, when a QFN package is manufactured by the MAP molding technique, a configuration in which the tape TP is applied to the rear surface of the lead frame LF, is useful. However, when the high melting point solder HS is used for connection between the chip mounting portion TAB and the semiconductor chip CHP, the configuration, in which the tape TP is applied to the rear surface of the lead frame LF in advance, has a room for improvement from a viewpoint of maintaining the heat resistance of the tape TP. Then, it is contemplated that the heat treatment (reflow) of the high melting point solder HS is carried out before the tape TP is applied to the rear surface of the lead frame LF. However, in this case, the tape TP will be applied to the rear surface of the lead frame LF in the state where the semiconductor chip CHP is mounted over the chip mounting portion TAB via the high melting point solder HS. Then, although what can be contemplated is a configuration in which the upper surface opposite to the rear surface, to which the tape TP is applied, of the lead frame LF is directly supported by a support member, the upper surface of the semiconductor chip CHP will be also supported by the support member and the pressing pressure from the support member transmits to the semiconductor chip CHP and thus the semiconductor chip CHP might be damaged. Here, there is a room for improvement.

Then, in a method of manufacturing a semiconductor device in the present first embodiment shown below, a device for the revealed room for improvement is implemented. Hereinafter, the method of manufacturing a semiconductor device in the present first embodiment implementing this device is described with reference to the accompanying drawings.

Method of Manufacturing Semiconductor Device in First Embodiment

The semiconductor device in the present first embodiment is, for example, as shown in FIG. 4, the semiconductor device PK1 constituting a part of the DC/DC converter and is packaged and configured as a QFN package. Then, hereinafter, taking as an example the method of manufacturing the semiconductor device PK1 that is constituted by a QFN package constituting a part of the DC/DC converter, the technical idea in the present first embodiment is described.

Figure 11:
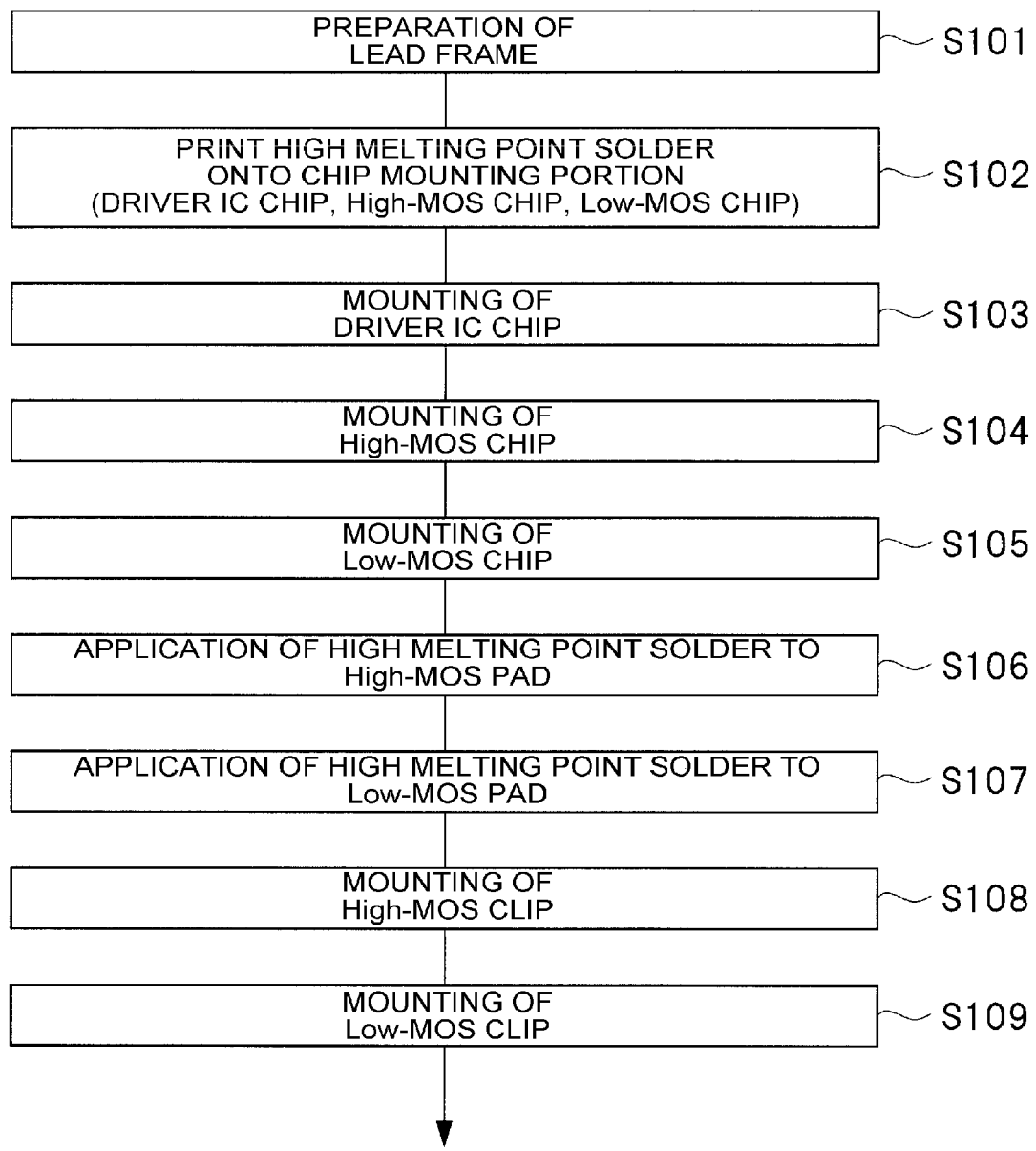
FIG. 11 is a flowchart showing a semiconductor device manufacturing flow in the first embodiment.
Figure 12:
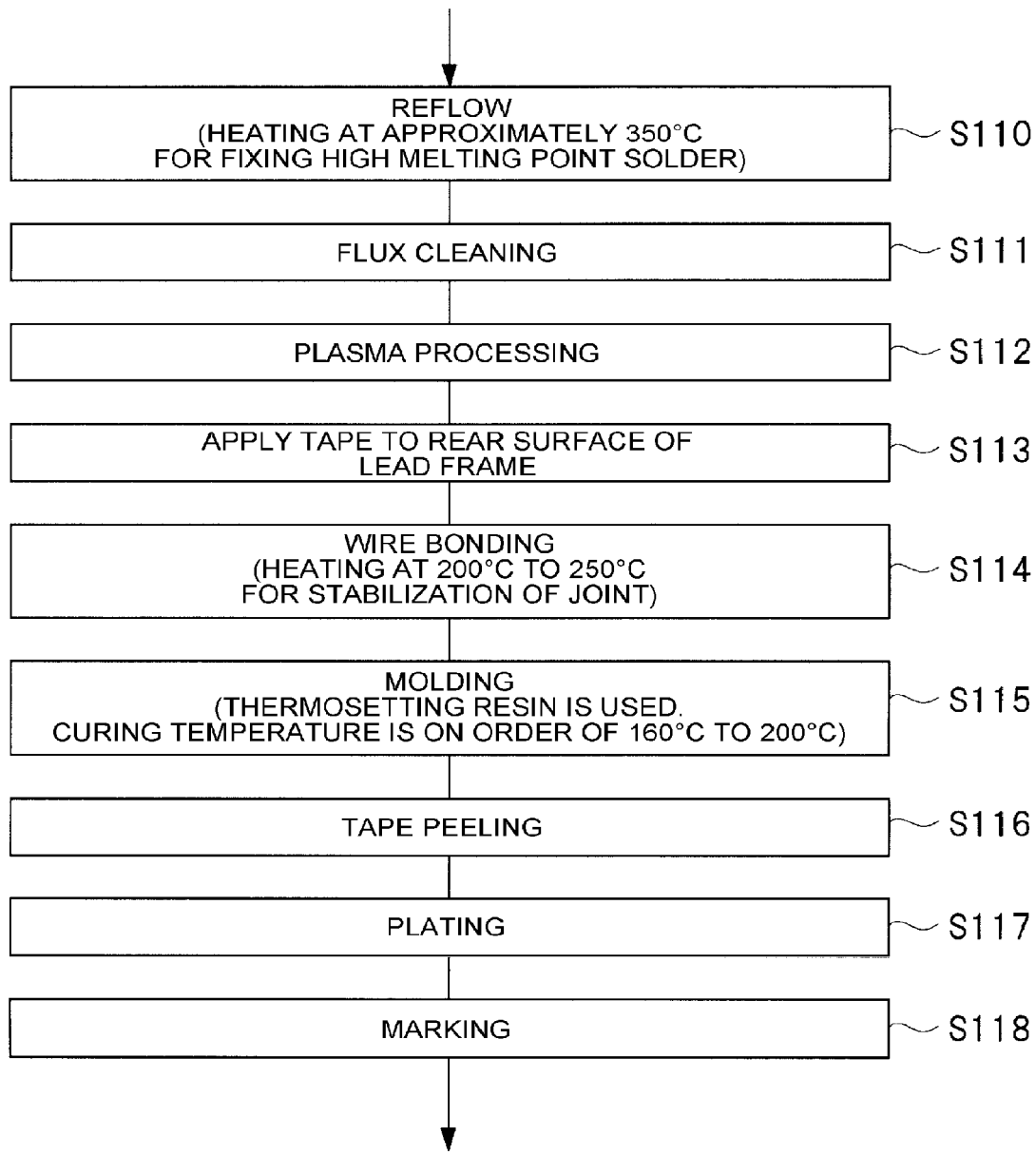
FIG. 12 is a flowchart showing the semiconductor device manufacturing flow in the first embodiment.
Figure 13:
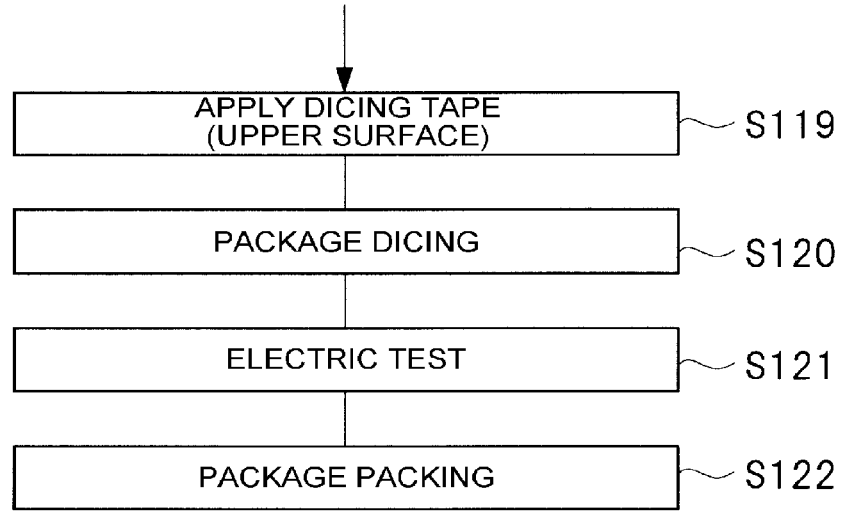
FIG. 13 is a flowchart showing the semiconductor device manufacturing flow in the first embodiment.

FIG. 11 to FIG. 13 show a flowchart showing a manufacturing flow of the semiconductor device PK1 in the present first embodiment. Moreover, FIG. 14A to FIG. 25C are views each showing a manufacturing process of the semiconductor device PK1 in the present first embodiment.

Figure 14A:
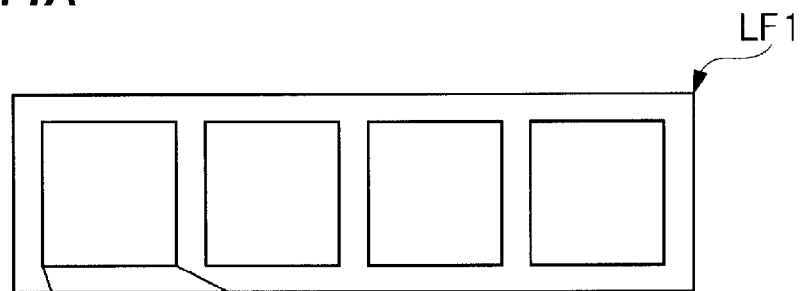
FIG. 14A is a view showing a schematic entire configuration of a lead frame.
Figure 14B:
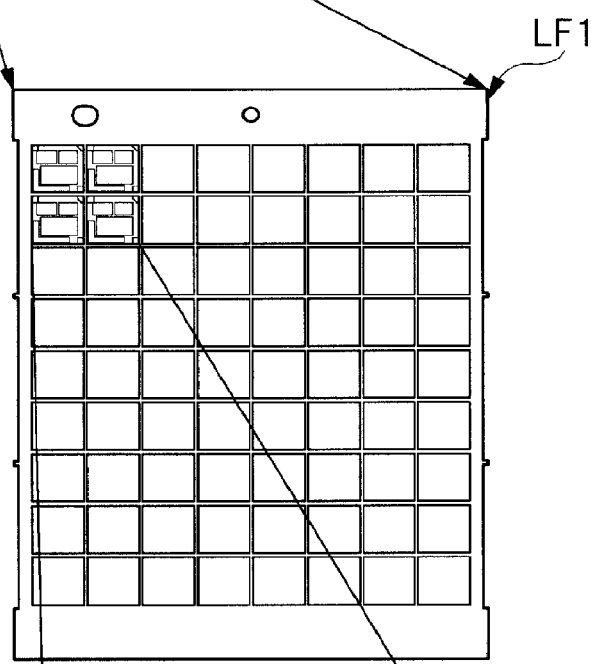
FIG. 14B is an enlarged view showing a part of the lead frame shown in FIG. 14A.
Figure 14C:
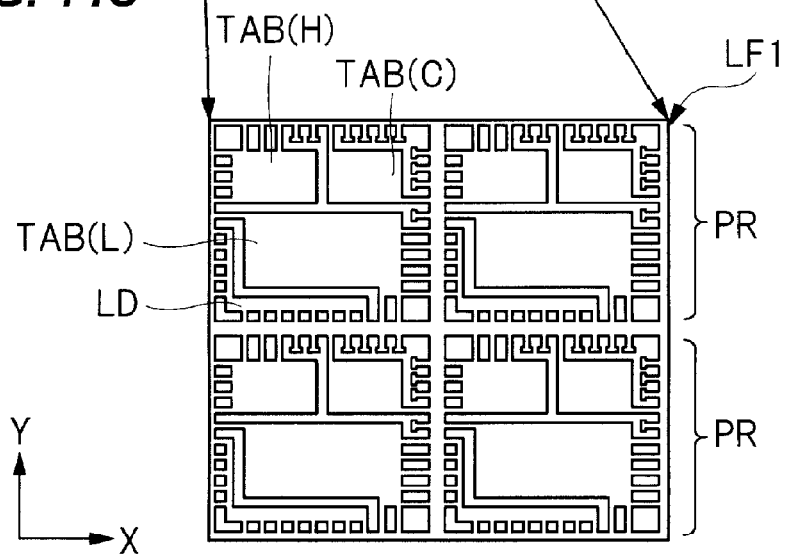
FIG. 14C is a further enlarged view showing the part of the lead frame shown in FIG. 14B.

First, as shown in FIGS. 14A to 14C, the lead frame LF1 is prepared (S101 of FIG. 11). In FIG. 14A, a schematic entire configuration of the lead frame LF1 is shown, while in FIG. 14B, a part of the lead frame LF1 is enlarged and shown. Furthermore, in FIG. 14C, the part of the lead frame LF1 shown in FIG. 14B is further enlarged and shown.

As shown in FIG. 14C, in the lead frame LF1 in the present first embodiment, a plurality of product regions PR each including the chip mounting portion TAB(C), the chip mounting portion TAB(H), the chip mounting portion TAB(L), and the lead LD is arranged in a matrix.

Figure 15A:
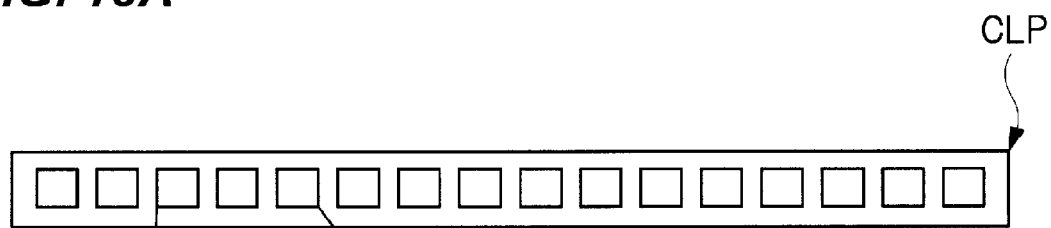
FIG. 15A is a view showing a schematic entire configuration of a clip subassembly.
Figure 15B:
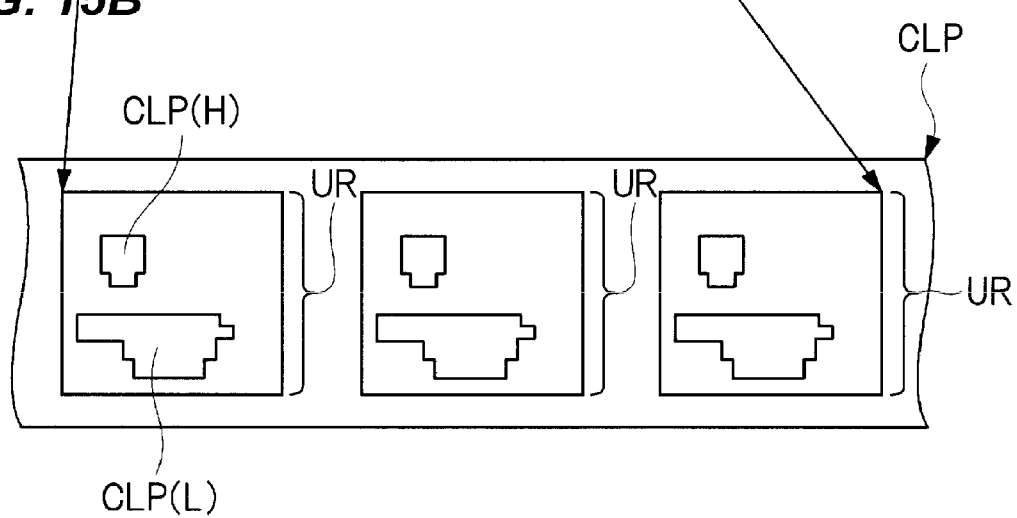
FIG. 15B is an enlarged view showing a part of the clip subassembly.

Furthermore, in the present first embodiment, a clip subassembly CLP as shown in FIGS. 15A and 15B is also prepared. In FIG. 15A, a schematic entire configuration of the clip subassembly CLP is shown, while in FIG. 15B, a part of the clip subassembly CLP is enlarged and shown. As shown in FIG. 15B, in the clip subassembly CLP, a plurality of unit regions UR each including the High-MOS clip CLP(H) and the Low-MOS clip CLP(L) is included, and the unit regions UR are arranged in a straight line. Here, the High-MOS clip CLP(H) and the Low-MOS clip CLP(L) are constituted, for example, by a metal plate containing copper as the material component.

Figure 16:
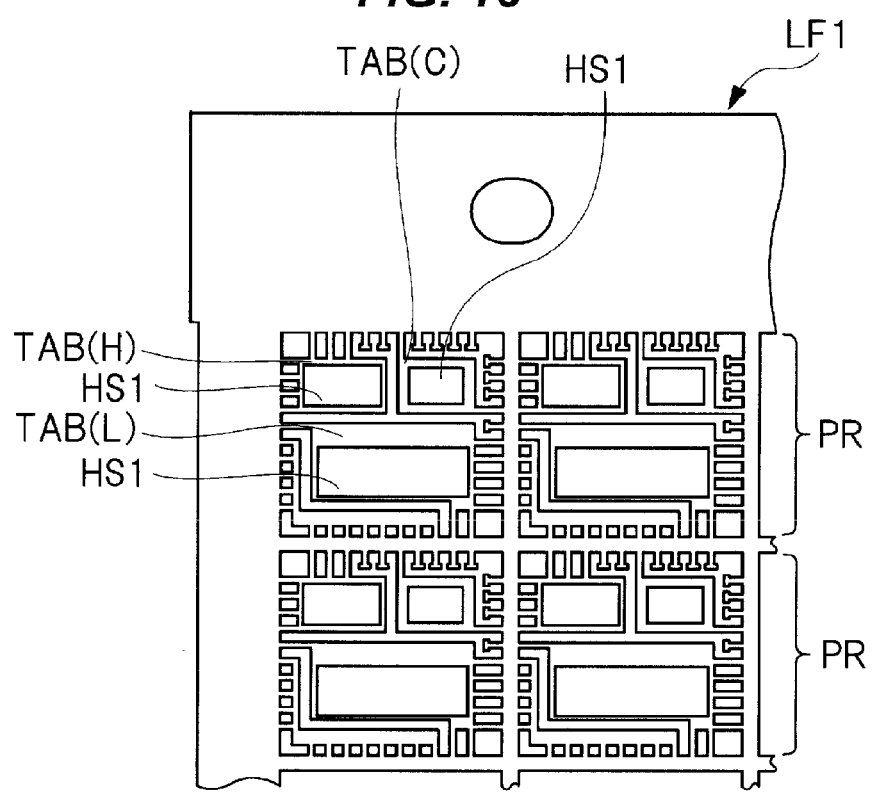
FIG. 16 is a plan view showing a manufacturing process of the semiconductor device in the first embodiment.

Next, as shown in FIG. 16, in each of the product regions PR formed in the lead frame LF1, the high melting point solder HS1 is formed over the chip mounting portion TAB(C), the chip mounting portion TAB(H), and the chip mounting portion TAB(L) (S102 of FIG. 11). Specifically, for example, the high melting point solder HS1 is printed over the chip mounting portion TAB(C), the chip mounting portion TAB(H), and the chip mounting portion TAB(L) using a solder printing method.

The high melting point solder HS1 referred to herein is intended to be a solder that will not melt even if heated up to approximately 260° C., the examples of which include a Pb-rich high melting point solder containing a lot of Pb (lead) whose melting point is equal to or greater than 300° C. and whose reflow temperature is approximately 350° C.

Figure 17:
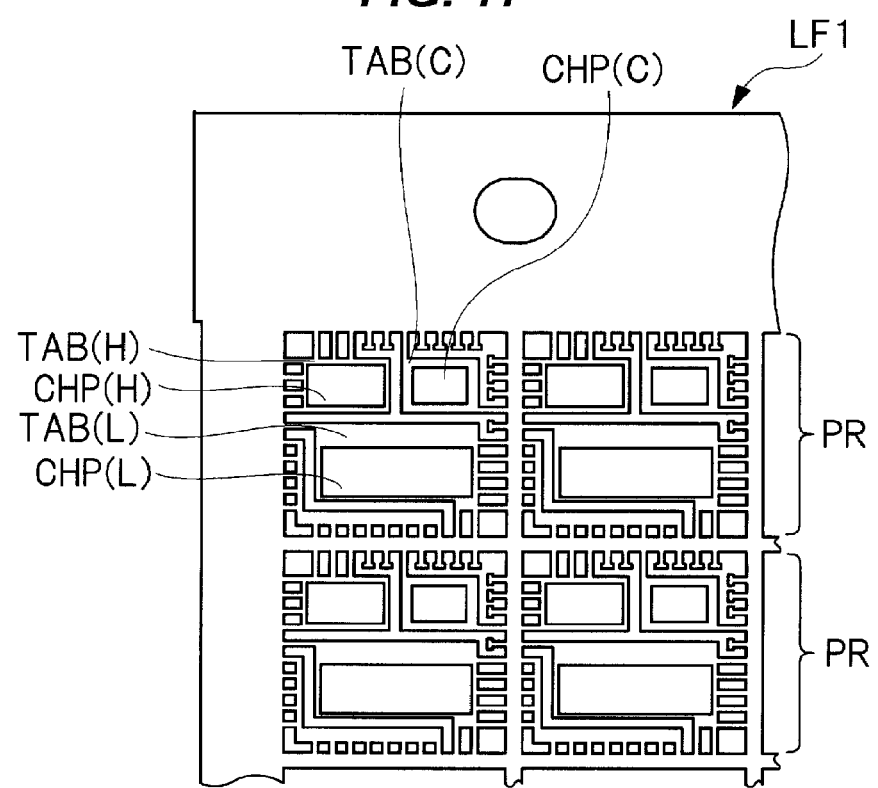
FIG. 17 is a plan view showing the manufacturing process of the semiconductor device following FIG. 16.

Subsequently, as shown in FIG. 17, in each of the product regions PR formed in the lead frame LF1, first, the driver IC chip CHP(C) is mounted over the chip mounting portion TAB(C) (S103 of FIG. 11). Then, the High-MOS chip CHP(H) is mounted over the chip mounting portion TAB(H) (S104 of FIG. 11), and thereafter, the Low-MOS chip CHP(L) is mounted over the chip mounting portion TAB(L) (S105 of FIG. 11). Note that, the mounting order of the driver IC chip CHP(C), the High-MOS chip CHP(H), and the Low-MOS chip CHP(L) is not limited thereto but may be changed as required.

Figure 18:
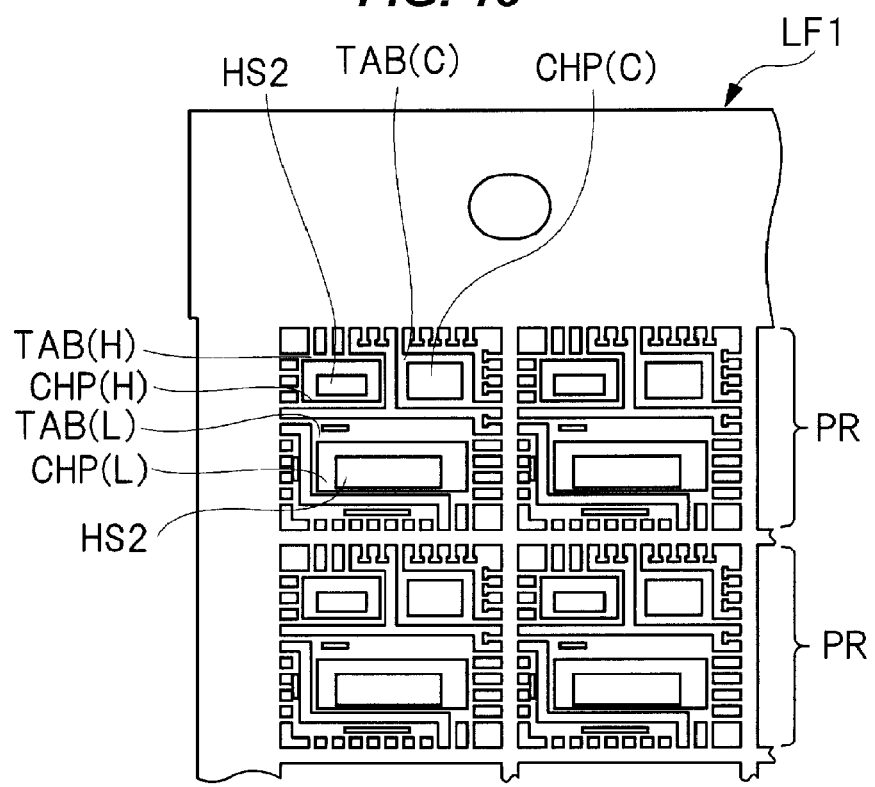
FIG. 18 is a plan view showing the manufacturing process of the semiconductor device following FIG. 17.

Next, as shown in FIG. 18, in each of the product regions PR formed in the lead frame LF1, the high melting point solder HS2 is formed over the High-MOS chip CHP(H) (S106 of FIG. 11). Thereafter, the high melting point solder HS2 is formed over the Low-MOS chip CHP(L) (S107 of FIG. 11). Specifically, the high melting point solder HS2 is formed over the source electrode pad (High-MOS pad) (not shown) formed in the High-MOS chip CHP(H) and also the high melting point solder HS2 is formed over the source electrode pad (Low-MOS pad) (not shown) formed in the Low-MOS chip CHP(L). Furthermore, as shown in FIG. 18, the high melting point solder HS2 is also formed over a partial region of the chip mounting portion TAB(L) and over a partial region of the lead.

Specifically, for example, using a coating method, the high melting point solder HS2 is also applied over the High-MOS chip CHP(H), over the Low-MOS chip CHP(L), over a partial region of the chip mounting portion TAB(L), and over a partial region of the lead. The high melting point solder HS2 formed at this time may have the same material component as the above-described high melting point solder HS1 or may have a different material component.

Figure 19:
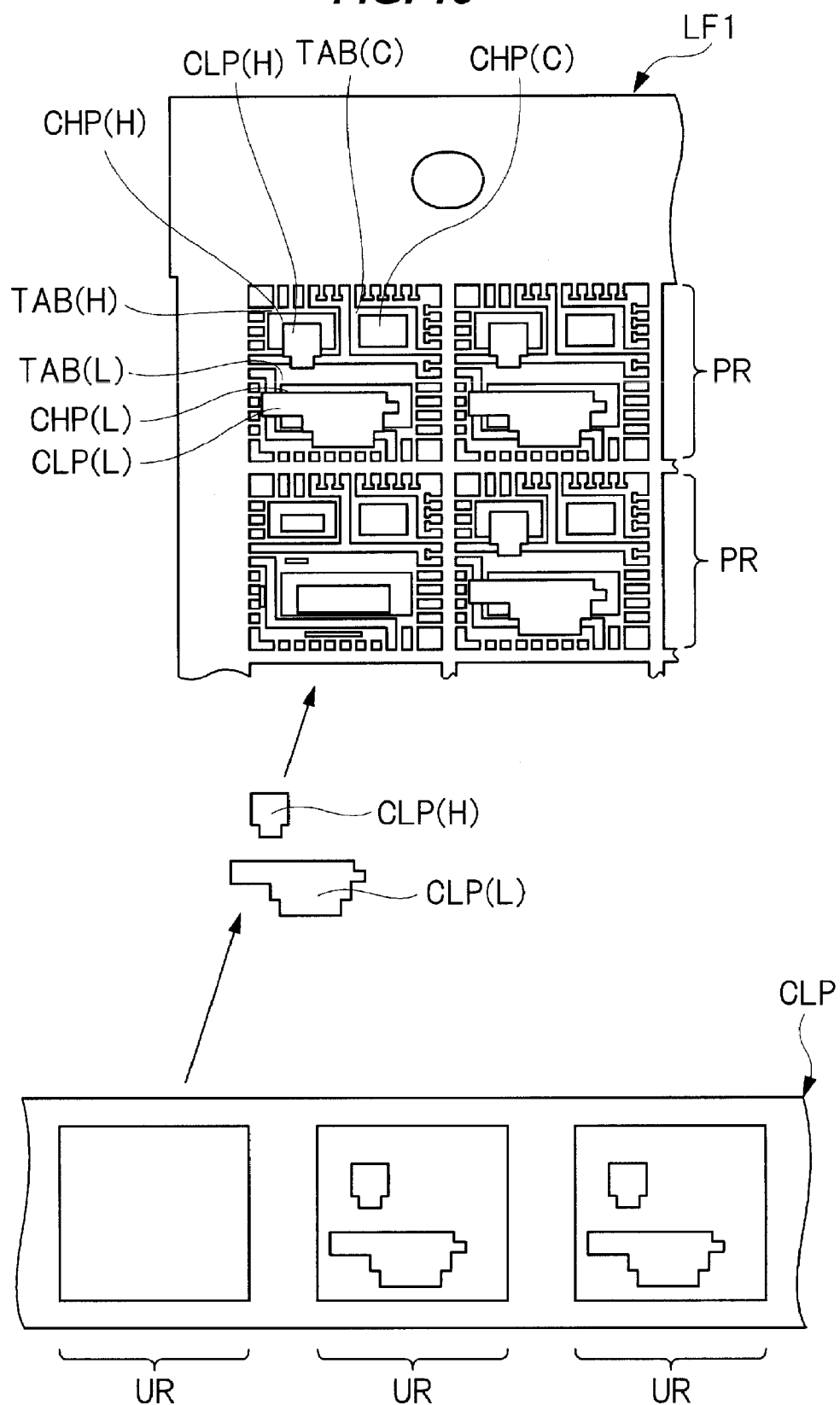
FIG. 19 is a plan view showing the manufacturing process of the semiconductor device following FIG. 18.

Subsequently, as shown in FIG. 19, in each of the product regions PR formed in the lead frame LF1, the High-MOS clip CLP(H) taken out from the unit region UR of the clip subassembly CLP is mounted so as to span from over the High-MOS chip CHP(H) to the chip mounting portion TAB(L) (S108 of FIG. 11). Thus, the source electrode pad formed on the High-MOS chip CHP(H) and the chip mounting portion TAB(L) will be electrically coupled to each other by the High-MOS clip CLP(H). Moreover, the Low-MOS clip CLP(L) taken out from the unit region UR of the clip subassembly CLP is mounted so as to span from over the Low-MOS chip CHP(L) to the lead, to which a reference potential (GND potential) is supplied (S109 of FIG. 11). Thus, the source electrode pad formed on the Low-MOS chip CHP(L) and the lead, to which the reference potential is supplied, will be electrically coupled to each other by the Low-MOS clip CLP(L).

Note that the mounting order of the High-MOS clip CLP(H) and the Low-MOS clip CLP(L) is not limited thereto but may be changed as required.

Subsequently, a reflow is carried out with respect to the high melting point solder HS1 and the high melting point solder HS2 (S110 of FIG. 12). Specifically, the lead frame LF1 including the high melting point solder HS1 and the high melting point solder HS2 is heated at a temperature (a first temperature) of approximately 350° C., for example. Thus, the high melting point solder HS1 and the high melting point solder HS2 can be melted.

Then, in the present first embodiment, in a state where the tape is not applied to the rear surface of the lead frame LF1 that is prepared in advance, the heat treatment (reflow) for melting the high melting point solder HS1 and the high melting point solder HS2 is carried out. Accordingly, in the case of the present first embodiment, even if the reflow temperature of the high melting point solder HS1 and the high melting point solder HS2 is higher than the heat-resisting temperature of the tape, the heat resistance of the tape will not pose a problem because the tape is originally not applied to the rear surface of the lead frame LF1. That is, according to the present first embodiment, the heat treatment (reflow) of the high melting point solder HS1 and the high melting point solder HS2 is carried out before the tape is applied to the rear surface of the lead frame LF1, and therefore the heat resistance of the tape can be secured regardless of the temperature of the heat treatment (reflow).

Thereafter, in order to remove a flux contained in the high melting point solder HS1 and the high melting point solder HS2, flux cleaning is carried out (S111 of FIG. 12). Then, from a viewpoint of improving the bonding characteristics of a wire in the wire bonding step carried out in a subsequent step, the upper surface of the lead frame LF1 is cleaned by carrying out plasma processing with respect to the upper surface of the lead frame LF1 (S112 of FIG. 12).

Next, as shown in FIG. 20A and FIG. 20B, the tape TP is applied to the rear surface of the lead frame LF1 (S113 of FIG. 12). That is, among the faces of the lead frame LF1, the tape TP is applied to a face opposite to a face, on which the driver IC chip CHP(C), the High-MOS chip CHP(H), and the Low-MOS chip CHP(L) are mounted. Then, as described above, the heat treatment (reflow) at approximately 350° C. with respect to the high melting point solder HS1 and the high melting point solder HS2 is already completed in a step prior to the step of applying the tape TP, and therefore in the present first embodiment, the heat resistance of the tape TP will not appear as a problem.

That is, the above-described reflow temperature of the high melting point solder HS1 and the high melting point solder HS2 is approximately 350° C., for example, and exceeds the heat-resisting temperature (e.g., approximately 250° C.) of the tape TP. Therefore, if a heat treatment for melting the high melting point solder HS1 and the high melting point solder HS2 is carried out in the state where the tape TP is applied to the rear surface of the lead frame LF, the tape TP will not be able to withstand the heat treatment. Regarding this point, in the present first embodiment, in a step prior to the step of applying the tape TP, the heat treatment (reflow) at approximately 350° C. with respect to the high melting point solder HS1 and the high melting point solder HS2 is already completed. For this reason, in the present first embodiment, the heat resistance of the tape TP will not appear as a problem.

Here, unless the tape TP is applied to the rear surface of the lead frame LF1 in the state where the upper surface opposite to the rear surface, to which the tape TP is applied, of the lead frame LF1 is supported, for example, by a support member, it might be difficult to firmly apply the tape TP to the rear surface of the lead frame LF1. That is, if the tape TP is applied to the rear surface of the lead frame LF1 in the state where the upper surface opposite to the rear surface, to which the tape TP is applied, of the lead frame LF1 is not supported, for example, by a support member, the lead frame LF1 will not be fixed. Therefore, a reaction force from the lead frame LF1 generated in applying the tape TP to the rear surface of the lead frame LF1 becomes weak. As a result, it is difficult to reliably apply the tape TP to the rear surface of the lead frame LF1 without involving a void and the like.

However, in the present first embodiment, in a step prior to the step of applying the tape TP, the driver IC chip CHP(C), the High-MOS chip CHP(H), and the Low-MOS chip CHP(L) are already mounted over the lead frame LF1. Therefore, when the upper surface opposite to the rear surface, to which the tape TP is applied, of the lead frame LF is directly supported by a support member, the upper surface of the driver IC chip CHP(C), for example, will be also supported by the support member, and a pressing pressure from the support member transmits to the driver IC chip CHP(C) and thus the driver IC chip CHP(C) might be damaged. Here, there is a room for improvement.

Therefore, in the present first embodiment, a device for the evident room for improvement is implemented. That is, the present first embodiment is characterized in a method of fixing the lead frame LF1 in applying the tape TP to the rear surface of the lead frame LF1. This characteristic will be described later.

Figure 21A:
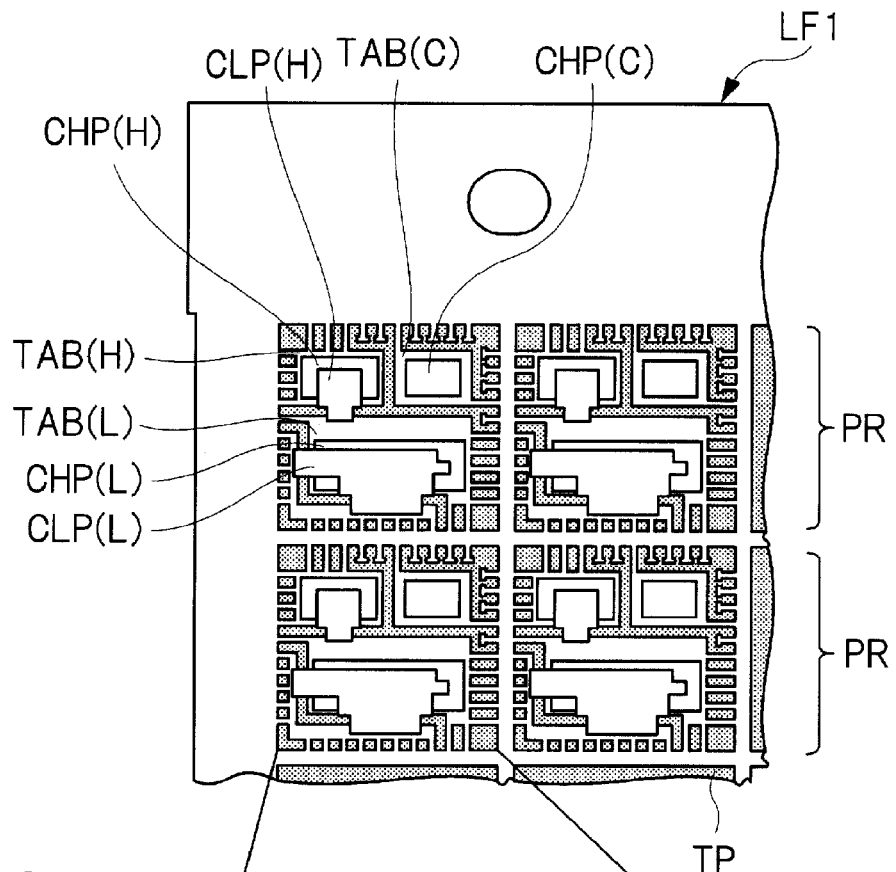
FIGS. 21A and 21B show the manufacturing process of the semiconductor device following FIGS. 20A and 20B, FIG. 21A being a plan view showing the process and FIG. 21B being an enlarged plan view showing a partial region of FIG. 21A.
Figure 21B:
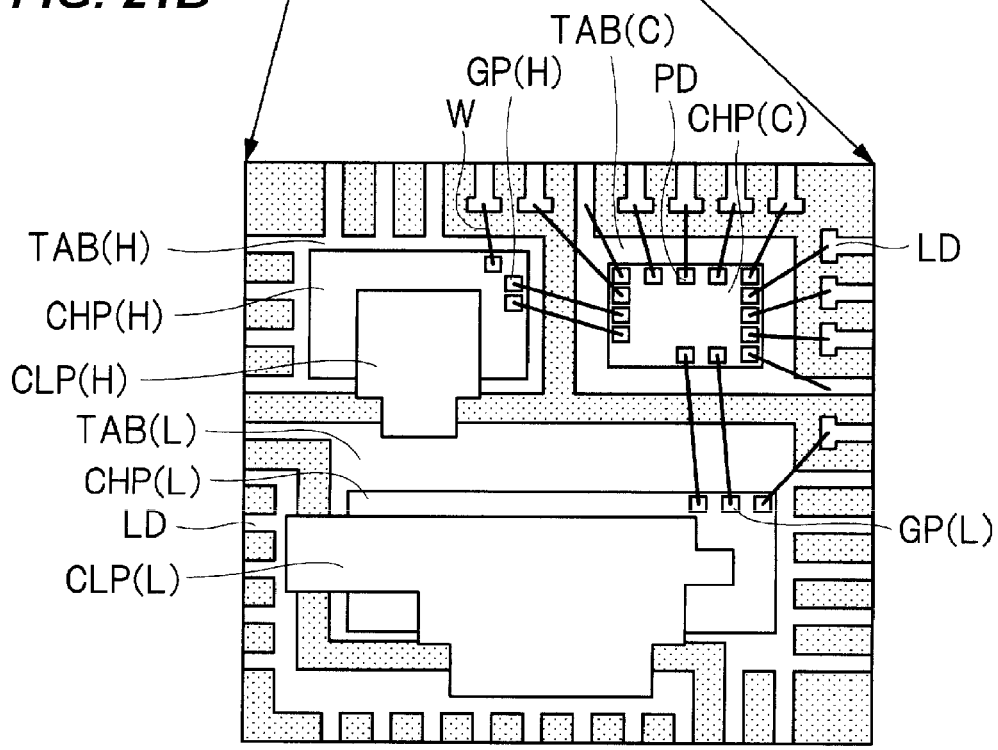

Subsequently, as shown in FIG. 21A and FIG. 21B, the wire bonding step is carried out (S114 of FIG. 12). FIG. 21A is a view showing the lead frame LF1 in carrying out the wire bonding step after applying the tape TP to the rear surface of the lead frame LF1. However, in FIG. 21A, a component (wire) required for carrying out the actual wire bonding step is omitted, and this component (wire) is shown in the FIG. 21B that is an enlarged view of one product region PR shown in FIG. 21A.

In FIG. 21B, a plurality of electrode pads PD formed in the driver IC chip CHP(C) and a plurality of leads LD are coupled to each other by a plurality of wires W. Furthermore, as shown in FIG. 21B, the gate electrode pad GP(H) formed in the High-MOS chip CHP(H) and the electrode pad PD formed in the driver IC chip CHP(C) are coupled to each other by the wire W. Similarly, the gate electrode pad GP(L) formed in the Low-MOS chip CHP(L) and the electrode pad PD formed in the driver IC chip CHP(C) are coupled to each other by the wire W. Thus, according to the present first embodiment, the High-MOS transistor QH formed in the High-MOS chip CHP(H) (see FIG. 1) and the Low-MOS transistor QL formed in the Low-MOS chip CHP(L) (see FIG. 1) are electrically controlled by the control circuit CC (see FIG. 1) formed in the driver IC chip CHP(C).

Here, in the present first embodiment, because the MAP molding technique is applied to the molding step, the product regions PR are densely arranged in the lead frame LF1 shown in FIG. 21A, for example. For this reason, in the wire bonding step, it is difficult to secure, in the lead frame LF1, a space region sufficient for pressing with the window clamper.

Then, in the lead frame LF1 corresponding to the MAP molding technique, in the wire bonding step, the lead frame LF1 is vacuum-sucked to a heat block to be arranged, and thereby the wire bonding step will be carried out while the lead frame LF1 is fixed to the heat block. In this case, for example, when the tape TP is not applied to the rear surface of the lead frame LF1, there is a region without any lead (a gap between patterns) and therefore it is difficult to vacuum-suck and fix the lead frame LF1 over the heat block.

In contrast, according to the present first embodiment, in a step prior to carrying out the wire bonding step, the tape TP is applied to the rear surface of the lead frame LF1. Therefore, according to the present first embodiment, the lead frame LF1 having the tape TP applied thereto can be easily vacuum-sucked. As a result, even with the lead frame LF1 corresponding to the MAP molding technique, it is possible to carry out the wire bonding step while reliably fixing the lead frame LF1 by vacuum suction. As a result, according to the present first embodiment, the reliability in the wire bonding step can be improved.

Note that, the wire bonding step is carried out in the state where the lead frame LF1 is heated to approximately 200° C. to approximately 250° C., for stabilization of the joint of the wire W. However, because the heat-resisting temperature of the tape TP applied to the rear surface of the lead frame LF1 is approximately 250° C., the heat resistance of the tape TP may not pose a problem caused by the heat treatment that is applied in the wire bonding step.

Next, as shown in FIG. 22, the product regions formed in the lead frame LF1 are collectively sealed (molded) with the resin MR (S115 of FIG. 12). In other words, a sealing body is formed by collectively sealing the product regions PR in the lead frame LF1 with the resin MR so as to cover the driver IC chip CHP(C), the High-MOS chip CHP(H), and the Low-MOS chip CHP(L) shown in FIG. 21B. That is, in the present first embodiment, as a technique for sealing a semiconductor chip with resin, the so-called. MAP molding technique, in which the product regions PR are included in a cavity and the product regions PR are collectively sealed with resin, is employed. According to this MAP molding technique, because there is no need to provide a path for injecting resin for each product region PR, the product regions PR can be densely arranged. Thus, according to the MAP molding technique, the acquisition number of products can be increased and thereby a cost reduction of the product can be achieved.

Figure 23:
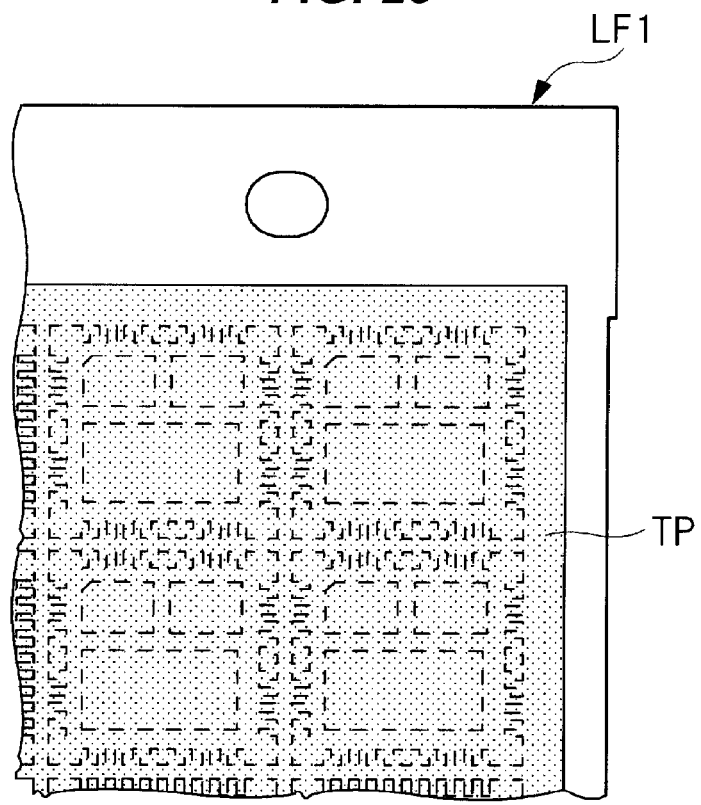
FIG. 23 is a plan view seen from the rear surface of FIG. 22.

Then, in the present first embodiment, in a step prior to the resin sealing step (molding step) by the MAP molding technique, the adhesive tape TP is applied to the rear surface of the lead frame LF1. Therefore, according to the present first embodiment, for example, as shown in FIG. 23, the tape TP can be reliably applied to the rear surface terminal (lead) formed on the rear surface of the lead frame LF1. As a result, also in the resin sealing step employing the MAP molding technique, a gap is not formed between the rear surface terminal and the tape TP and thus the resin leakage (resin burr) to the rear side of the rear surface terminal can be sufficiently suppressed.

Note that, as the resin used in the resin sealing step, a thermosetting resin is used, for example. Therefore, the resin sealing step is carried out in a state of being heated to approximately 160° C. to approximately 200° C., in order to cure the thermosetting resin. However, because the heat-resisting temperature of the tape TP applied to the rear surface of the lead frame LF1 is approximately 250° C., the heat treatment applied in the resin sealing step may not cause a problem in the heat resistance of the tape TP.

Thereafter, the tape TP applied to the rear surface of the lead frame LF1 is peeled off from the lead frame LF1 (S116 of FIG. 12). Then, a plating film is formed on the upper surface of the chip mounting portion TAB(C), the chip mounting portion TAB(H), the chip mounting portion TAB (L), and the rear surface terminal BTE which are exposed from the rear surface of the resin MR (sealing body) (see FIG. 3) (S117 of FIG. 12). Furthermore, a mark is formed on the upper surface of the sealing body formed by the resin MR (marking step) (S118 of FIG. 12).

Figure 24A:
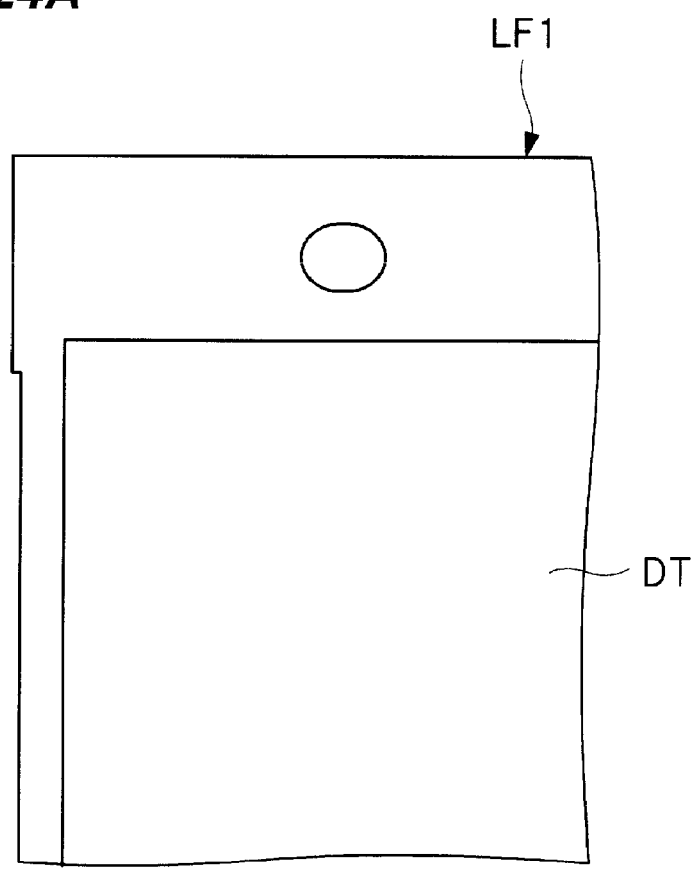
FIGS. 24A and 24B show the manufacturing process of the semiconductor device following FIG. 22 and FIG. 23, FIG. 24A being a plan view showing the process and FIG. 24B being a side view showing the process.
Figure 24B:
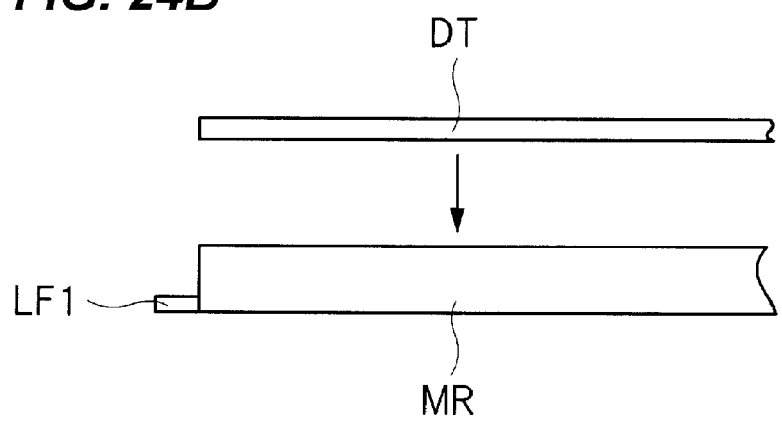
Figure 25A:
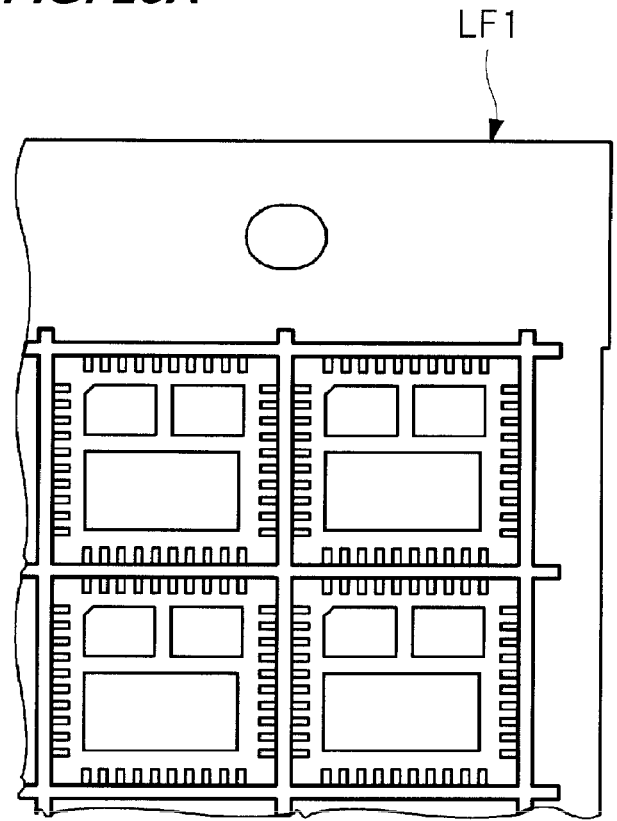
FIGS. 25A to 25C show the manufacturing process of the semiconductor device following FIGS. 24A and 24B, FIG. 25A being a plan view showing the process, FIG. 25B being a side view showing the process, and FIG. 25C being a plan view showing a semiconductor device singulated in this step.
Figure 25B:
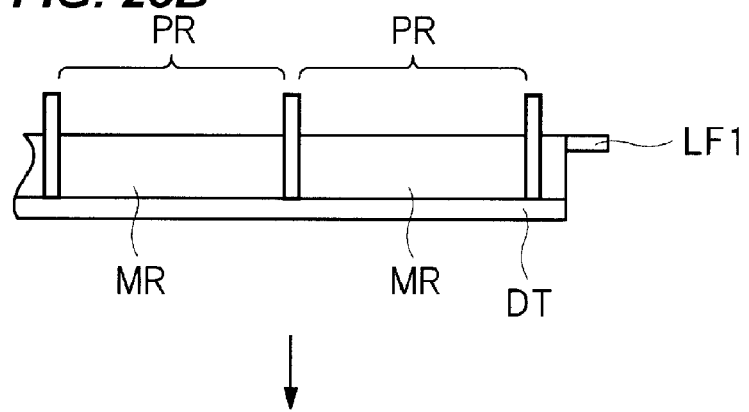
Figure 25C:
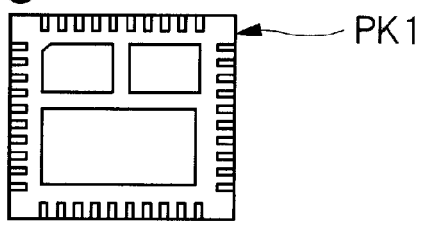

Next, as shown in FIG. 24A and FIG. 24B, a dicing tape DT is applied to the upper surface of the sealing body formed by the resin MR (S119 of FIG. 13). Then, as shown in FIG. 25A and FIG. 25B, the sealing body formed by the resin MR is cut for each product region PR (package dicing) (S120 of FIG. 13). Specifically, a partition region (boundary region) partitioning the product regions PR formed in the lead frame LF1 is cut with a dicing blade and thereby each product region PR is singulated. Thus, for example, the semiconductor device PK1 in the present first embodiment as shown in FIG. 25C can be acquired.

Thereafter, the singulated individual semiconductor device PK1 is sorted by an electric test (S121 of FIG. 13), and the semiconductor device PK1 determined to be non-defective is packaged and shipped (S122 of FIG. 13). In this manner, the semiconductor device in the present first embodiment can be manufactured.

Note that, here, a case example of carrying out plasma processing shown in S112 of FIG. 12 is taken and described, but not limited thereto. If a connection strength (connection reliability) between the wire W and the lead frame LF1 (the plurality of leads LD) and between the wire W and the electrode pad of each semiconductor chip can be secured without the plasma processing being carried out, the plasma processing can be omitted and the number of process steps can be reduced. This can be also applicable to the embodiments and modifications described below.

Characteristics of First Embodiment

Next, the features in the present first embodiment are described with reference to the accompanying drawings. As described above, the present first embodiment is characterized in the method of fixing the lead frame LF1 in applying the tape TP to the rear surface of the lead frame LF1. In particular, the technical idea in the present first embodiment is to apply a tape to the rear surface of a lead frame in the state of supporting the upper surface side of the lead frame, while reducing the damage to a semiconductor chip. Hereinafter, the technical idea in the present first embodiment is specifically described.

Figure 26A:
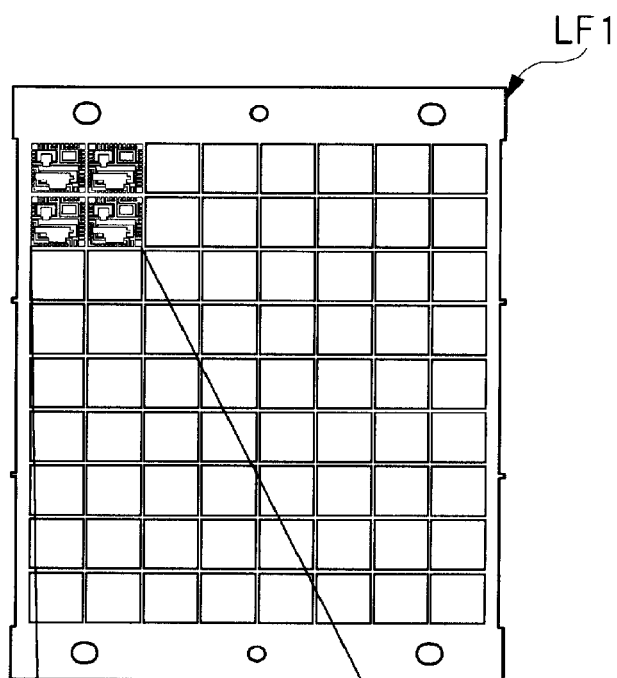
FIG. 26A is a view showing the configuration of a lead frame immediately before applying a tape to the rear surface of the lead frame.
Figure 26B:
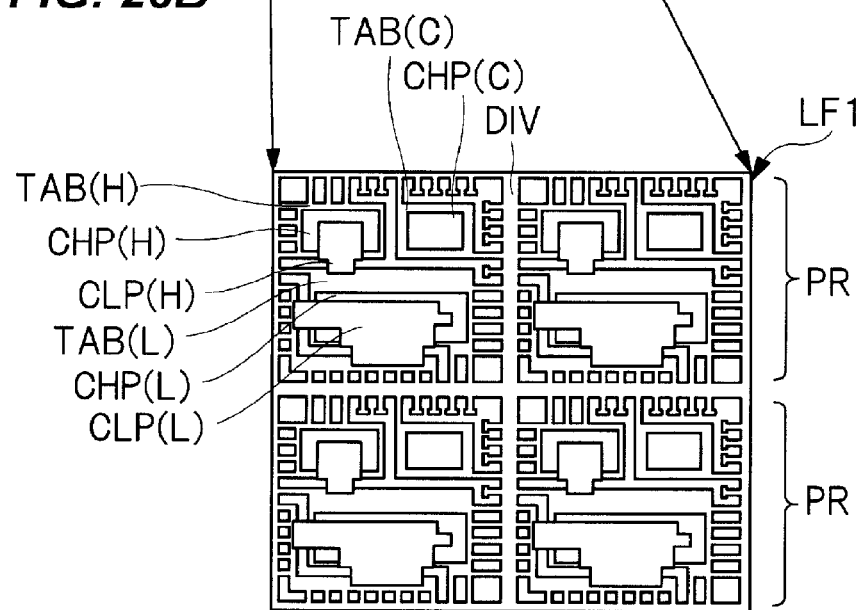
FIG. 26B is an enlarged view showing a part of FIG. 26A.

FIG. 26A is a view showing the configuration of the lead frame LF1 immediately before applying the tape TP to the rear surface of the lead frame LF1, and FIG. 26B is an enlarged view showing a part of FIG. 26A. As shown in FIG. 26B, in the lead frame LF1 in the present first embodiment, the product regions PR are arranged in a matrix, and each product region PR is partitioned by the partition region (boundary region) DIV. Now, attention is focused on each product region PR. The chip mounting portion TAB(C), the chip mounting portion TAB(H), and the chip mounting portion TAB(L) are arranged in each product region PR, and the driver IC chip CHP(C) is mounted over the chip mounting portion TAB(C). Moreover, the High-MOS chip CHP(H) is mounted over the chip mounting portion TAB(H), and the Low-MOS chip CHP(L) is mounted over the chip mounting portion TAB(L). Furthermore, the High-MOS clip CLP(H) is arranged so as to span from over the High-MOS chip CHP(H) to over the chip mounting portion TAB(L), and the Low-MOS clip CLP(L) is arranged so as to span from over the Low-MOS chip CHP(L) to over the lead.

In the present first embodiment, the tape TP will be applied to the rear surface of the lead frame LF1 that is formed in this manner. Then, in the present first embodiment, among the faces of the lead frame LF1, the tape TP will be applied to the rear surface of the lead frame LF1 while the upper surface opposite to the rear surface, to which the tape TP is applied, is supported by a support member. Here, in the present first embodiment, although the upper surface side of the lead frame LF1 will be supported by a support member, the driver IC chip CHP(C), the High-MOS chip CHP(H), and the Low-MOS chip CHP(L) are already mounted on the upper surface side of the lead frame LF1 as described above. Therefore, in the present first embodiment, a device is implemented to support the upper surface side of the lead frame LF1 with the support member without damaging the driver IC chip CHP(C), the High-MOS chip CHP(H), and the Low-MOS chip CHP(L).

Figure 27A:
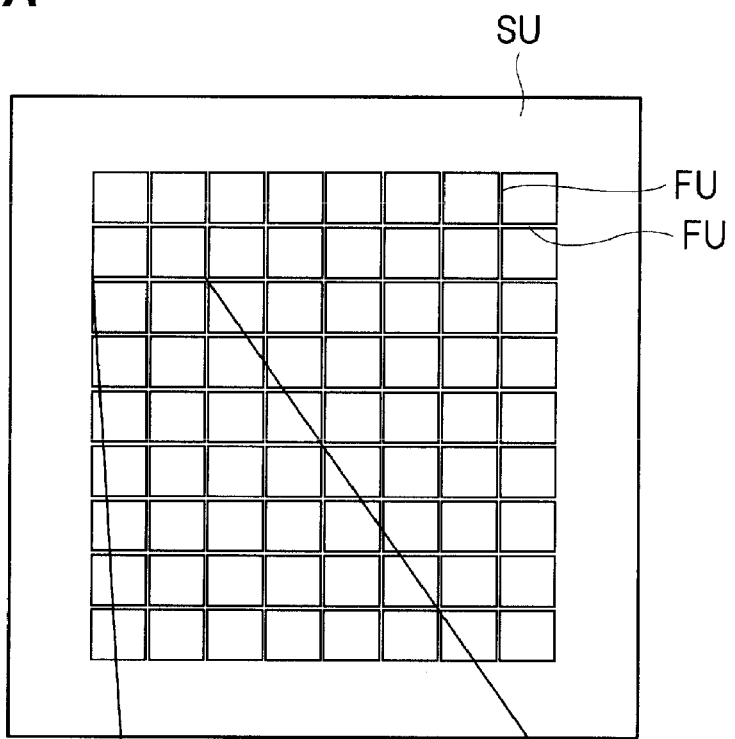
FIG. 27A is a plan view showing a schematic entire configuration of a support member used in the first embodiment.
Figure 27B:
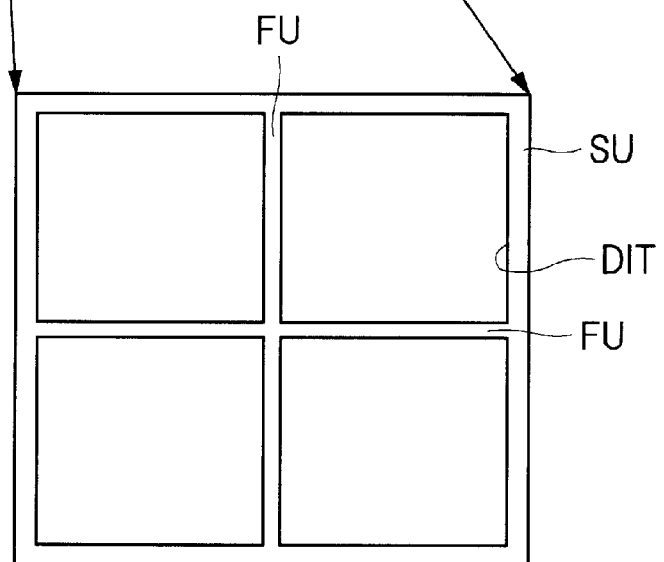
FIG. 27B is an enlarged view showing a part of FIG. 27A.

FIG. 27A is a plan view showing the schematic entire configuration of a support member SU used in the present first embodiment, and FIG. 27B is an enlarged view of a part of FIG. 27A. As shown in FIG. 27A and FIG. 27B, the support member SU includes a plurality of frame portions FU, and a ditch DIT is partitioned by the frame portions FU. As can be seen by comparing FIG. 26B and FIG. 27B, the frame portion FU of the support member SU shown in FIG. 27B is arranged corresponding to the partition region DIV shown in FIG. 26B. Then, the ditch DIT provided in the support member SU shown in FIG. 27B is arranged corresponding to the product region PR shown in FIG. 26B.

Figure 28:
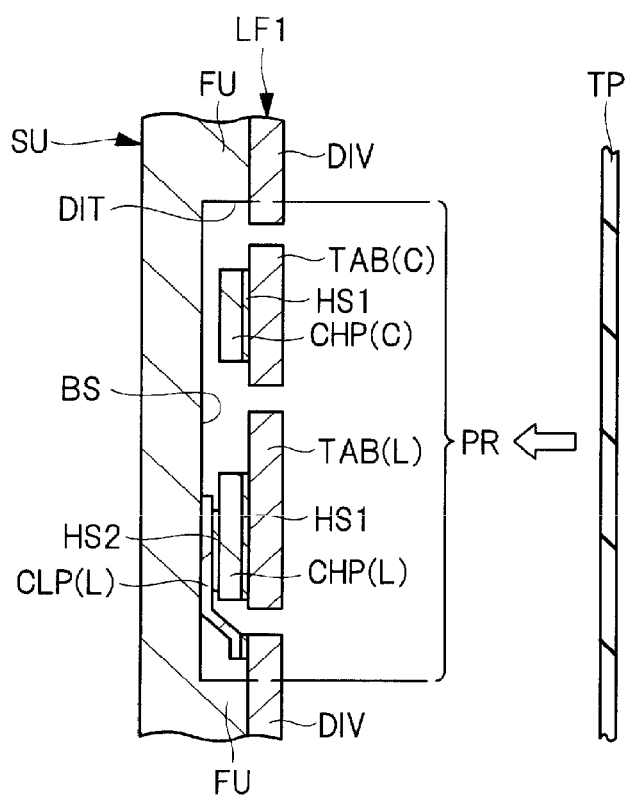
FIG. 28 is a cross-sectional view showing how a tape is applied to the rear surface of a lead frame in a state where the upper surface side of the lead frame is supported with a support member.

FIG. 28 is a cross-sectional view showing how the tape TP is applied to the rear surface of the lead frame LF1 in a state where the upper surface side of the lead frame LF1 is supported with a support member SU. As shown in FIG. 28, the product region PR provided in the lead frame LF1 is sandwiched by the partition regions DIV. Then, the chip mounting portion TAB(C) and the chip mounting portion TAB(L) are provided in the product region PR, and the driver IC chip CHP(C) is mounted over the chip mounting portion TAB(C) via the high melting point solder HS1. Moreover, the Low-MOS chip CHP(L) is mounted over the chip mounting portion TAB(L) via the high melting point solder HS1, and the Low-MOS clip CLP(L) is arranged over this Low-MOS chip CHP(L) via the high melting point solder HS2. Note that, although not shown in FIG. 28, for example, as can be seen also from FIG. 26B, the chip mounting portion TAB(H) is also arranged in the product region PR, the High-MOS chip CHP(H) is mounted over this chip mounting portion TAB(H) via the high melting point solder HS1, and the High-MOS clip CLP(H) is arranged over this High-MOS chip CHP(H) via the high melting point solder HS2.

Here, the upper surface side of the lead frame LF1 is supported by the support member SU so that the frame portion FU contacts the partition region DIV of the lead frame LF1. Thus, the ditch DIT sandwiched by the frame portions FU will be arranged at a location where it overlaps in a planar manner with the product region PR formed in the lead frame LF1. Then, in the present first embodiment, as shown in FIG. 28, there is a gap between a bottom surface BS of the ditch DIT provided in the support member SU and the upper surface of the driver IC chip CHP(C). As a result, according to the present first embodiment, the support member SU will support the upper surface side of the lead frame LF1 in a state of not contacting the driver IC chip CHP(C). Therefore, according to the present first embodiment, it is possible to support the upper surface side of the lead frame LF1 without damaging the driver IC chip CHP(C).

On the other hand, as shown in FIG. 28, the upper surface side of the lead frame LF1 will be supported by the support member SU so that the bottom surface BS of the ditch DIT contacts the upper surface of the Low-MOS clip CLP(L) mounted over the Low-MOS chip CHP(L).

For example, from a viewpoint of not giving a damage due to the support member SU to the Low-MOS chip CHP(L), the upper surface of the Low-MOS clip CLP(L) mounted over the Low-MOS chip CHP(L) may be configured so as not to contact the bottom surface BS of the ditch DIT provided in the support member SU. However, if such a configuration is employed, the product region PR formed in the lead frame LF1 will not be supported by the support member SU at all. That is, when the upper surface of the Low-MOS clip CLP(L) is configured so as not to contact the bottom surface BS of the ditch DIT provided in the support member SU, the upper surface side of the lead frame LF1 will be supported, only with the frame portion FU of the support member SU contacting the partition region DIV surrounding the product region PR. In this case, given that the tape TP is applied to the rear surface of the lead frame LF1, the product region PR itself will not be supported by the support member SU at all. That is, if the tape TP is applied to the rear surface of the lead frame LF1 with no support of the upper surface opposite to the rear surface, to which the tape TP is applied, of the lead frame LF1, e.g., with no support of the product region PR itself at all, then among the regions of the lead frame LF1, in particular the product region PR is unstably fixed. As a result, in the product region PR of the lead frame LF1, a reaction force from the lead frame LF1 that is generated in applying the tape TP to the rear surface of the lead frame LF1 will be significantly weak. Thus, it is difficult to reliably apply the tape TP to the rear surface of the product region PR formed in the lead frame LF1 without involving a void and the like.

Then, in the present first embodiment, as shown in FIG. 28, the upper surface side of the lead frame LF1 is supported by the support member SU so that the bottom surface BS of the ditch DIT formed in the support member SU contacts the upper surface of the Low-MOS clip CLP(L) mounted over the Low-MOS chip CHP(L). Similarly, although not illustrated in FIG. 28, the upper surface side of the lead frame LF1 is supported by the support member SU so that the bottom surface BS of the ditch DIT formed in the support member SU contacts the upper surface of the High-MOS clip CLP(H) mounted over the High-MOS chip CHP(H). In this manner, as with the upper surface of the Low-MOS clip CLP(L), the upper surface of the High-MOS clip CLP(H) is also configured so as to contact the bottom surface BS of the ditch DIT, but hereinafter the description will be made from a viewpoint of focusing on the Low-MOS clip CLP(L) shown in FIG. 28.

In the present first embodiment, in supporting the upper surface side of the lead frame LF1 by the support member SU, there is a gap between the bottom surface BS of the ditch DIT provided in the support member SU and the upper surface of the driver IC chip CHP(C) as shown in FIG. 28, for example. On the other hand, in the present first embodiment, the bottom surface BS of the ditch DIT formed in the support member SU contacts the upper surface of the Low-MOS clip CLP(L) mounted over the Low-MOS chip CHP(L).

Thus, because the product region PR itself formed in the lead frame LF1 is not in the state without being supported by the support member SU at all, the stability of fixing of the product region PR can be improved. As a result, also in the product region PR of the lead frame LF1, a sufficient reaction force (repulsive force) from the lead frame LF1 that is generated in applying the tape TP to the rear surface of the lead frame LF1 can be secured. Therefore, according to the present first embodiment, it is possible to reliably apply the tape TP to the rear surface of the product region PR formed in the lead frame LF1 without involving avoid and the like. That is, according to the present first embodiment, even in a state where the driver IC chip CHP(C), the High-MOS chip CHP(H), and the Low-MOS chip CHP(L) are mounted on the upper surface side of the lead frame LF1, it is possible to reliably apply the tape TP to the rear surface of the lead frame LF1 (in particular, to the rear surface of the product region PR).

Here, in the present first embodiment, for example, as shown in FIG. 28, there is a gap between the bottom surface BS of the ditch DIT provided in the support member SU and the upper surface of the driver IC chip CHP(C). On the other hand, the bottom surface BS of the ditch DIT formed in the support member SU is configured so as to contact the upper surface of the Low-MOS clip CLP(L) mounted over the Low-MOS chip CHP(L). Now, this reason is described.

First, from a viewpoint of reliably supporting the product region PR itself formed in the lead frame LF1 by the support member SU, the bottom surface BS of the ditch DIT formed in the support member SU may be configured so as to contact both the upper surface of the driver IC chip CHP(C) and the upper surface of the Low-MOS clip CLP(L).

However, configuring so that the bottom surface BS of the ditch DIT contacts the upper surface of the driver IC chip CHP(C) means that the driver IC chip CHP(C) is directly supported by the support member SU. In this case, the pressing force from the support member SU will be applied directly to the driver IC chip CHP(C), and thus the damage to the driver IC chip CHP(C) may increase. Accordingly, in the present first embodiment, for example, as shown in FIG. 28, there is a gap between the bottom surface BS of the ditch DIT provided in the support member SU and the upper surface of the driver IC chip CHP(C). That is, in the present first embodiment, the bottom surface BS of the ditch DIT is configured so as not to contact the upper surface of the driver IC chip CHP(C).

On the other hand, the upper surface of the Low-MOS clip CLP(L) mounted over the Low-MOS chip CHP(L) may be also configured so as not to contact the bottom surface BS of the ditch DIT provided in the support member SU. However, if such a configuration is employed, the product region PR formed in the lead frame LF1 will not be supported by the support member SU at all. As a result, the product region PR is unstably fixed. For this reason, in the product region PR of the lead frame LF1, a reaction force from the lead frame LF1 that is generated in applying the tape TP to the rear surface of the lead frame LF1 will be significantly weak. Accordingly, it is difficult to reliably apply the tape TP to the rear surface of the product region PR formed in the lead frame LF1 without involving a void and the like.

Then, in the present first embodiment, the upper surface side of the lead frame LF1 is supported by the support member SU so that the bottom surface BS of the ditch DIT formed in the support member SU contacts the upper surface of the Low-MOS clip CLP(L) mounted over the Low-MOS chip CHP(L).

Here, the upper surface side of the lead frame LF1 is supported by the support member SU so that the bottom surface BS of the ditch DIT contacts the upper surface of the Low-MOS clip CLP(L). In this case, whether or not a damage to the Low-MOS chip CHP(L) arranged in an underlayer of the Low-MOS clip CLP(L) will pose a problem is a question. However, the Low-MOS chip CHP(L) is not configured so as to cause the bottom surface BS of the ditch DIT to directly contact the upper surface of the Low-MOS chip CHP(L), but is configured so that the Low-MOS clip CLP(L) is interposed between the Low-MOS chip CHP(L) and the bottom surface BS of the ditch DIT. That is, in the Low-MOS chip CHP(L), the bottom surface BS of the ditch DIT does not directly contact the upper surface of the Low-MOS chip CHP(L). That is, in the present first embodiment, the Low-MOS clip CLP(L) interposed between the Low-MOS chip CHP(L) and the bottom surface BS of the ditch DIT functions as a buffer material. For this reason, even if the upper surface side of the lead frame LF1 is supported by the support member SU so that the bottom surface BS of the ditch DIT contacts the Low-MOS clip CLP(L), the damage to the Low-MOS chip CHP(L) can be reduced to a level having no problem.

From the above, in the present first embodiment, there is a gap between the bottom surface BS of the ditch DIT provided in the support member SU and the upper surface of the driver IC chip CHP(C). On the other hand, the bottom surface BS of the ditch DIT formed in the support member SU is configured so as to contact the upper surface of the Low-MOS clip CLP(L) mounted over the Low-MOS chip CHP(L).

Thus, according to the present first embodiment, such a significant effect can be obtained that it is possible to reliably apply the tape TP to the rear surface of the lead frame LF1 (in particular, to the rear surface of the product region PR) while reducing the damage to the driver IC chip CHP(C), the High-MOS chip CHP(H), and the Low-MOS chip CHP(L).

Here, in the configuration of the present first embodiment, because the upper surface of the driver IC chip CHP(C) is not pressed by the support member SU, the entire product region PR is not pressed by the support member SU. However, for example, as shown in FIGS. 26A and 26B, in the case where an area of the driver IC chip CHP(C) that occupies the product region PR is sufficiently small as compared with an area occupied by the High-MOS chip CHP(H) or the Low-MOS chip CHP(L), even if a partial region of the product region PR is not pressed by the support member SU, the tape TP can be sufficiently and reliably applied to the rear surface of the lead frame LF1 (in particular, to the rear surface of the product region PR).

Note that, the originality of the technical idea in the present first embodiment lies, for example, as shown in FIG. 28, in having found the function as a buffer material in the Low-MOS clip CLP(L) that is mounted over the Low-MOS chip CHP(L) via the high melting point solder HS2. Originally, the function of the Low-MOS clip CLP(L) is a function to reduce the on-resistance but the function as a buffer material is not assumed. Regarding this point, the technical idea in the present first embodiment, which is contemplated by having found the function as a buffer material in the Low-MOS clip CLP(L), has originality.

Here, from a viewpoint of sufficiently exhibiting the function as a buffer material in the Low-MOS clip CLP(L), for example, the thickness of the Low-MOS clip CLP(L) may be set as large as possible. In this case, because the cross-sectional area of the Low-MOS clip CLP(L) will also increase, the electric resistance of the Low-MOS clip CLP(L) can be reduced and thus the on-resistance of the semiconductor device PK1 in the present first embodiment can be further reduced.

<Modification 1>

Figure 29:
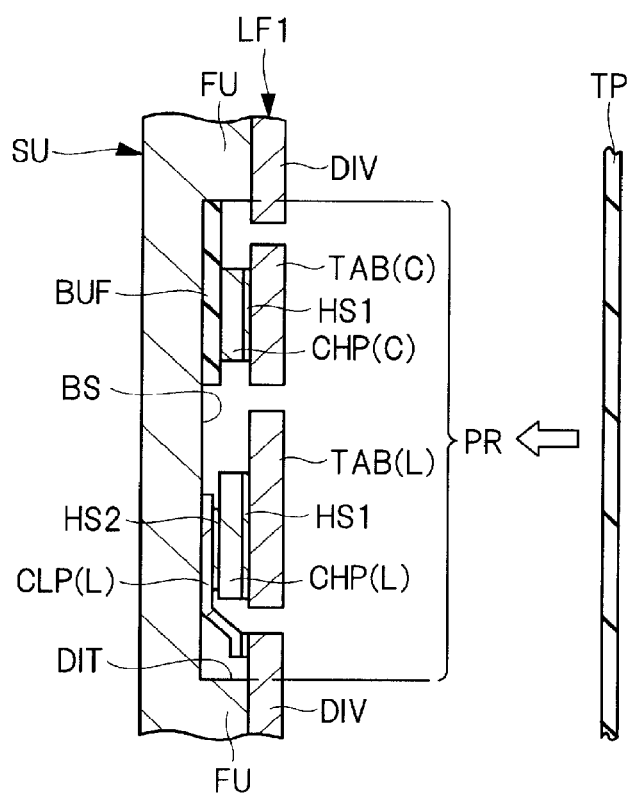
FIG. 29 is a cross-sectional view showing how a tape is applied to the rear surface of a lead frame in a state where the upper surface side of the lead frame is supported with a support member, in a Modification 1 of the first embodiment.

Next, a Modification 1 in the present first embodiment is described. FIG. 29 is a cross-sectional view showing how the tape TP is applied to the rear surface of the lead frame LF1 in a state where the upper surface side of the lead frame LF1 is supported by the support member SU, in the present Modification 1.

As shown in FIG. 29, in the present Modification 1, the buffer material BUF is interposed between the bottom surface BS of the ditch DIT provided in the support member SU and the upper surface of the driver IC chip CHP(C). Thus, the driver IC chip CHP(C) will be also supported by the support member SU. As a result, according to the present Modification 1, because the entire product region PR can be supported by the support member SU, the tape TP can be reliably applied to the rear surface of the lead frame LF1 (in particular, to the rear surface of the product region PR).

Then, in the present Modification 1, the upper surface of the driver IC chip CHP(C) does not directly contact the bottom surface BS of the ditch DIT provided in the support member SU but indirectly contacts the bottom surface BS of the ditch DIT via the buffer material BUF. Therefore, even when the upper surface of the driver IC chip CHP(C) is supported by the support member SU, the damage to the driver IC chip CHP(C) can be reduced to a level having no problem.

From the above, according to the present Modification 1, such a remarkable effect can be obtained that it is possible to reliably apply the tape TP to the rear surface of the lead frame LF1 (in particular, to the entire rear surface of the product region PR) while reducing the damage to the driver IC chip CHP(C), the High-MOS chip CHP(H), and the Low-MOS chip CHP(L).

<Modification 2>

Figure 30:
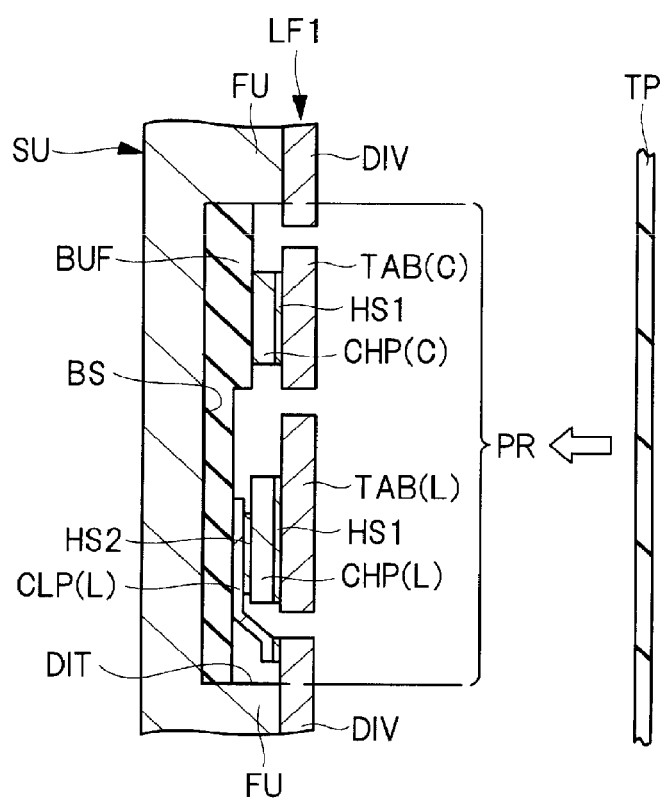
FIG. 30 is a cross-sectional view showing how a tape is applied to the rear surface of a lead frame in a state where the upper surface side of the lead frame is supported with a support member, in a Modification 2 of the first embodiment.

Subsequently, a Modification 2 in the present first embodiment is described. FIG. 30 is a cross-sectional view showing how the tape TP is applied to the rear surface of the lead frame LF1 in a state where the upper surface side of the lead frame LF1 is supported by the support member SU, in the Modification 2.

As shown in FIG. 30, in the present Modification 2, the buffer material BUF is interposed between the bottom surface BS of the ditch DIT provided in the support member SU and the upper surface of the driver IC chip CHP(C). Thus, the driver IC chip CHP(C) will be also supported by the support member SU. As a result, according to the present Modification 2, because the entire product region PR can be supported by the support member SU, the tape TP can be reliably applied to the rear surface of the lead frame LF1 (in particular, to the rear surface of the product region PR).

Then, also in the present Modification 2, the upper surface of the driver IC chip CHP(C) does not directly contact the bottom surface BS of the ditch DIT provided in the support member SU but indirectly contacts the bottom surface BS of the ditch DIT via the buffer material BUF. Therefore, even when the upper surface of the driver IC chip CHP(C) is supported by the support member SU, the damage to the driver IC chip CHP(C) can be reduced to a level having no problem.

Furthermore, in the present Modification 2, the buffer material BUF is interposed also between the upper surface of the Low-MOS clip CLP(L) and the bottom surface BS of the ditch DIT provided in the support member SU. That is, in the present Modification 2, the Low-MOS clip CLP(L) and the buffer material BUF are interposed between the Low-MOS chip CHP(L) and the bottom surface BS of the ditch DIT. That is, in the present Modification 2, the Low-MOS clip CLP(L) interposed between the Low-MOS chip CHP(L) and the bottom surface BS of the ditch DIT functions as a buffer material, and furthermore the buffer material BUF is also provided between the Low-MOS clip CLP(L) and the bottom surface BS of the ditch DIT. For this reason, even if the upper surface side of the lead frame LF1 is supported by the support member SU, the damage to the Low-MOS chip CHP(L) can be more reliably reduced to a level having no problem.

From the above, also with the present Modification 2, such a remarkable effect can be obtained that it is possible to reliably apply the tape TP to the rear surface of the lead frame LF1 (in particular, to the entire rear surface of the product region PR) while reducing the damage to the driver IC chip CHP(C), the High-MOS chip CHP(H), and the Low-MOS chip CHP(L).

<Specific Configuration of Buffer Material>

Next, the specific configuration and advantage of the buffer material (the Low-MOS clip CLP(L) and/or the buffer material BUF) described in the above-mentioned first embodiment, the Modification 1, and the Modification 2 are described.

FIG. 31 is a view showing the modulus of longitudinal elasticity, Shore A hardness, and Vickers hardness of various materials. In FIG. 31, a polyurethane rubber, a silicon rubber (silicone rubber), and a nitrile rubber are listed as the example of the buffer material BUF. Moreover, as the material to be compared, for example, listed is silicon which is a constituent component of a semiconductor chip represented by the driver IC chip CHP(C), the High-MOS chip CHP(H), and the Low-MOS chip CHP(L). Furthermore, also listed is copper (oxygen free copper) which is a constituent component of the Low-MOS clip CLP(L) functioning as the buffer material, and stainless (SUS304) which is a constituent material of the support member SU.

In FIG. 31, first, to describe the modulus of longitudinal elasticity, the moduli of longitudinal elasticity of the polyurethane rubber is 24.0 (MPa) to 29.4 (MPa), the moduli of longitudinal elasticity of the silicon rubber (silicone rubber) is 5 (MPa) to 7 (MPa), and the moduli of longitudinal elasticity of the nitrile rubber is 8.1 (MPa) to 20.2 (MPa). Moreover, the modulus of longitudinal elasticity of silicon is 185,000 (MPa), the modulus of longitudinal elasticity of copper (oxygen free copper) is 220 (MPa), and the modulus of longitudinal elasticity of stainless is 620 (MPa).

Next, in FIG. 31, to describe Shore A hardness, the Shore A hardness of the polyurethane rubber is 50 (Hs) to 90 (Hs), the Shore A hardness of the silicon rubber is 50 (Hs) to 70 (Hs), and the Shore A hardness of the nitrile rubber is 50 (Hs) to 70 (Hs).

Subsequently, in FIG. 31, to describe Vickers hardness, the Vickers hardness of silicon (Si) is 1,040 (HV), the Vickers hardness of copper (oxygen free copper) is 105 (HV), and the Vickers hardness of stainless is 196 (HV).

(1) In the Case of the First Embodiment

With reference to FIG. 31, the components of the first embodiment are considered. In the first embodiment, for example, as shown in FIG. 28, over the Low-MOS chip CHP(L), the Low-MOS clip CLP(L) is mounted via the high melting point solder HS2, and the upper surface of this Low-MOS clip CLP(L) contacts the support member SU.

Then, the Low-MOS chip CHP(L) is a semiconductor chip containing silicon as a main component, and the Low-MOS clip CLP(L) is formed by a copper material, for example. Moreover, the support member SU is formed by stainless, for example.

Accordingly, when silicon, copper, and stainless are compared with regard to the modulus of longitudinal elasticity, the modulus of longitudinal elasticity of silicon is the largest, followed by the modulus longitudinal elasticity of stainless, and the modulus of longitudinal elasticity of copper is the smallest. Here, focusing on the modulus of longitudinal elasticity, the larger the modulus of longitudinal elasticity, the harder the material thereof becomes. In other words, the smaller the modulus of longitudinal elasticity, the softer the material thereof becomes. Accordingly, when silicon, copper, and stainless are compared, the hardest material is silicon, the next hardest material is stainless, and the softest material is copper.

Therefore, for example, a case where the support member SU formed by stainless is in direct contact with over the Low-MOS chip CHP(L) formed by silicon is compared with a case where the support member SU formed by stainless is arranged over the Low-MOS chip CHP(L) formed by silicon via the Low-MOS clip CLP(L) formed by copper. In this case, the latter case where the Low-MOS clip CLP(L) formed by copper is interposed can better protect the Low-MOS chip CHP(L) against a pressing force due to the support member SU than the former case. That is, because the Low-MOS clip CLP(L) is the softest, it sufficiently functions as the buffer material in the case where the Low-MOS chip CHP(L) is supported by the support member SU. As a result, even if the upper surface side of the lead frame LF1 is supported by the support member SU so that the bottom surface BS of the ditch DIT contacts the Low-MOS clip CLP(L), the damage to the Low-MOS chip CHP(L) can be reduced to a level having no problem.

(2) In the Case of the Modification 1

With reference to FIG. 31, the components of the Modification 1 are considered. In the Modification 1, for example, as shown in FIG. 29, the buffer material BUF is arranged over the driver IC chip CHP(C), and the support member SU is arranged over this buffer material BUF.

Then, the driver IC chip CHP(C) is a semiconductor chip containing silicon as a main component, and the buffer material BUF is formed by a rubber material, such as a polyurethane rubber, a silicon rubber (silicone rubber), and a nitrile rubber, for example. Moreover, the support member SU is formed by stainless, for example.

Accordingly, when silicon, the rubber material, and stainless are compared with regard to the modulus of longitudinal elasticity, the modulus of longitudinal elasticity of silicon is the largest, followed by the modulus of longitudinal elasticity of stainless, and the modulus of longitudinal elasticity of the rubber material is the smallest. In particular, the modulus of longitudinal elasticity of the rubber material is extremely small as compared with silicon and stainless and the rubber material is found as an extremely soft material.

Thus, because the rubber material is the softest, it sufficiently functions as the buffer material BUF in the case where the driver IC chip CHP(C) is supported by the support member SU. As a result, even if the upper surface side of the lead frame LF1 is supported by the support member SU so that the bottom surface BS of the ditch DIT contacts the buffer material BUF, the damage to the driver IC chip CHP(C) can be reduced to a level having no problem.

In particular, because the rubber material used as the buffer material BUF in the Modification 1 is extremely soft, even if there is any variation in the height of the upper surface of the driver IC chip CHP(C) mounted over the chip mounting portion TAB(C) via the high melting point solder HS1, the buffer material BUF can absorb this height variation and suppress an increase of the pressing force that is applied to the driver IC chip CHP(C) more than necessary. For example, consider a case where the height of the driver IC chip CHP(C) becomes higher than an average height due to manufacturing variations of the chip mounting portion TAB(C) the high melting point solder HS1, and/or the driver IC chip CHP(C). In this case, for example, when the upper surface of the driver IC chip CHP(C) is supported by the support member SU formed by stainless, the pressing force applied to the driver IC chip CHP(C) more than necessary may increase. In contrast, when the driver IC chip CHP(C) is supported by the support member SU with the buffer material BUF interposed over the driver IC chip CHP(C), the height variations can be absorbed by the soft buffer material BUF and therefore an unnecessary increase of the pressing force applied to the driver IC chip CHP(C) can be suppressed.

(3) In the Case of the Modification 2

With reference to FIG. 31, the components of the Modification 2 are considered. In the Modification 2, for example, as shown in FIG. 30, the buffer material BUF is interposed also between the upper surface of the Low-MOS clip CLP(L) and the bottom surface BS of the ditch DIT provided in the support member SU. That is, in the present Modification 2, the Low-MOS clip CLP(L) and the buffer material BUF are interposed between the Low-MOS chip CHP(L) and the bottom surface BS of the ditch DIT.

Then, the Low-MOS chip CHP(L) is a semiconductor chip containing silicon as a main component and the Low-MOS clip CLP(L) is formed by copper. Moreover, the buffer material BUF is formed by a rubber material, such as a polyurethane rubber, a silicon rubber (silicone rubber), and a nitrile rubber, for example, and the support member SU is formed by stainless, for example.

Accordingly, for example, when the moduli of longitudinal elasticity of copper and the rubber material are compared, the modulus of longitudinal elasticity of the rubber material is extremely small as compared with the modulus of longitudinal elasticity of copper, and the rubber material is found to be extremely soft.

Thus, because the rubber material is the softest, it sufficiently functions as the buffer material BUF when the Low-MOS chip CHP(L) is supported by the support member SU. As a result, even if the upper surface side of the lead frame LF1 is supported by the support member SU, the damage to the Low-MOS chip CHP(L) can be further reduced to a level having no problem than in the first embodiment including only the Low-MOS clip CLP(L) formed by copper.

In particular, the rubber material used as the buffer material BUF in the Modification 2 is extremely soft. Therefore, even if there is a variation in the height of the upper surface of the Low-MOS clip CLP(L) mounted over the Low-MOS chip CHP(L) via the high melting point solder HS2, the Low-MOS chip CHP(L) being mounted over the chip mounting portion TAB(L) via the high melting point solder HS1, the buffer material BUF can absorb this height variation and suppress an increase of the pressing force that is applied to the Low-MOS chip CHP(L) more than necessary. For example, consider a case where the height of the Low-MOS clip CLP(L) becomes higher than an average height due to manufacturing variations of the chip mounting portion TAB(C), the high melting point solder HS1, the Low-MOS chip CHP(L), the high melting point solder HS2, and/or the Low-MOS clip CLP(L). In this case, for example, when the upper surface of the Low-MOS clip CLP(L) is supported by the support member SU formed by stainless, a pressing force applied to the Low-MOS chip CHP(L) may increase more than necessary. In contrast, in supporting by the support member SU with the buffer material BUF interposed over the Low-MOS clip CLP(L), because height variations can be absorbed by the soft buffer material BUF, an unnecessary increase of the pressing force applied to the Low-MOS chip CHP(L) can be suppressed.

Second Embodiment

In a present second embodiment, a technical idea is described for manufacturing a semiconductor device using a clip frame having therein a plurality of unit regions arranged in a matrix, each unit region having the High-MOS clip and the Low-MOS clip formed therein.

Packaging Configuration of Semiconductor Device in Second Embodiment

The packaging configuration of a semiconductor device PK2 in the present second embodiment is substantially the same as that of the semiconductor device PK1 in the above-described first embodiment.

Figure 32:
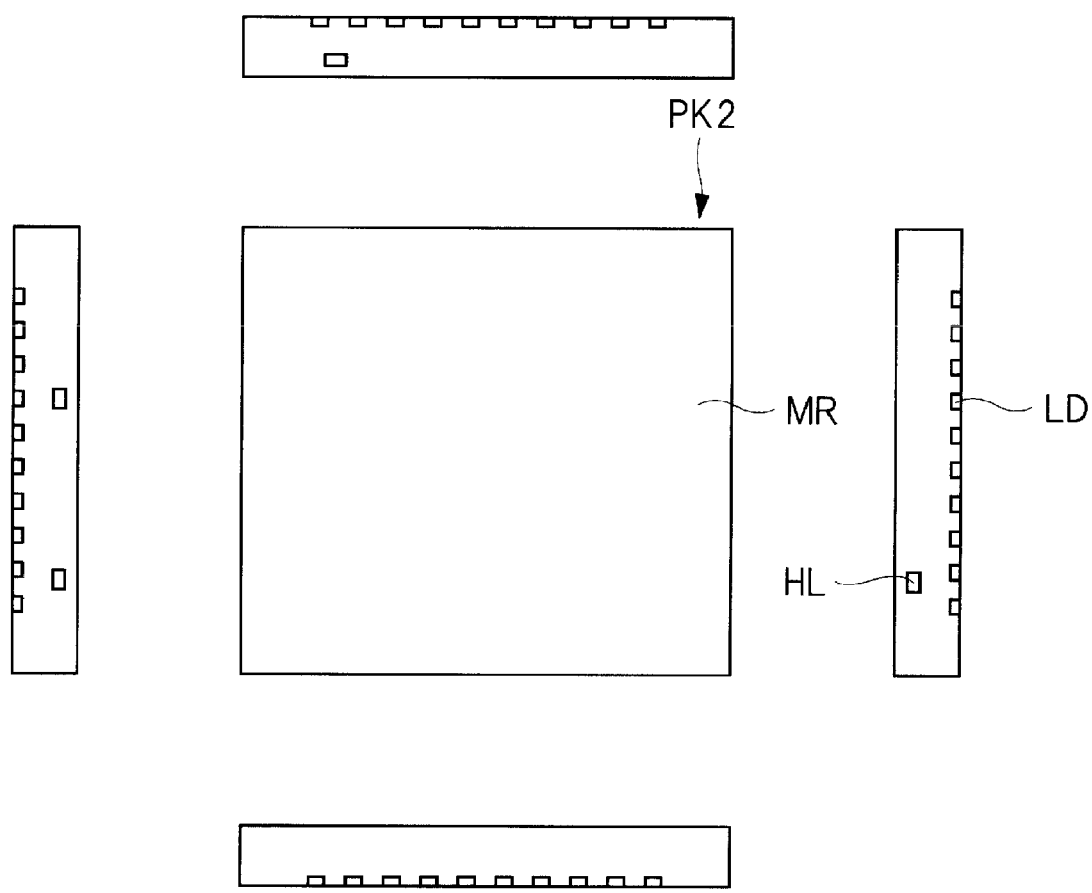
FIG. 32 is a view showing a packaging configuration of a semiconductor device in a second embodiment.

FIG. 32 is a view showing the packaging configuration of the semiconductor device PK2 in the present second embodiment. In FIG. 32, a drawing shown in the center is a plan view of the semiconductor device PK2 seen from the upper surface, and on each of all sides thereof is shown a side view. As shown in FIG. 32, the semiconductor device PK2 in the present second embodiment is covered with the resin MR having a rectangular shape. Then, as can be seen from the side views, the lead LD is exposed from the resin MR to the side surface of the semiconductor device PK2. Furthermore, in the present second embodiment, the cross-section of a suspension lead HL is exposed from the side surface of the semiconductor device PK2. This is a difference between the semiconductor device PK2 in the present second embodiment and the semiconductor device PK1 in the above-described first embodiment.

Figure 33:
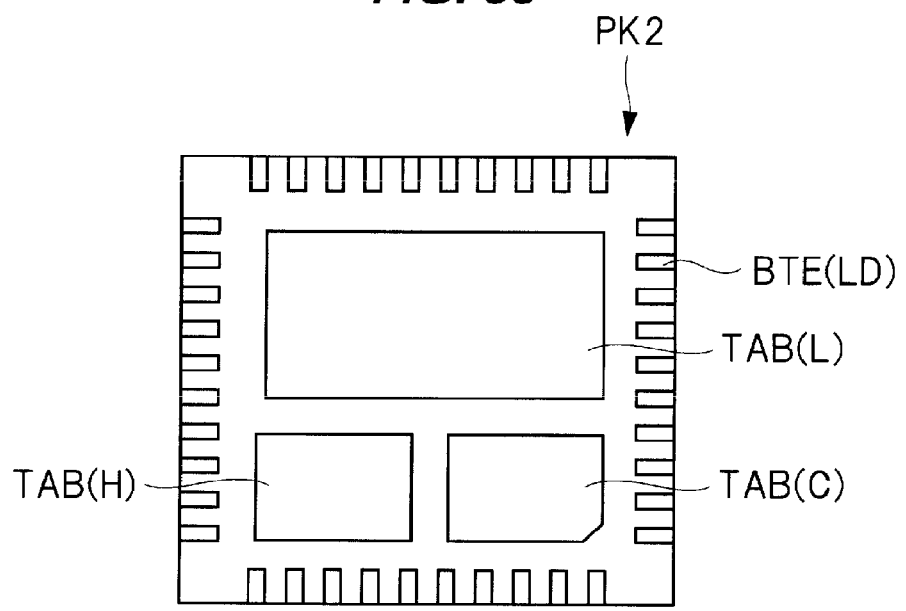
FIG. 33 is a plan view seen from a lower surface (rear surface) of the semiconductor device in the second embodiment.

Next, FIG. 33 is a plan view of the semiconductor device PK2 in the present second embodiment seen from a lower surface (rear surface). As shown in FIG. 33, also in the semiconductor device PK2 in the present second embodiment, the rear surface of the semiconductor device PK2 is covered with the resin MR whereas the chip mounting portion TAB(L), the chip mounting portion TAB(H), and the chip mounting portion TAB(C) are exposed from the resin MR. Because the chip mounting portion TAB(L), the chip mounting portion TAB(H), and the chip mounting portion TAB(C) are exposed from the rear surface of the semiconductor device PK2 in this manner, the heat radiation efficiency of the semiconductor device PK2 can be improved. Moreover, the plurality of rear surface terminals BTE is exposed to an outer peripheral region (outer peripheral portion) of the semiconductor device PK2 having a rectangular shape. This rear surface terminal BTE constitutes a part of the lead LD.

Figure 34:
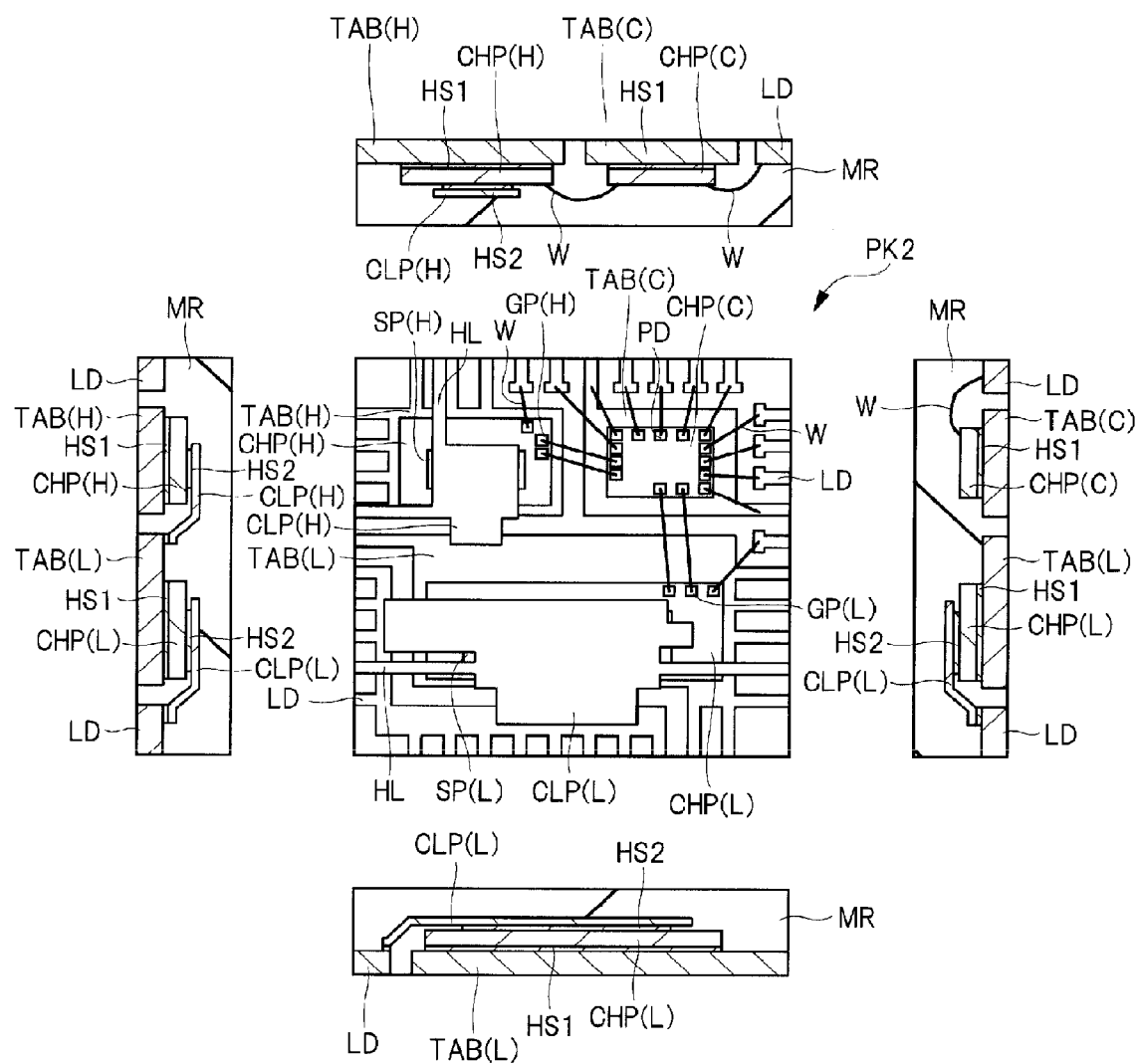
FIG. 34 is a view showing the internal configuration of the semiconductor device in the second embodiment.

Subsequently, the internal configuration of the semiconductor device PK2 is described. FIG. 34 is a view showing the internal configuration of the semiconductor device PK2 in the present second embodiment. In FIG. 34, a drawing shown in the center is a plan view of the inside of the semiconductor device PK2 seen through the resin MR from the upper surface side, and on each of all sides thereof is shown a cross-sectional view.

Here, because the internal configuration of the semiconductor device PK2 in the present second embodiment shown in FIG. 34 and the internal configuration of the semiconductor device PK1 in the above-described first embodiment shown in FIG. 4 have substantially the same configuration, the description of the same configuration is omitted and differences are described. In FIG. 34, the present second embodiment is characterized in that the suspension lead HL is formed integrally with the High-MOS clip CLP(H) and this suspension lead HL reaches an outer edge portion of the sealing body formed by the resin MR. Similarly, the suspension lead HL is integrally formed also in the Low-MOS clip CLP(L), and this suspension lead HL reaches an outer edge portion of the sealing body formed by the resin MR. The other configuration is the same as that of the above-described first embodiment.

Method of Manufacturing Semiconductor Device in Second Embodiment

The semiconductor device PK2 in the present second embodiment is configured as described above, and hereinafter the method of manufacturing the same is described with reference to the accompanying drawings.

Figure 35:
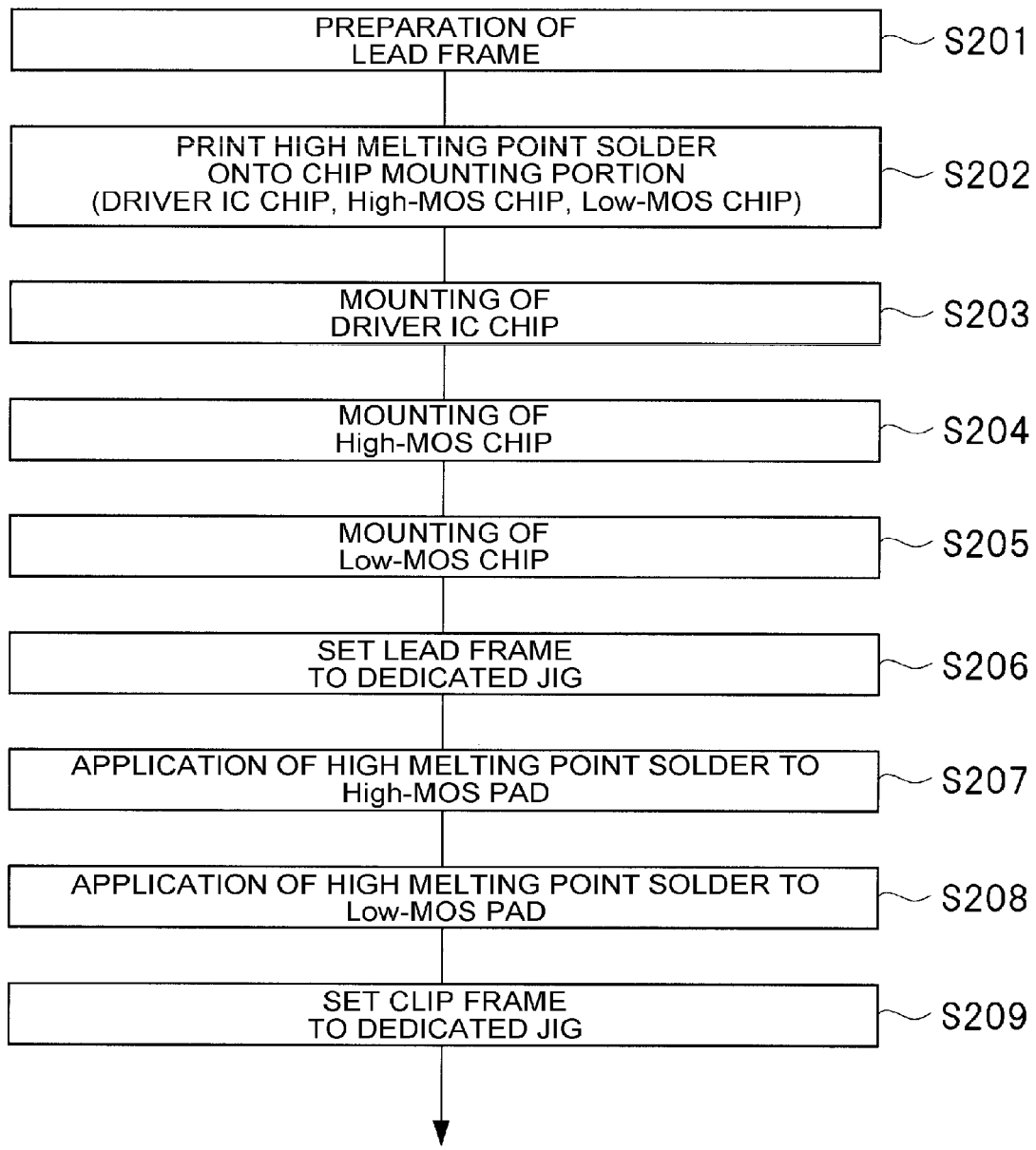
FIG. 35 is a flowchart showing a semiconductor device manufacturing flow in the second embodiment.
Figure 36:
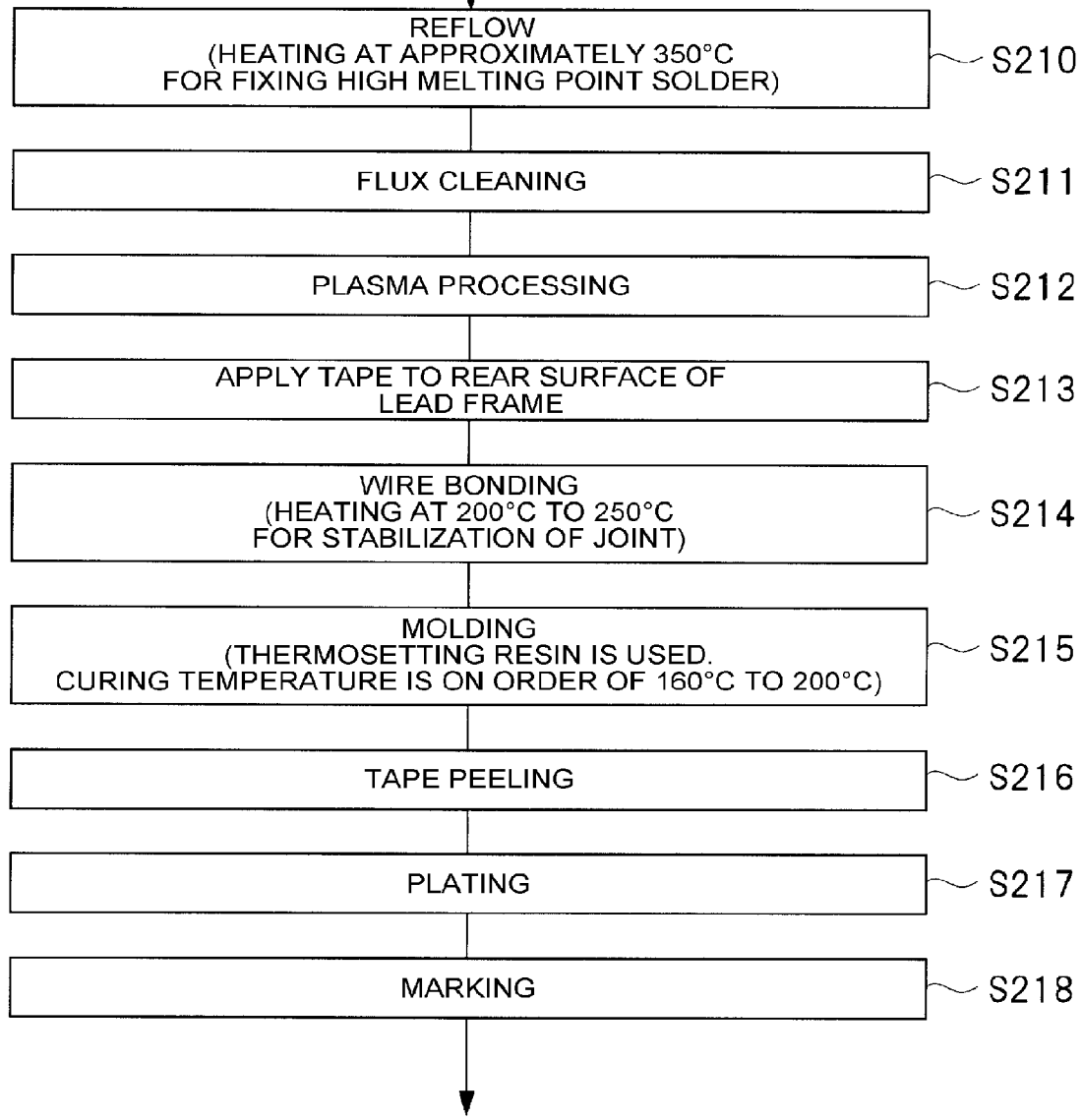
FIG. 36 is a flowchart showing the semiconductor device manufacturing flow in the second embodiment.
Figure 37:
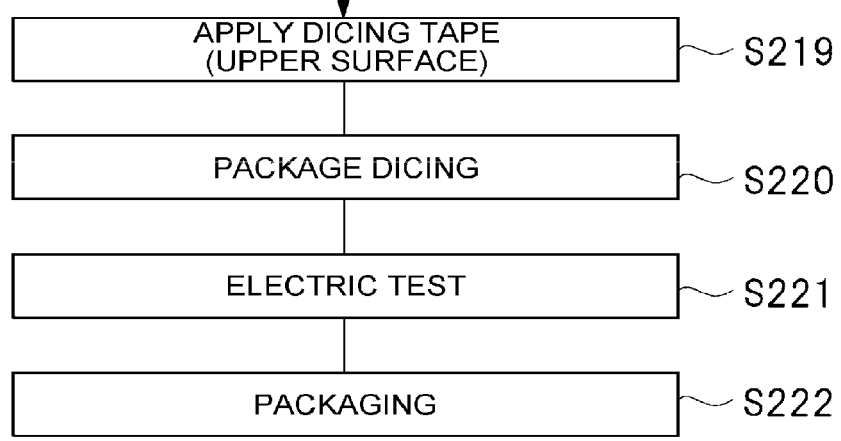
FIG. 37 is a flowchart showing the semiconductor device manufacturing flow in the second embodiment.

FIG. 35 to FIG. 37 show a flowchart showing manufacturing flow of the semiconductor device PK2 in the present second embodiment. Moreover, FIG. 38A to FIG. 41B are views each showing a manufacturing process of the semiconductor device PK2 in the present second embodiment.

First, the lead frame LF1 is prepared (S201 of FIG. 35). This lead frame LF1 has, for example, the same configuration as that of the lead frame LF1 used in the above-described first embodiment shown in FIG. 14A to FIG. 14C. For example, as shown in FIG. 14C, in the lead frame LF1 in the present second embodiment, a plurality of product regions PR is arranged in a matrix, each product region PR including the chip mounting portion TAB(C), the chip mounting portion TAB(H), the chip mounting portion TAB(L), and the lead LD.

Figure 38A:
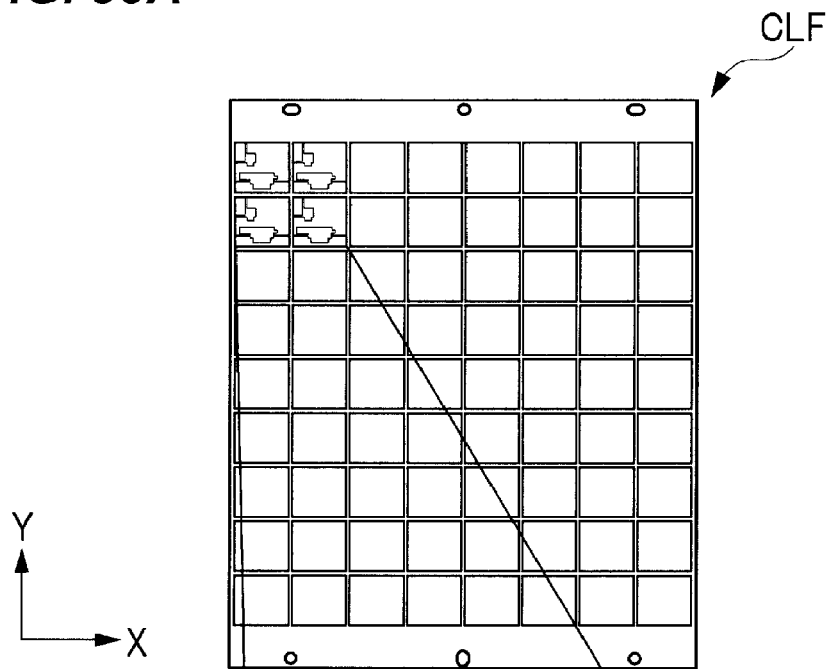
FIG. 38A is a view showing a schematic entire configuration of a clip frame.
Figure 38B:
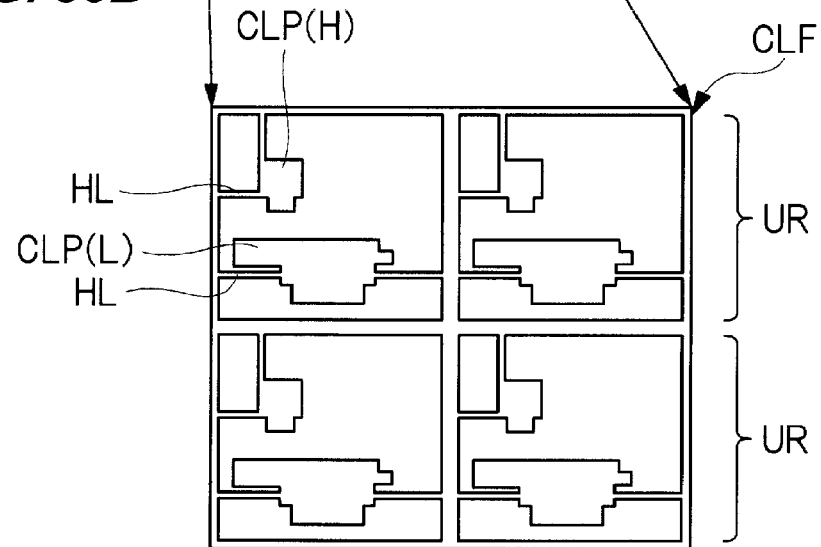
FIG. 38B is an enlarged view showing a part of the clip frame.

Furthermore, in the present second embodiment, a clip frame CLF as shown in FIGS. 38A and 38B is prepared. The present second embodiment is characterized in that this clip frame CLF is used. In FIG. 38A, a schematic entire configuration of the clip frame CLF is shown, while in FIG.

38B, a part of the clip frame CLF is enlarged and shown. As shown in FIG. 38B, in the clip frame CLF, a plurality of unit regions UR each including the High-MOS clip CLP(H) and the Low-MOS clip CLP(L) is included, and the unit regions UR are arranged in a matrix. Here, the High-MOS clip CLP(H) and the Low-MOS clip CLP(L) are constituted, for example, by a metal plate containing copper as a material component.

Hereinafter, the detailed configuration of the clip frame CLF shown in FIG. 38A and FIG. 38B is described. For example, as shown in FIG. 38B, in each of the unit regions UR arranged in a matrix, the High-MOS clip CLP(H) and the Low-MOS clip CLP(L) are formed, and both the High-MOS clip CLP(H) and the Low-MOS clip CLP(L) are coupled to a frame body of the clip frame CLF by the suspension lead HL. Accordingly, in the entire clip frame CLF, a plurality of High-MOS clips CLP(H) and a plurality of Low-MOS clips CLP(L) will be integrally formed.

In the clip frame CLF in the present second embodiment, as shown in FIG. 38A and FIG. 38B, the unit regions UR are arranged so as to align in the X direction and in the Y direction. That is, in the clip frame CLF in the present second embodiment, the unit regions UR are formed in a matrix along the X direction and along the Y direction. For example, in the clip frame CLF of the present second embodiment, the unit regions UR are arranged at a first predetermined interval (first pitch) in the X direction, and also arranged at a second predetermined interval (second pitch) in the Y direction.

Now, attention is focused on the lead frame LF1 shown in FIG. 14A to FIG. 14C. For example, as shown in FIG. 14C, the product regions PR formed in the lead frame LF1 are arranged so as to align in the X direction and in the Y direction. That is, in the lead frame LF1 shown in FIG. 14A to FIG. 14C, the product regions PR are formed in a matrix along the X direction and along the Y direction. For example, in the lead frame LF1, the product regions PR are arranged at a first predetermined interval (first pitch) in the X direction, and also arranged at a second predetermined interval (second pitch) in the Y direction.

That is, in the present second embodiment, the arrangement pitch in the X direction of the product regions PR formed in the lead frame LF1 and the arrangement pitch in the X direction of the unit regions UR formed in the clip frame CLF are the same. Moreover, the arrangement pitch in the Y direction of the product regions PR formed in the lead frame LF1 and the arrangement pitch in the Y direction of the unit regions UR formed in the clip frame CLF are the same.

Here, the arrangement pitch in the X direction (a first direction) of a plurality of High-MOS clips CLP(H) or Low-MOS clips CLP(L) formed in the clip frame CLF and the arrangement pitch in the Y direction (a second direction) perpendicular to the X direction are referred to as a first pitch and a second pitch, respectively.

In this case, the arrangement pitch in the X direction and the arrangement pitch in the Y direction of the chip mounting portion (the chip mounting portion TAB(C), the chip mounting portion TAB(H), and the chip mounting portion TAB(L)) formed in the lead frame LF1 are also the first pitch and the second pitch, respectively.

As a result, in the present second embodiment, each of the product regions PR formed in the lead frame LF1 and each of the unit regions UR formed in the clip frame CLF can be arranged so as to overlap with each other in a plan view. More particularly, for example, the chip mounting portion TAB(H) shown in FIG. 14C and the High-MOS clip CLP(H) shown in FIG. 38B can be arranged so as to overlap with each other in a planar manner, and the chip mounting portion TAB(L) shown in FIG. 14C and the Low-MOS clip CLP(L) shown in FIG. 38B can be arranged so as to overlap with each other in a planar manner.

Next, in each of the product regions PR formed in the lead frame LF1, a high melting point solder is formed over the chip mounting portion TAB(C), the chip mounting portion TAB(H), and the chip mounting portion TAB(L) (S202 of FIG. 35). Specifically, for example, using a solder printing method, the high melting point solder is printed over the chip mounting portion TAB(C), the chip mounting portion TAB(H), and the chip mounting portion TAB(L).

Subsequently, in each of the product regions PR formed in the lead frame LF1, first the driver IC chip CHP(C) is mounted over the chip mounting portion TAB(C) (S203 of FIG. 35). Then, the High-MOS chip CHP(H) is mounted over the chip mounting portion TAB(H) (S204 of FIG. 35), and thereafter the Low-MOS chip CHP(L) is mounted over the chip mounting portion TAB(L) (S205 of FIG. 35). Note that, the mounting order of the driver IC chip CHP(C), the High-MOS chip CHP(H), and the Low-MOS chip CHP(L) is not limited thereto but may be changed as required.

Thereafter, the lead frame LF1 is set to a positioning dedicated-jig (S206 of FIG. 35). Specifically, as shown in FIG. 39, the lead frame LF1 is positioned by inserting an opening OP1 formed in the lead frame LF1 into a protruding pin, for example, of the dedicated jig.

Figure 39:
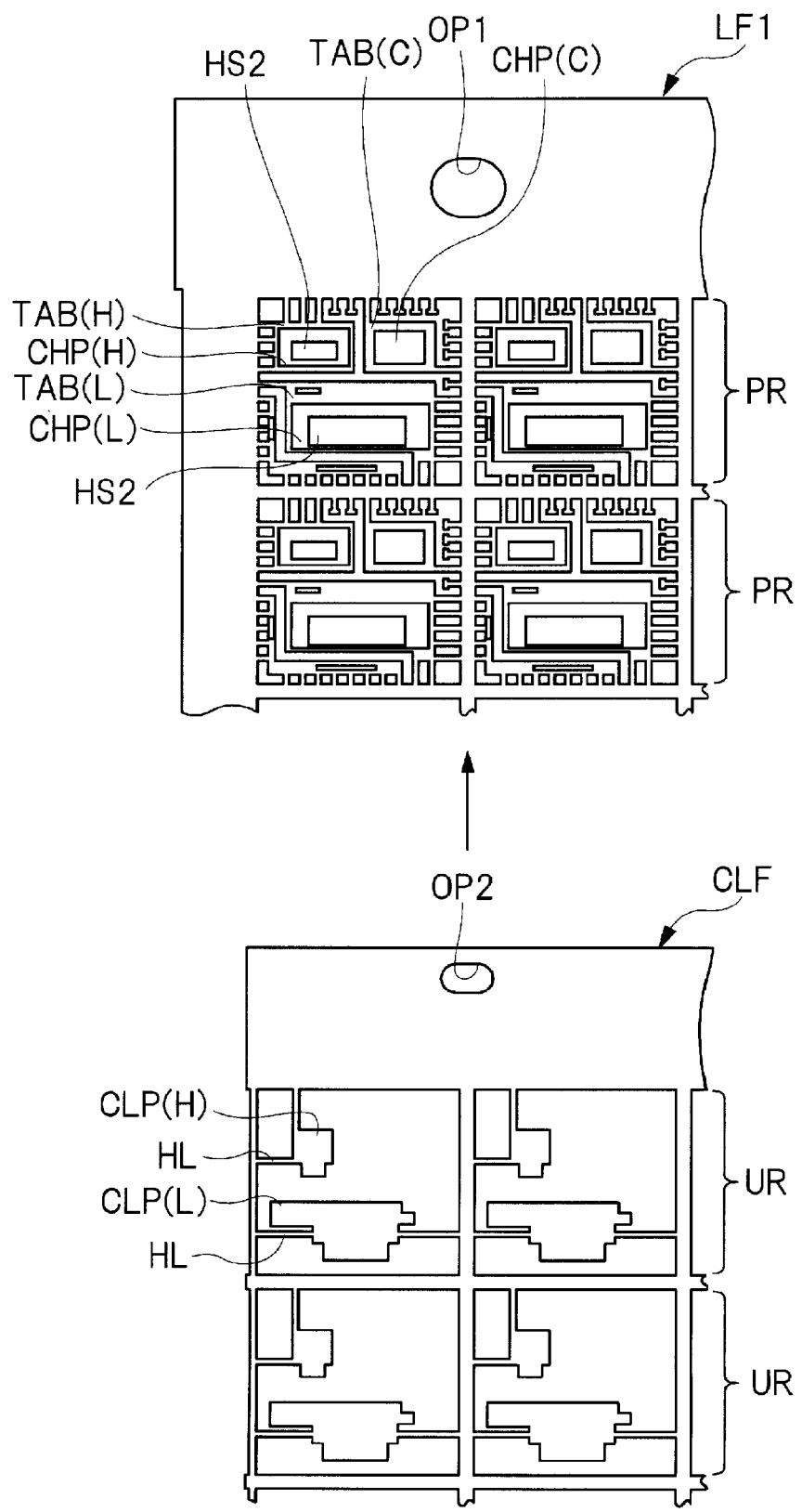
FIG. 39 is a plan view showing a manufacturing process of the semiconductor device in the second embodiment.

Next, as shown in FIG. 39, in each of the product regions PR formed in the lead frame LF1, the high melting point solder HS2 is formed over the High-MOS chip CHP(H) (S207 of FIG. 35). Thereafter, the high melting point solder HS2 is formed over the Low-MOS chip CHP(L) (S208 of FIG. 35). Specifically, the high melting point solder HS2 is formed over the source electrode pad (High-MOS pad) (not shown) formed in the High-MOS chip CHP(H), and the high melting point solder HS2 is formed over the source electrode pad (Low-MOS pad) (not shown) formed in the Low-MOS chip CHP(L). Furthermore, as shown in FIG. 39, the high melting point solder HS2 is formed also over a partial region of the chip mounting portion TAB(L) and over a partial region of the lead.

Specifically, for example, using a coating method, the high melting point solder HS2 is also applied over the High-MOS chip CHP(H), over the Low-MOS chip CHP(L), over a partial region of the chip mounting portion TAB(L), and over a partial region of the lead. The high melting point solder HS2 formed at this time may have the same material component as the above-described high melting point solder HS1 or may have a different material component.

Thereafter, as shown in FIG. 39, the clip frame CLF is set to the positioning dedicated jig (S209 of FIG. 35). Specifically, as shown in FIG. 39, an opening OP2 formed in the clip frame CLF is further inserted into the protruding pin, which has been inserted into the opening OP1 formed in the lead frame LF1. Thus, according to the present second embodiment, the clip frame CLF can be arranged over the lead frame LF1 so as to overlap with each other. The present second embodiment is characterized in this point. That is, as described above, by inserting the opening OP1 formed in the lead frame LF1 and the opening OP2 formed in the clip frame CLF into the protruding pin provided in the dedicated jig, it is possible to overlap each of the product regions PR formed in the lead frame LF1 and each of the unit regions UR formed in the clip frame CLF with each other in a planar manner.

That is, in the present second embodiment, the arrangement pitch in the X direction of the product regions PR formed in the lead frame LF1 and the arrangement pitch in the X direction of the unit regions UR formed in the clip frame CLF are the same. Moreover, the arrangement pitch in the Y direction of the product regions PR formed in the lead frame LF1 and the arrangement pitch in the Y direction of the unit regions UR formed in the clip frame CLF are the same.

As a result, in the present second embodiment, each of the product regions PR formed in the lead frame LF1 and each of the unit regions UR formed in the clip frame CLF can be arranged so as to overlap with each other in a plan view. More particularly, for example, the High-MOS chip CHP(H) shown in FIG. 39 and the High-MOS clip. CLP(H) shown in FIG. 39 can be arranged so as to overlap with each other in a planar manner, and the Low-MOS chip CHP(L) shown in FIG. 39 and the Low-MOS clip CLP(L) shown in FIG. 39 can be arranged so as to overlap with each other in a planar manner.

Thus, according to the present second embodiment, simply by overlapping the lead frame LF1 with the clip frame CLF, it is possible to overlap each of the product regions PR and each of the unit regions UR with each other in a planar manner. This means that the High-MOS clip CLP(H) formed in each of the unit regions UR can be mounted over the High-MOS chip CHP(H) formed in each of the product regions PR, at once. Similarly, this means that the Low-MOS clip CLP(L) formed in each of the unit regions UR can be mounted over the Low-MOS chip CHP(L) formed in each of the product regions PR, at once. As a result, according to the present second embodiment, the manufacturing process can be simplified and thus the manufacturing cost of the semiconductor device PK2 can be reduced.

In this manner, the source electrode pad formed in the High-MOS chip CHP(H) and the chip mounting portion TAB(L) will be electrically coupled to each other by the High-MOS clip CLP(H). Moreover, the source electrode pad formed in the Low-MOS chip CHP(L) and the lead, to which the reference potential is supplied, will be electrically coupled to each other by the Low-MOS clip CLP(L).

Subsequently, a reflow is carried out with respect to the high melting point solder (e.g., high melting point solder HS2) (S210 of FIG. 36). Specifically, the lead frame LF1 including the high melting point solder is heated at a temperature (a first temperature) of approximately 350° C., for example. In this manner, the high melting point solder can be melted.

Then, in the present second embodiment, a heat treatment (reflow) for melting the high melting point solder is carried out in a state where a tape is not applied to the rear surface of the lead frame LF1 that is prepared in advance. Accordingly, in the case of the present second embodiment, even if the reflow temperature of the high melting point solder is higher than the heat-resisting temperature of the tape, the heat resistance of the tape will not pose a problem because the tape is originally not applied to the rear surface of the lead frame LF1. That is, according to the present second embodiment, because the heat treatment (reflow) of the high melting point solder is carried out before the tape is applied to the rear surface of the lead frame LF1, the heat resistance of the tape can be secured regardless of the temperature of the heat treatment (reflow).

Thereafter, flux cleaning is carried out in order to remove the flux contained in the high melting point solder (S211 of FIG. 36). Then, from a viewpoint of improving the bonding characteristics of a wire in the wire bonding step carried out in a subsequent step, the upper surface of the lead frame LF1 is cleaned by carrying out plasma processing with respect to the upper surface of the lead frame LF1 (S212 of FIG. 36).

Figure 40A:
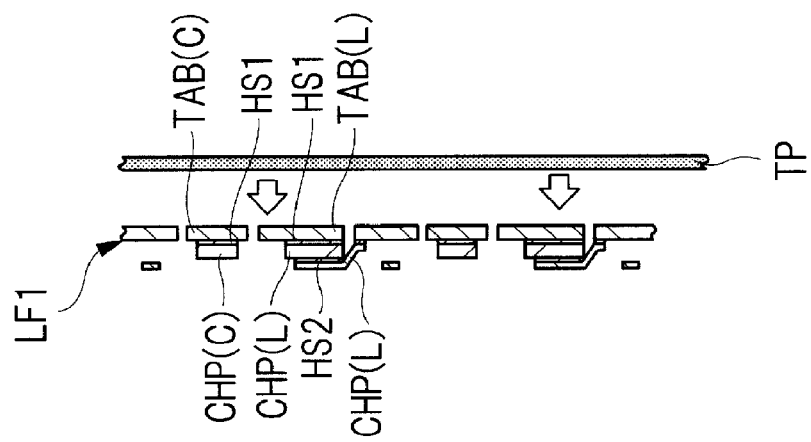
FIGS. 40A and 40B show the manufacturing process of the semiconductor device following FIG. 39, FIG. 40A being a plan view showing the process and FIG. 40B being a cross-sectional view showing the process.
Figure 40B:
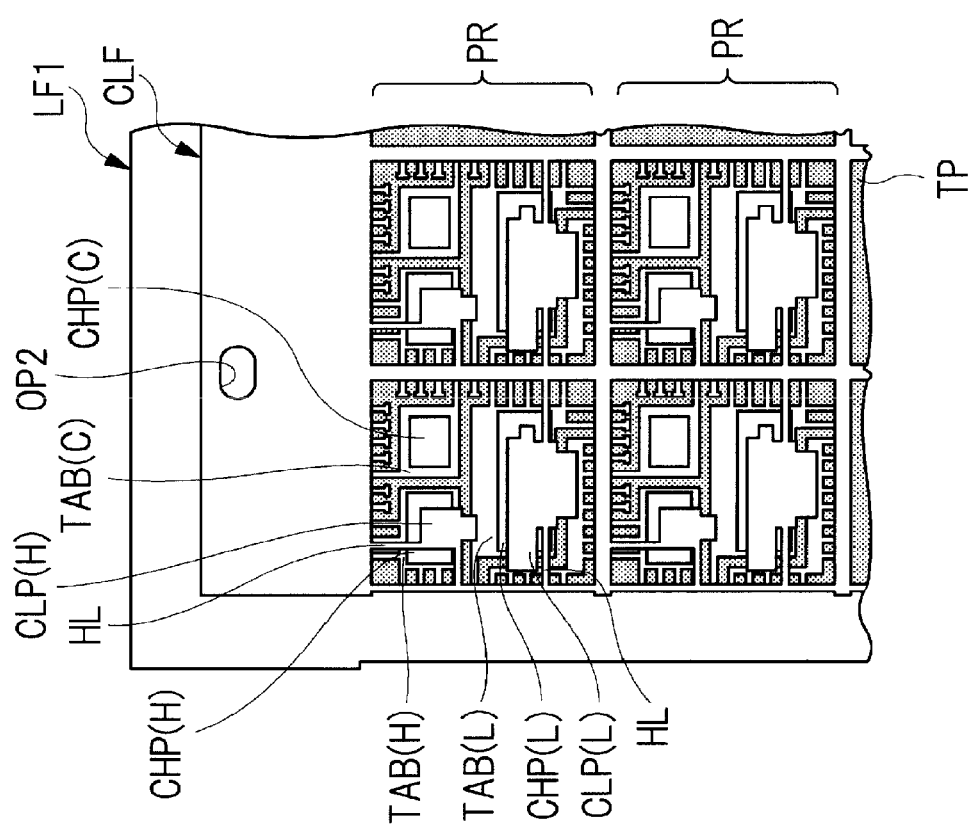

Next, as shown in FIG. 40A and FIG. 40B, the tape TP is applied to the rear surface of the lead frame LF1 (S213 of FIG. 36). That is, among the faces of the lead frame LF1, the tape TP is applied to a face opposite to a face, on which the driver IC chip CHP(C), the High-MOS chip CHP(H), and the Low-MOS chip CHP(L) are mounted. At this time, as described above, the heat treatment (reflow) at approximately 350° C. with respect to the high melting point solder is already completed in a step prior to the step of applying the tape TP, and therefore in the present second embodiment the heat resistance of the tape TP will not appear as a problem.

That is, the reflow temperature of the above-described high melting point solder is, for example, approximately 350° C., and exceeds the heat-resisting temperature (e.g., approximately 250° C.) of the tape TP. Therefore, if the heat treatment for melting the high melting point solder is carried out in the state where the tape TP is applied to the rear surface of the lead frame LF, the tape TP will not be able to withstand the heat treatment. Regarding this point, in the present second embodiment, in a step prior to the step of applying the tape TP, the heat treatment (reflow) at approximately 350° C. with respect to the high melting point solder is already complete. For this reason, in the present second embodiment, the heat resistance of the tape TP will not appear as a problem.

Figure 41A:
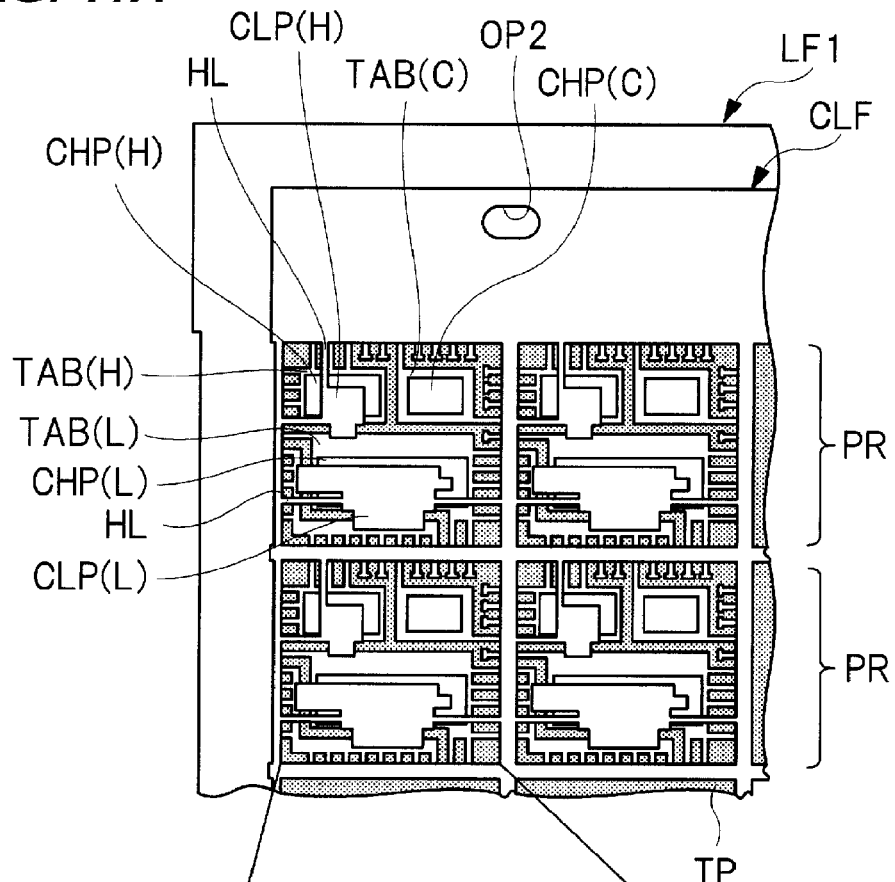
FIGS. 41A and 41B show the manufacturing process of the semiconductor device following FIGS. 40A and 40B, FIG. 41A being a plan view showing the process and FIG. 41B being an enlarged view showing a partial region of FIG. 41A.
Figure 41B:
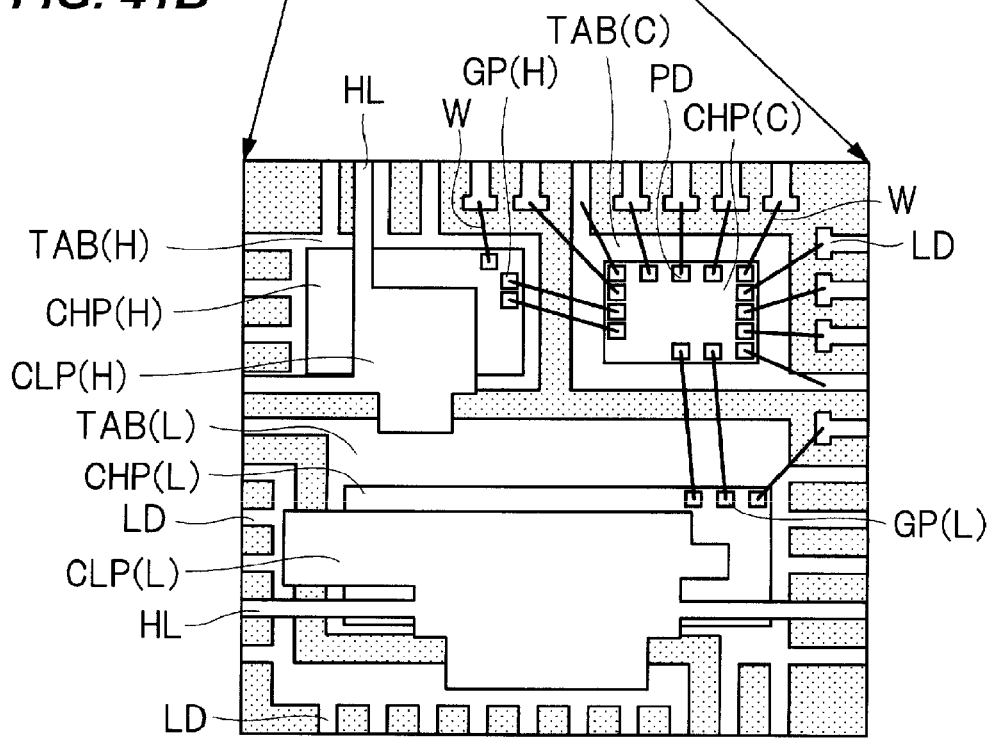

Subsequently, as shown in FIG. 41A and FIG. 41B, a wire bonding step is carried out (S214 of FIG. 36). FIG. 41A is a view showing the lead frame LF1 in carrying out the wire bonding step after applying the tape TP to the rear surface of the lead frame LF1. However, in FIG. 41A, a component (wire) required for carrying out the actual wire bonding step is omitted, and this component (wire) is shown in FIG. 41B that is an enlarged view of one product region PR shown in FIG. 41A.

In FIG. 41B, a plurality of electrode pads PD formed in the driver IC chip CHP(C) and a plurality of leads LD are coupled to each other by a plurality of wires W. Furthermore, as shown in FIG. 41B, the gate electrode pad GP(H) formed in the High-MOS chip CHP(H) and the electrode pad PD formed in the driver IC chip CHP(C) are coupled to each other by the wire W. Similarly, the gate electrode pad GP(L) formed in the Low-MOS chip CHP(L) and the electrode pad PD formed in the driver IC chip CHP(C) are coupled to each other by the wire W. Thus, according to the present second embodiment, the High-MOS transistor QH (see FIG. 1) formed in the High-MOS chip CHP(H) and the Low-MOS transistor QL (see FIG. 1) formed in the Low-MOS chip CHP(L) are electrically controlled by the control circuit CC (see FIG. 1) formed in the driver IC chip CHP(C).

Here, according to the present second embodiment, the tape TP is applied to the rear surface of the lead frame LF1 in a step prior to carrying out the wire bonding step. Therefore, according to the present second embodiment, the lead frame LF1 having the tape TP applied thereto can be easily vacuum-sucked. As a result, even with the lead frame LF1 corresponding to the MAP molding technique, it is possible to carry out the wire bonding step while reliably fixing the lead frame LF1 by vacuum suction. As a result, according to the present second embodiment, the reliability in the wire bonding step can be improved.

Note that, the wire bonding step is carried out in the state where the lead frame LF1 is heated to approximately 200° C. to approximately 250° C., for stabilization of the joint of the wire W. However, because the heat-resisting temperature of the tape TP applied to the rear surface of the lead frame LF1 is approximately 250° C., the heat treatment applied in the wire bonding step may not cause a problem in the heat resistance of the tape TP.

Next, the product regions formed in the lead frame LF1 are collectively sealed (molded) with the resin (S215 of FIG. 36). In other words, a sealing body is formed by collectively sealing the product regions PR in the lead frame LF1 with the resin MR so as to cover the driver IC chip CHP(C), the High-MOS chip CHP(H), and the Low-MOS chip CHP(L) shown in FIG. 41B. That is, in the present second embodiment, what is employed as a technique for sealing a semiconductor chip with resin is the so-called MAP molding technique, in which the product regions PR are included in a cavity and the product regions PR are collectively sealed with resin. According to this MAP molding technique, because there is no need to provide a path for injecting resin for each product region PR, the product regions PR can be densely arranged. Thus, according to the MAP molding technique, the acquisition number of products can be increased and thereby a cost reduction of the product can be achieved.

Then, in the present second embodiment, in a step prior to the resin sealing step (molding step) by the MAP molding technique, the adhesive tape TP is applied to the rear surface of the lead frame LF1. Therefore, according to the present second embodiment, the tape TP can be reliably applied to the rear surface terminal (lead) formed on the rear surface of the lead frame LF1. As a result, also in the resin sealing step employing the MAP molding technique, a gap is not formed between the rear surface terminal and the tape TP and thus the resin leakage (resin burr) into the rear surface of the rear surface terminal can be sufficiently suppressed.

Note that, as the resin used in the resin sealing step, a thermosetting resin is used, for example. Therefore, the resin sealing step is carried out in a state of being heated to approximately 160° C. to approximately 200° C., in order to cure the thermosetting resin. However, because the heat-resisting temperature of the tape TP applied to the rear surface of the lead frame LF1 is approximately 250° C., the heat treatment applied in the resin sealing step may not cause a problem in the heat resistance of the tape TP.

Thereafter, the tape TP applied to the rear surface of the lead frame LF1 is peeled off from the lead frame LF1 (S216 of FIG. 36). Then, a plating film is formed on the surface of the chip mounting portion TAB(C), the chip mounting portion TAB(H), the chip mounting portion TAB(L), and the rear surface terminal BTE which are exposed from the rear surface of the resin MR (sealing body) (see FIG. 33) (S217 of FIG. 36). Furthermore, a mark is formed on the surface of the sealing body formed by the resin MR (marking step) (S218 of FIG. 36).

Subsequently, a dicing tape is applied to the upper surface of the sealing body formed by the resin (S219 of FIG. 37). Then, the sealing body formed by the resin is cut for each product region (package dicing) (S220 of FIG. 37). Specifically, a partition region (boundary region) partitioning the product regions PR formed in the lead frame LF1 is cut with a dicing blade and thereby each product region is singulated. Thus, for example, the semiconductor device PK2 in the present second embodiment as shown in FIG. 32 and FIG. 33 can be acquired. At this time, the suspension lead HL formed in the clip frame CLF is cut off together with the resin MR. As a result, for example, as shown in FIG. 32, the cross-section of the suspension lead HL is exposed from the side surface of the semiconductor device PK2, and the side surface of the semiconductor device PK2 and the cross-section of the suspension lead HL lie in the same plane.

Thereafter, the singulated individual semiconductor device PK2 is sorted by an electric test (S221 of FIG. 37), and the semiconductor device PK2 determined to be non-defective is packaged and shipped (S222 of FIG. 37). In this manner, the semiconductor device in the present second embodiment can be manufactured.

Characteristics of Second Embodiment

Next, the features in the present second embodiment are described with reference to the accompanying drawings. The present second embodiment is characterized in the method of fixing the lead frame LF1 in applying the tape TP to the rear surface of the lead frame LF1. In particular, the technical idea in the present second embodiment is to apply a tape to the rear surface of a lead frame in the state where the upper surface side of the lead frame is supported, while reducing the damage to a semiconductor chip. Hereinafter, the technical idea in the present second embodiment is specifically described.

Figure 42A:
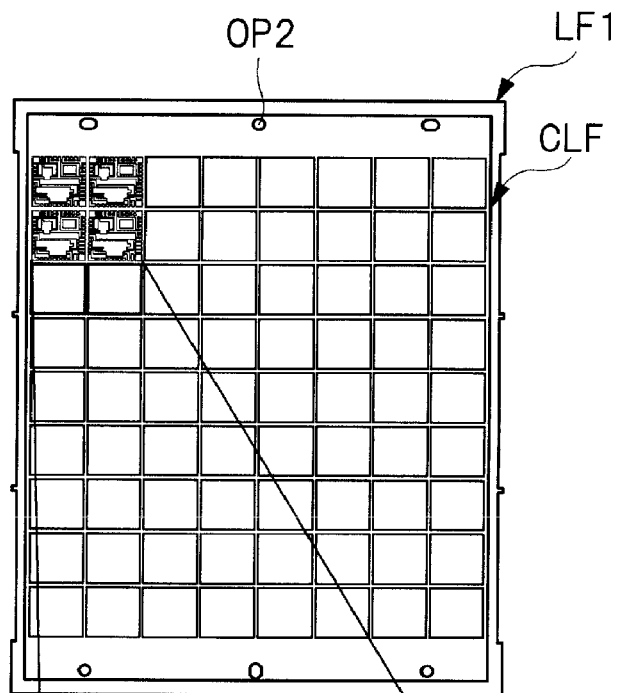
FIG. 42A is a view showing the configuration of a lead frame immediately before applying a tape to the rear surface of the lead frame.
Figure 42B:
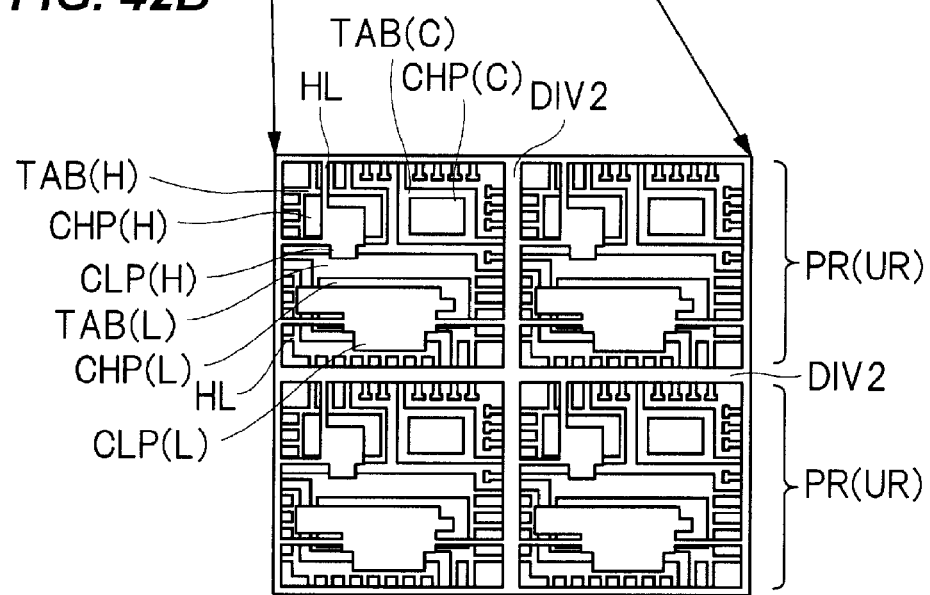
FIG. 42B is an enlarged view showing a part of FIG. 42A.

FIG. 42A is a view showing the configuration of the lead frame LF1 immediately before applying the tape TP to the rear surface of the lead frame LF1, and FIG. 42B is an enlarged view showing a part of FIG. 42A. As shown in FIG. 42B, in the lead frame LF1 in the present second embodiment, the product regions PR are arranged in a matrix, and each of the product regions PR is partitioned by the partition region (boundary region). Now, attention is focused on each of the product regions PR. The chip mounting portion TAB(C), the chip mounting portion TAB(H), and the chip mounting portion TAB(L) are arranged in each of the product regions PR and the driver IC chip CHP(C) is mounted over the chip mounting portion TAB(C). Moreover, the High-MOS chip CHP(H) is mounted over the chip mounting portion TAB(H), and the Low-MOS chip CHP(L) is mounted over the chip mounting portion TAB(L). Furthermore, in the present second embodiment, the clip frame CLF is mounted so as to overlap with the lead frame LF1 in a planar manner. In this clip frame CLF, the unit regions UR are arranged in a matrix, and each of the unit regions UR is partitioned by a partition region (boundary region) DIV2. Now, attention is focused on each of the unit regions UR. The High-MOS clip CLP(H) and the Low-MOS clip CLP(L) are arranged in each of the unit regions UR. Thus, in the present second embodiment, the High-MOS clip CLP(H) is arranged so as to span from over the High-MOS chip CHP(H) to over the chip mounting portion TAB(L), and the Low-MOS clip CLP(L) is arranged so as to span from over the Low-MOS chip CHP(L) to over the lead. Then, the High-MOS clip CLP(H) and the Low-MOS clip CLP(L) are coupled to the partition region DIV2 of the clip frame CLF by the suspension lead HL.

Figure 43A:
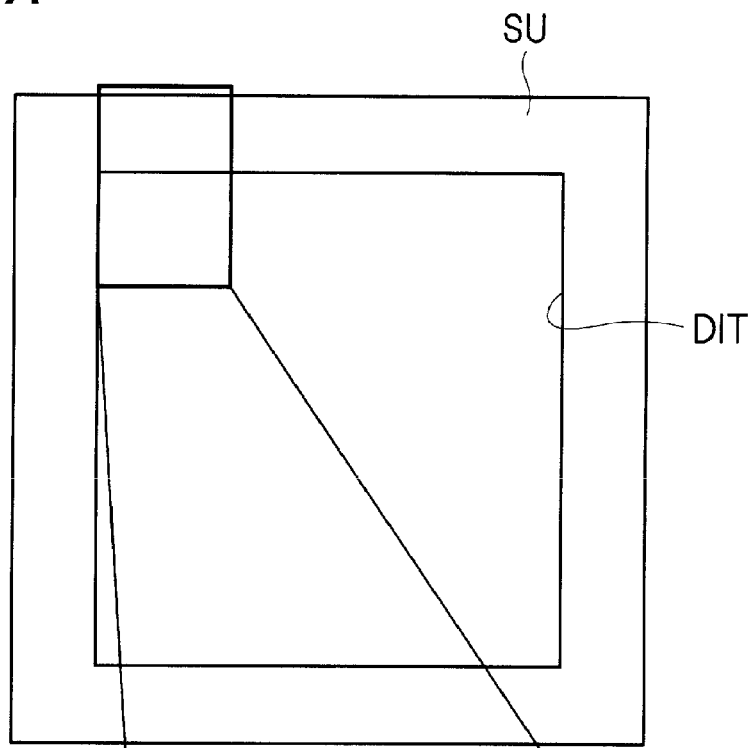
FIG. 43A is a plan view showing a schematic entire configuration of a support member used in the second embodiment.
Figure 43B:
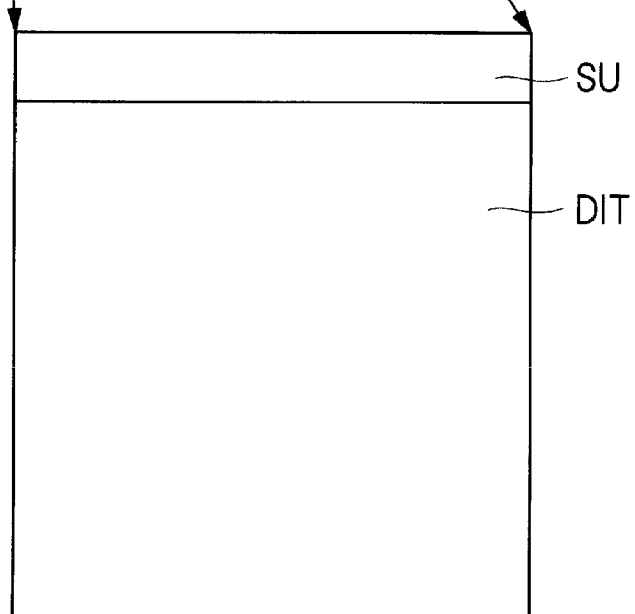
FIG. 43B is an enlarged view showing a part of FIG. 43A.

FIG. 43A is a plan view showing a schematic entire configuration of the support member SU used in the present second embodiment, and FIG. 43B is an enlarged view of a part of FIG. 43A. As shown in FIG. 43A and FIG. 43B, the support member SU includes an outer frame portion, and the ditch DIT is formed in an inner region of this outer frame portion. Then, the ditch DIT provided in the support member SU is arranged so as to include the product regions PR formed in the lead frame LF1.

Figure 44:
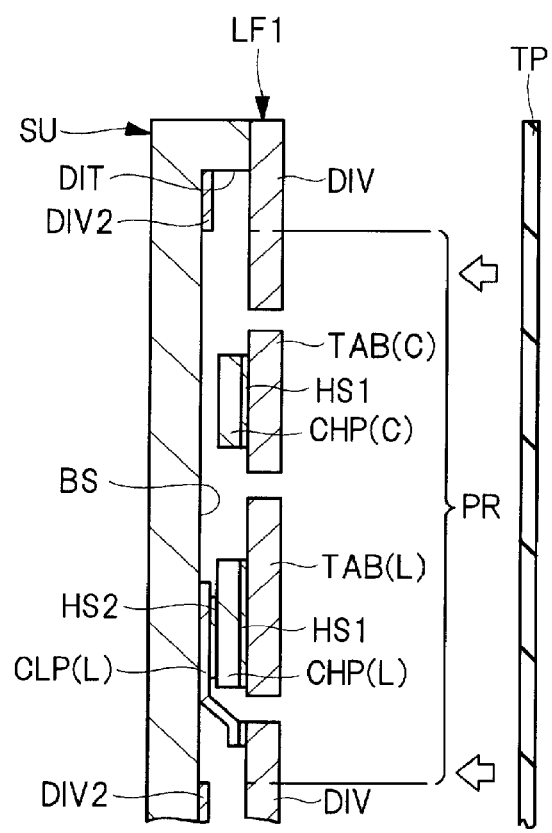
FIG. 44 is a cross-sectional view showing how a tape is applied to the rear surface of a lead frame in a state where the upper surface side of the lead frame is supported with a support member.

FIG. 44 is a cross-sectional view showing how the tape TP is applied to the rear surface of the lead frame LF1 in a state where the upper surface side of the lead frame LF1 is supported by the support member SU. As shown in FIG. 44, the product region PR provided in the lead frame LF1 is sandwiched by the partition regions DIV. Then, the chip mounting portion TAB(C) and the chip mounting portion TAB(L) are provided in the product region PR, and the driver IC chip CHP(C) is mounted over the chip mounting portion TAB(C) via the high melting point solder HS1. Moreover, the Low-MOS chip CHP(L) is mounted over the chip mounting portion TAB(L) via the high melting point solder HS1, and the Low-MOS clip CLP(L) is arranged over this Low-MOS chip CHP(L) via the high melting point solder HS2. Note that, although not shown in FIG. 44, for example as can be seen also from FIG. 42B, the chip mounting portion TAB(H) is also arranged in the product region PR, the High-MOS chip CHP(H) is mounted over this chip mounting portion TAB(H) via the high melting point solder HS1, and the High-MOS clip CLP(H) is arranged over this High-MOS chip CHP(H) via the high melting point solder HS2.

Here, above the partition region DIV of the lead frame LF1, the partition region DIV2 of the clip frame CLF is arranged, and the upper surface side of the lead frame LF1 is supported by the support member SU so that this partition region DIV2 contacts the support member SU. Thus, the ditch DIT of the support member SU will be arranged at a location where it overlaps with the product region PR formed in the lead frame LF1 in a planar manner. Then, in the present second embodiment, as shown in FIG. 44, there is a gap between the bottom surface BS of the ditch DIT provided in the support member SU and the upper surface of the driver IC chip CHP(C). As a result, according to the present second embodiment, the support member SU will support the upper surface side of the lead frame LF1 in a state of not contacting the driver IC chip CHP(C). Therefore, according to the present second embodiment, it is possible to support the upper surface side of the lead frame LF1 without damaging the driver IC chip CHP(C).

On the other hand, as shown in FIG. 44, the upper surface side of the lead frame LF1 is supported by the support member SU so that the bottom surface BS of the ditch DIT contacts the upper surface of the Low-MOS clip CLP(L) mounted over the Low-MOS chip CHP(L).

Thus, because the product region PR itself formed in the lead frame LF1 is not in the state without being supported by the support member SU at all, the stability of fixing of the product region PR can be improved. As a result, also in the product region PR of the lead frame LF1, a sufficient reaction force (repulsive force) from the lead frame LF1 generated in applying the tape TP to the rear surface of the lead frame LF1 can be secured. Therefore, according to the present second embodiment, it is possible to reliably apply the tape TP to the rear surface of the product region PR formed in the lead frame LF1 without involving a void and the like. That is, according to the present second embodiment, even in a state where the driver IC chip CHP(C), the High-MOS chip CHP(H), and the Low-MOS chip CHP(L) are mounted on the upper surface side of the lead frame LF1, the tape TP can be reliably applied to the rear surface of the lead frame LF1 (in particular, to the rear surface of the product region PR).

Here, the Low-MOS chip CHP(L) is not configured so as to cause the bottom surface BS of the ditch DIT to directly contact the upper surface of the Low-MOS chip CHP(L), but is configured so that the Low-MOS clip CLP(L) is interposed between the Low-MOS chip CHP(L) and the bottom surface BS of the ditch DIT. That is, in the Low-MOS chip CHP(L), the bottom surface BS of the ditch. DIT does not directly contact the upper surface of the Low-MOS chip CHP(L). That is, in the present second embodiment, the Low-MOS clip CLP(L) interposed between the Low-MOS chip CHP(L) and the bottom surface BS of the ditch DIT functions as a buffer material. For this reason, even if the upper surface side of the lead frame LF1 is supported by the support member SU so that the bottom surface BS of the ditch DIT contacts the Low-MOS clip CLP(L), the damage to the Low-MOS chip CHP(L) can be reduced to a level having no problem.

From the above, also in the present second embodiment, as with the above-described first embodiment, there is a gap between the bottom surface BS of the ditch DIT provided in the support member SU and the upper surface of the driver IC chip CHP(C). On the other hand, the bottom surface BS of the ditch DIT formed in the support member SU contacts the upper surface of the Low-MOS clip CLP(L) mounted over the Low-MOS chip CHP(L).

Thus, according to the present second embodiment, such a remarkable effect can be obtained that it is possible to reliably apply the tape TP to the rear surface of the lead frame LF1 (in particular, to the rear surface of the product region PR) while reducing the damage to the driver IC chip CHP(C), the High-MOS chip CHP(H), and the Low-MOS chip CHP(L).

<Modification 1>

Figure 45:
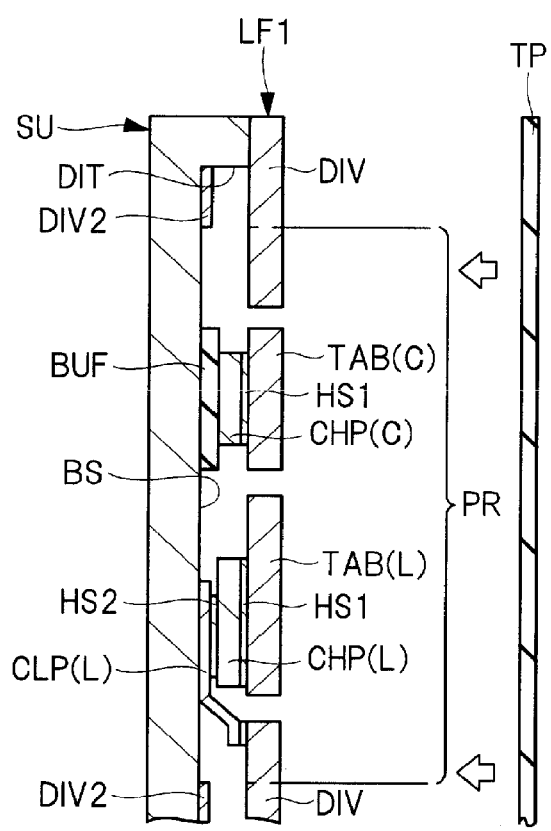
FIG. 45 is a cross-sectional view showing how a tape is applied to the rear surface of a lead frame in a state where the upper surface side of the lead frame is supported with a support member, in a Modification 1 of the second embodiment.

Next, a Modification 1 in the present second embodiment is described. FIG. 45 is a cross-sectional view showing how the tape TP is applied to the rear surface of the lead frame LF1 in a state where the upper surface side of the lead frame LF1 is supported by the support member SU, in the present Modification 1.

As shown in FIG. 45, in the present Modification 1, the buffer material BUF is interposed between the bottom surface BS of the ditch DIT provided in the support member SU and the upper surface of the driver IC chip CHP(C). Thus, the driver IC chip CHP(C) will be also supported by the support member SU. As a result, according to the present Modification 1, because the entire product region PR can be supported by the support member SU, the tape TP can be reliably applied to the rear surface of the lead frame LF1 (in particular, to the rear surface of the product region PR).

Then, in the present Modification 1, the upper surface of the driver IC chip CHP(C) does not directly contact the bottom surface BS of the ditch DIT provided in the support member SU but indirectly contacts the bottom surface BS of the ditch DIT via the buffer material BUF. Therefore, even when the upper surface of the driver IC chip CHP(C) is supported by the support member SU, the damage to the driver IC chip CHP(C) can be reduced to a level having no problem.

From the above, according to the present Modification 1, such a remarkable effect can be obtained that it is possible to reliably apply the tape TP to the rear surface of the lead frame LF1 (in particular, to the entire rear surface of the product region PR) while reducing the damage to the driver IC chip CHP(C), the High-MOS chip CHP(H), and the Low-MOS chip CHP(L).

<Modification 2>

Figure 46:
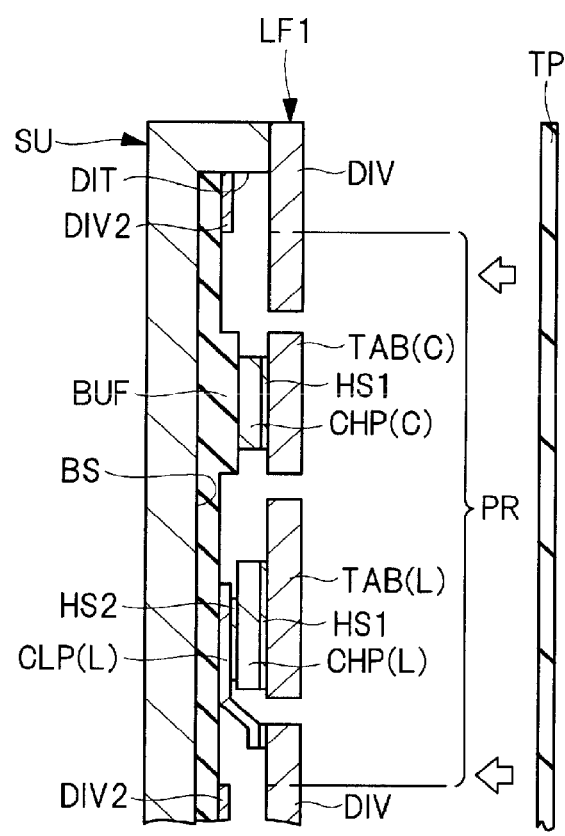
FIG. 46 is a cross-sectional view showing how a tape is applied to the rear surface of a lead frame in a state where the upper surface side of the lead frame is supported with a support member, in a Modification 2 of the second embodiment.

Subsequently, a Modification 2 in the present second embodiment is described. FIG. 46 is a cross-sectional view showing how the tape TP is applied to the rear surface of the lead frame LF1 in a state where the upper surface side of the lead frame LF1 is supported by the support member SU, in the present Modification 2.

As shown in FIG. 46, in the present Modification 2, the buffer material BUF is interposed between the bottom surface BS of the ditch DIT provided in the support member SU and the upper surface of the driver IC chip CHP(C). Thus, the driver IC chip CHP(C) will be also supported by the support member SU. As a result, according to the present Modification 2, because the entire product region PR can be supported by the support member SU, the tape TP can be reliably applied to the rear surface of the lead frame LF1 (in particular, to the rear surface of the product region PR).

Then, also in the present Modification 2, the upper surface of the driver IC chip CHP(C) does not directly contact the bottom surface BS of the ditch DIT provided in the support member SU but indirectly contacts the bottom surface BS of the ditch DIT via the buffer material BUF. Therefore, even when the upper surface of the driver IC chip CHP(C) is supported by the support member SU, the damage to the driver IC chip CHP(C) can be reduced to a level having no problem.

Furthermore, in the present Modification 2, the buffer material BUF is interposed also between the upper surface of the Low-MOS clip CLP(L) and the bottom surface BS of the ditch DIT provided in the support member SU. That is, in the present Modification 2, the Low-MOS clip CLP(L) and the buffer material BUF are interposed between the Low-MOS chip CHP(L) and the bottom surface BS of the ditch DIT. That is, in the present Modification 2, the Low-MOS clip CLP(L) interposed between the Low-MOS chip CHP(L) and the bottom surface BS of the ditch DIT functions as a buffer material, and furthermore the buffer material BUF is also provided between the Low-MOS clip CLP(L) and the bottom surface BS of the ditch DIT. For this reason, even if the upper surface side of the lead frame LF1 is supported by the support member SU, the damage to the Low-MOS chip CHP(L) can be further reduced to a level having no problem.

From the above, also with the present Modification 2, such a remarkable effect can be obtained that it is possible to reliably apply the tape TP to the rear surface of the lead frame LF1 (in particular, to the entire rear surface of the product region PR) while reducing the damage to the driver IC chip CHP(C), the High-MOS chip CHP(H), and the Low-MOS chip CHP(L).

Third Embodiment

Also in a present third embodiment, the high melting point solder HS1 is used for the connection between the chip mounting portion TAB(H) and the High-MOS chip CHP(H) and for the connection between the chip mounting portion TAB(L) and the Low-MOS chip CHP(L). On the other hand, in the present third embodiment described is an example, in which the silver paste PST is used for the connection between the chip mounting portion TAB(C) and the driver IC chip CHP(C).

Packaging Configuration of Semiconductor Device in Third Embodiment

Because the packaging configuration of a semiconductor device in the present third embodiment is substantially the same as that of the semiconductor device PK2 in the above-described second embodiment, the description is provided focusing on differences.

Figure 47:
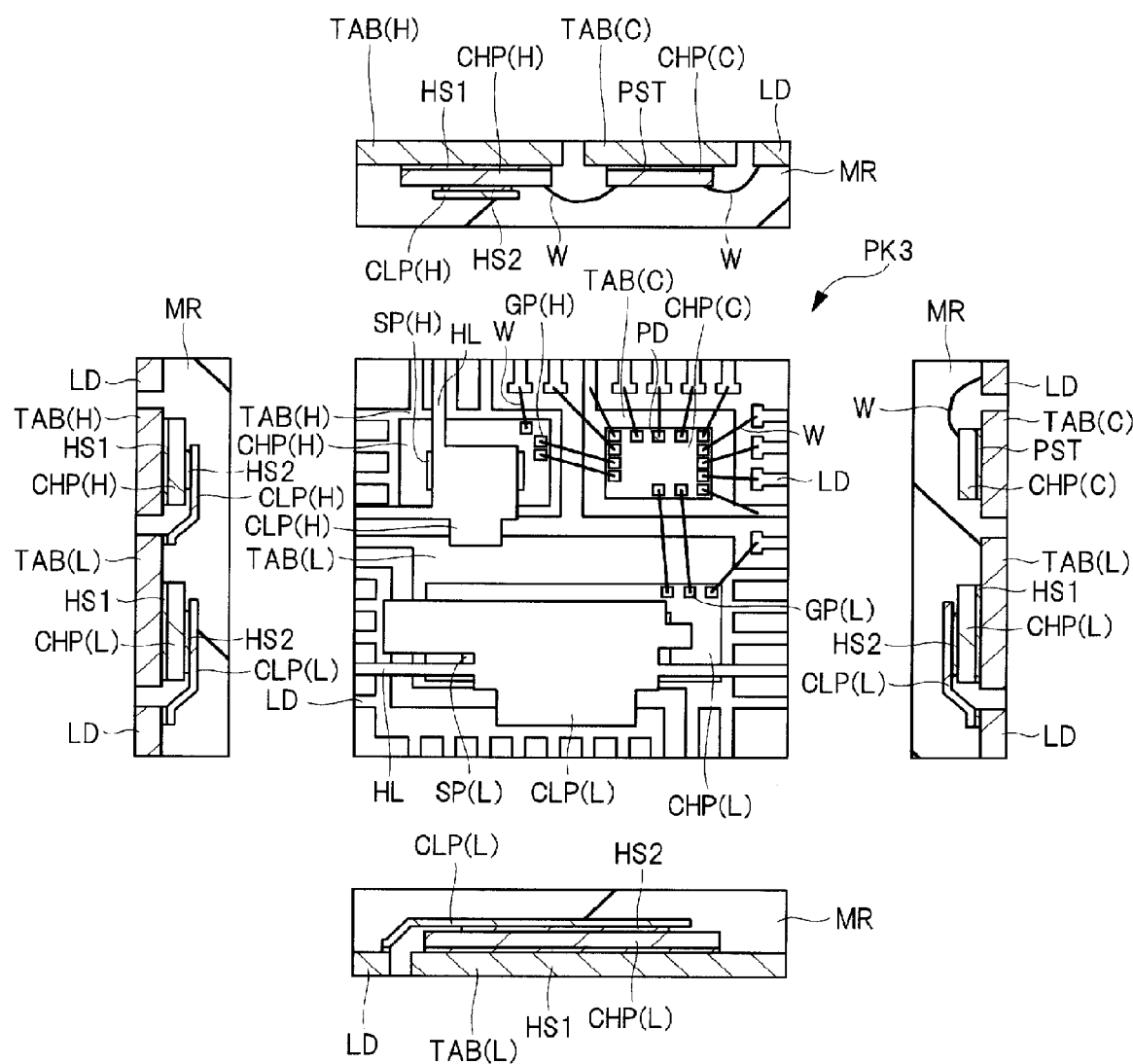
FIG. 47 is a view showing the internal configuration of a semiconductor device in a third embodiment.

FIG. 47 is a view showing the internal configuration of a semiconductor device PK3 in the present third embodiment. In FIG. 47, a drawing shown in the center is a plan view of the inside of the semiconductor device PK3 seen through the resin MR from the upper surface side, and on each of all sides thereof is shown a cross-sectional view.

In FIG. 47, also in the present third embodiment, the suspension lead HL is formed integrally with the High-MOS clip CLP(H) and this suspension lead HL reaches an outer edge portion of the sealing body formed by the resin MR. Similarly, the suspension lead HL is integrally formed also in the Low-MOS clip CLP(L), and this suspension lead HL reaches an outer edge portion of the sealing body formed by the resin MR.

Here, also in the present third embodiment, as shown in FIG. 47, the high melting point solder HS1 is used for the connection between the chip mounting portion TAB(H) and the High-MOS chip CHP(H) and for the connection between the chip mounting portion TAB(L) and the Low-MOS chip CHP(L). On the other hand, in the present third embodiment, the silver paste PST is used for the connection between the chip mounting portion TAB(C) and the driver IC chip CHP(C). That is, in the present third embodiment, the connection material used for the connection between the chip mounting portion TAB(H) and the High-MOS chip CHP(H) and for the connection between the chip mounting portion TAB(L) and the Low-MOS chip CHP(L) differs from a connection material used for the connection between the chip mounting portion TAB(C) and the driver IC chip CHP(C). The other configuration is the same as that of the above-described second embodiment.

Method of Manufacturing Semiconductor Device in Third Embodiment

The semiconductor device in the present third embodiment is configured as described above, and hereinafter the method of manufacturing a semiconductor device in the present third embodiment is described with reference to the accompanying drawings.

Figure 48:
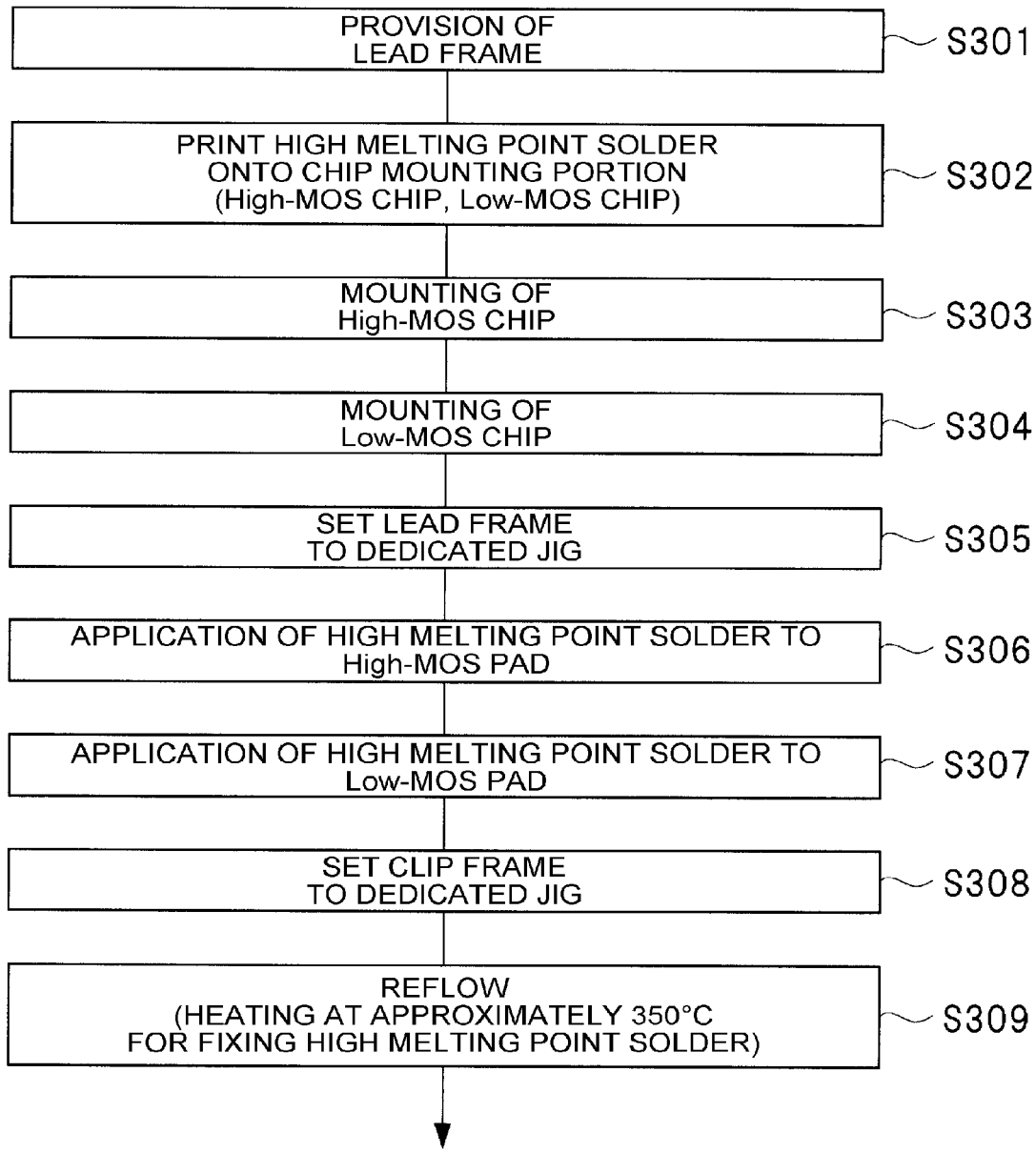
FIG. 48 is a flowchart showing a semiconductor device manufacturing flow in the third embodiment.
Figure 49:
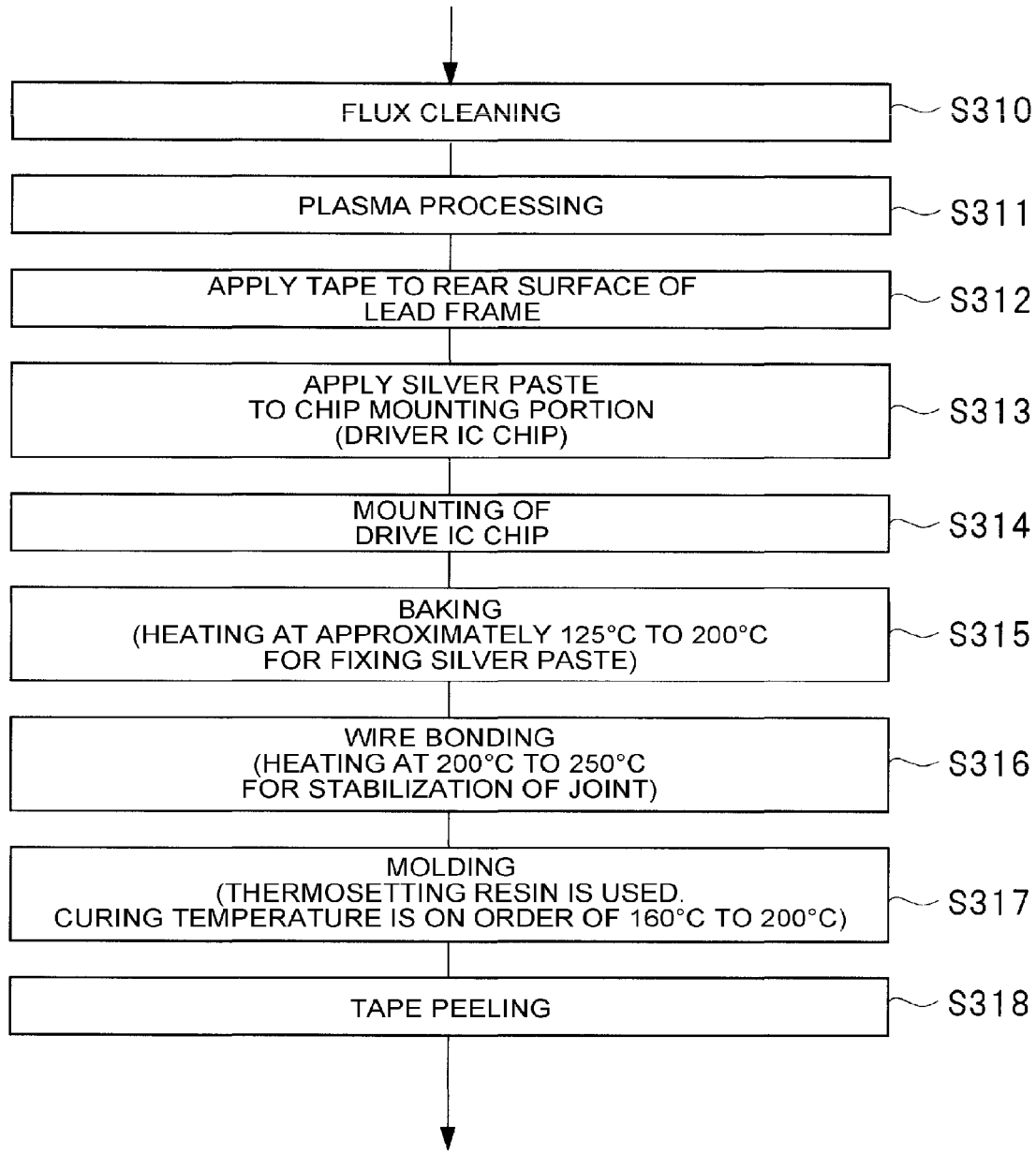
FIG. 49 is a flowchart showing the semiconductor device manufacturing flow in the third embodiment.
Figure 50:
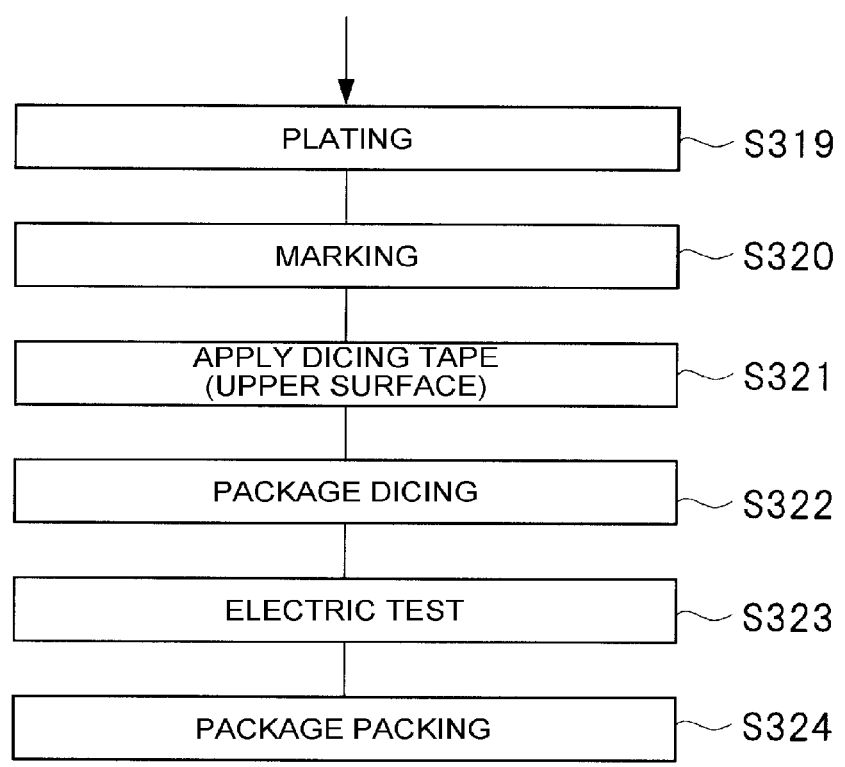
FIG. 50 is a flowchart showing the semiconductor device manufacturing flow in the third embodiment.

FIG. 48 to FIG. 50 show a flowchart showing a manufacturing flow of the semiconductor device in the present third embodiment. Moreover, FIG. 51 to FIG. 57 are views each showing a manufacturing process of the semiconductor device in the present third embodiment.

First, the lead frame LF1 is prepared (S301 of FIG. 48). This lead frame LF1 has, for example, the same configuration as that of the lead frame LF1 used in the above-described first embodiment shown in FIG. 14A to FIG. 14C. For example, as shown in FIG. 14C, in the lead frame LF1 in the present third embodiment, a plurality of product regions PR is arranged in a matrix, each product region PR including the chip mounting portion TAB(C), the chip mounting portion TAB(H), the chip mounting portion TAB(L), and the lead LD.

Furthermore, also in the present third embodiment, as with the above-described second embodiment, the clip frame CLF as shown in FIGS. 38A and 38B is prepared. In FIG. 38A, a schematic entire configuration of the clip frame CLF is shown, while in FIG. 38B a part of the clip frame CLF is enlarged and shown. As shown in FIG. 38B, in the clip frame CLF, a plurality of unit regions UR each including the High-MOS clip CLP(H) and the Low-MOS clip CLP(L) is included, and the unit regions UR are arranged in a matrix.

Here, for example, as shown in FIG. 38B, in each of the unit regions UR arranged in a matrix, the High-MOS clip CLP(H) and the Low-MOS clip CLP(L) are formed, and both the High-MOS clip CLP(H) and the Low-MOS clip CLP(L) are coupled to a frame body of the clip frame CLF by the suspension lead HL. Accordingly, in the entire clip frame CLF, the plurality of High-MOS clips CLP(H) and the plurality of Low-MOS clips CLP(L) will be integrally formed.

Figure 51:
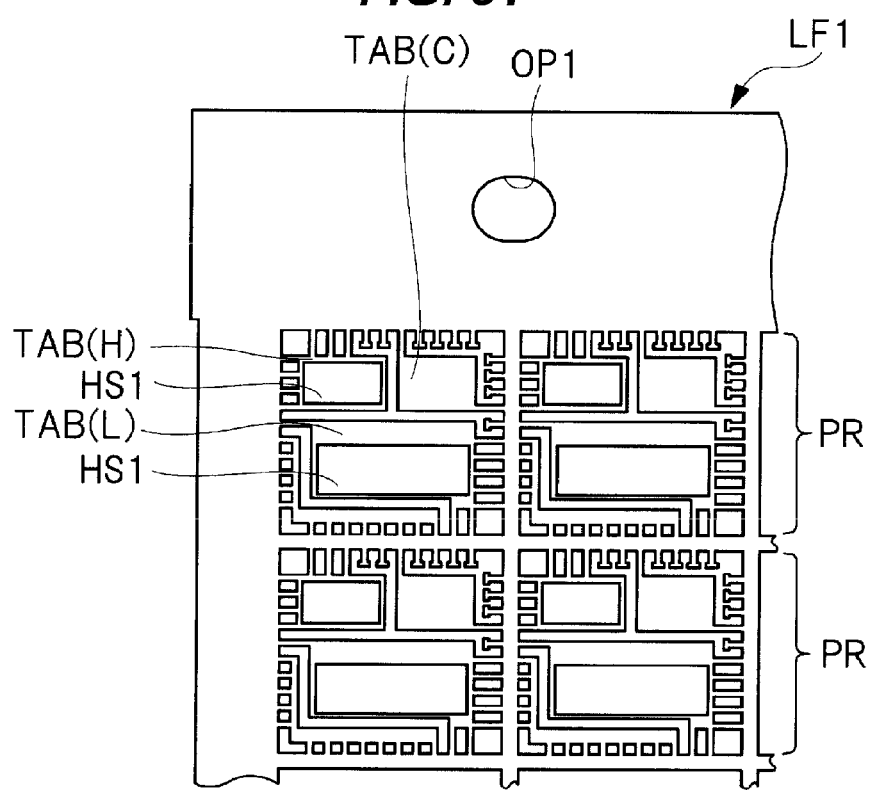
FIG. 51 is a plan view showing a manufacturing process of the semiconductor device in the third embodiment.

Next, as shown in FIG. 51, in each of the product regions PR formed in the lead frame LF1, the high melting point solder HS1 is formed over the chip mounting portion TAB(H) and the chip mounting portion TAB(L) (S302 of FIG. 48). Specifically, for example, using a solder printing method, the high melting point solder HS1 is printed over the chip mounting portion TAB(H) and the chip mounting portion TAB(L). Here, an important point is that as shown in FIG. 51, the high melting point solder HS1 is not formed over the chip mounting portion TAB(C). This point constitutes a part of the characteristics of the present third embodiment.

Figure 52:
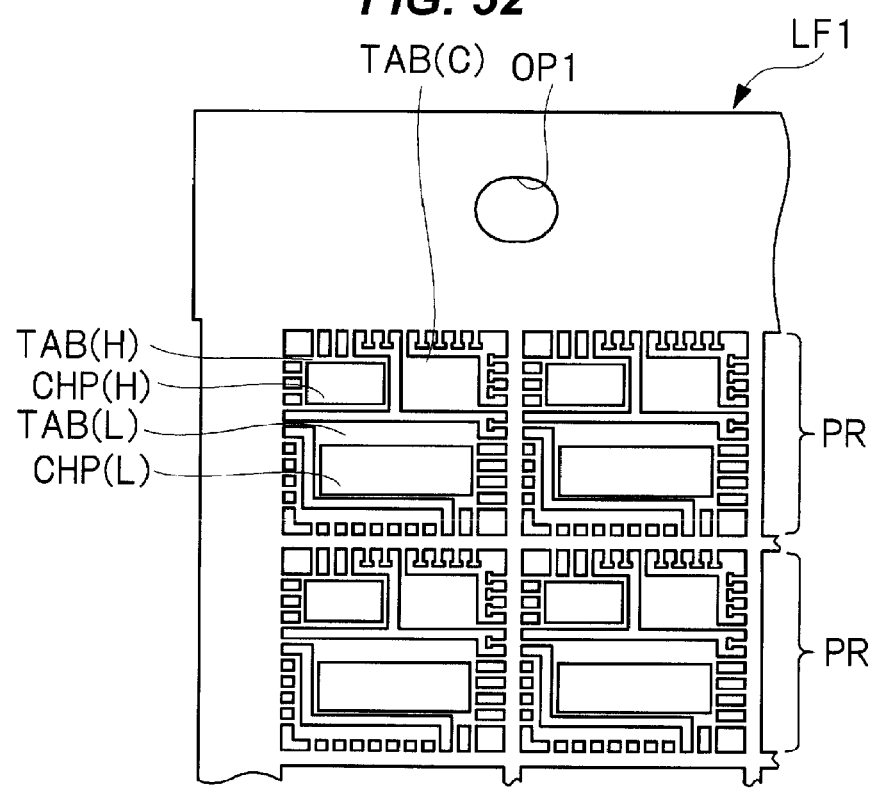
FIG. 52 is a plan view showing the manufacturing process of the semiconductor device following FIG. 51.

Next, as shown in FIG. 52, in each of the product regions PR formed in the lead frame LF1, first the High-MOS chip CHP(H) is mounted over the chip mounting portion TAB(H) (S303 of FIG. 48), and thereafter the Low-MOS chip CHP(L) is mounted over the chip mounting portion TAB(L) (S304 of FIG. 48). Note that the mounting order of the High-MOS chip CHP(H) and the Low-MOS chip CHP(L) is not limited thereto but may be changed as required. Also here, an important point is that the driver IC chip CHP(C) is not mounted over the chip mounting portion TAB(C) at this stage, although related to the fact that the high melting point solder HS1 is not formed over the chip mounting portion TAB(C). This point also constitutes a part of the characteristics of the present third embodiment.

Thereafter, the lead frame LF1 is set to the positioning dedicated-jig (S305 of FIG. 48). Specifically, as shown in FIG. 52, the lead frame LF1 is positioned by inserting the opening OP1 formed in the lead frame LF1 into a protruding pin, for example, of the dedicated jig.

Figure 53:
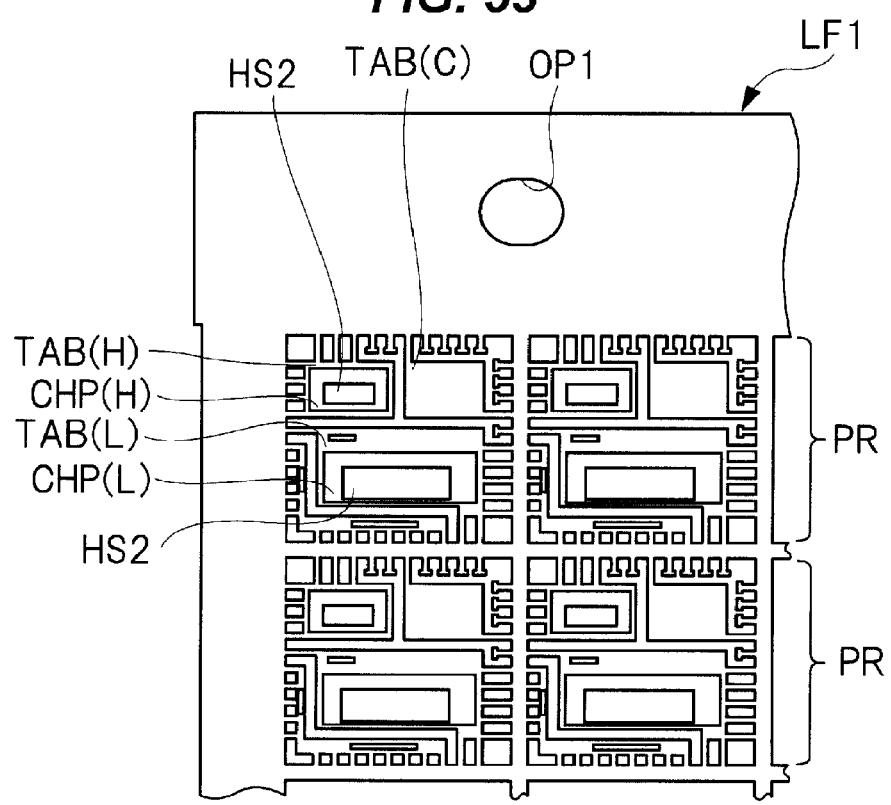
FIG. 53 is a plan view showing the manufacturing process of the semiconductor device following FIG. 52.

Next, as shown in FIG. 53, in each of the product regions PR formed in the lead frame LF1, the high melting point solder HS2 is formed over the High-MOS chip CHP(H) (S306 of FIG. 48). Thereafter, the high melting point solder HS2 is formed over the Low-MOS chip CHP(L) (S307 of FIG. 48). Specifically, the high melting point solder HS2 is formed over the source electrode pad (High-MOS pad) (not shown) formed in the High-MOS chip CHP(H), and the high melting point solder HS2 is formed over the source electrode pad (Low-MOS pad) (not shown) formed in the Low-MOS chip CHP(L). Furthermore, as shown in FIG. 53, the high melting point solder HS2 is also formed over a partial region of the chip mounting portion TAB(L) and over a partial region of the lead.

Specifically, for example, using a coating method, the high melting point solder HS2 is also applied over the High-MOS chip CHP(H), over the Low-MOS chip CHP(L), over the partial region of the chip mounting portion TAB(L), and over the partial region of the lead. The high melting point solder HS2 formed at this time may have the same material component as that of the above-described high melting point solder HS1, or may have a different material component.

Figure 54:
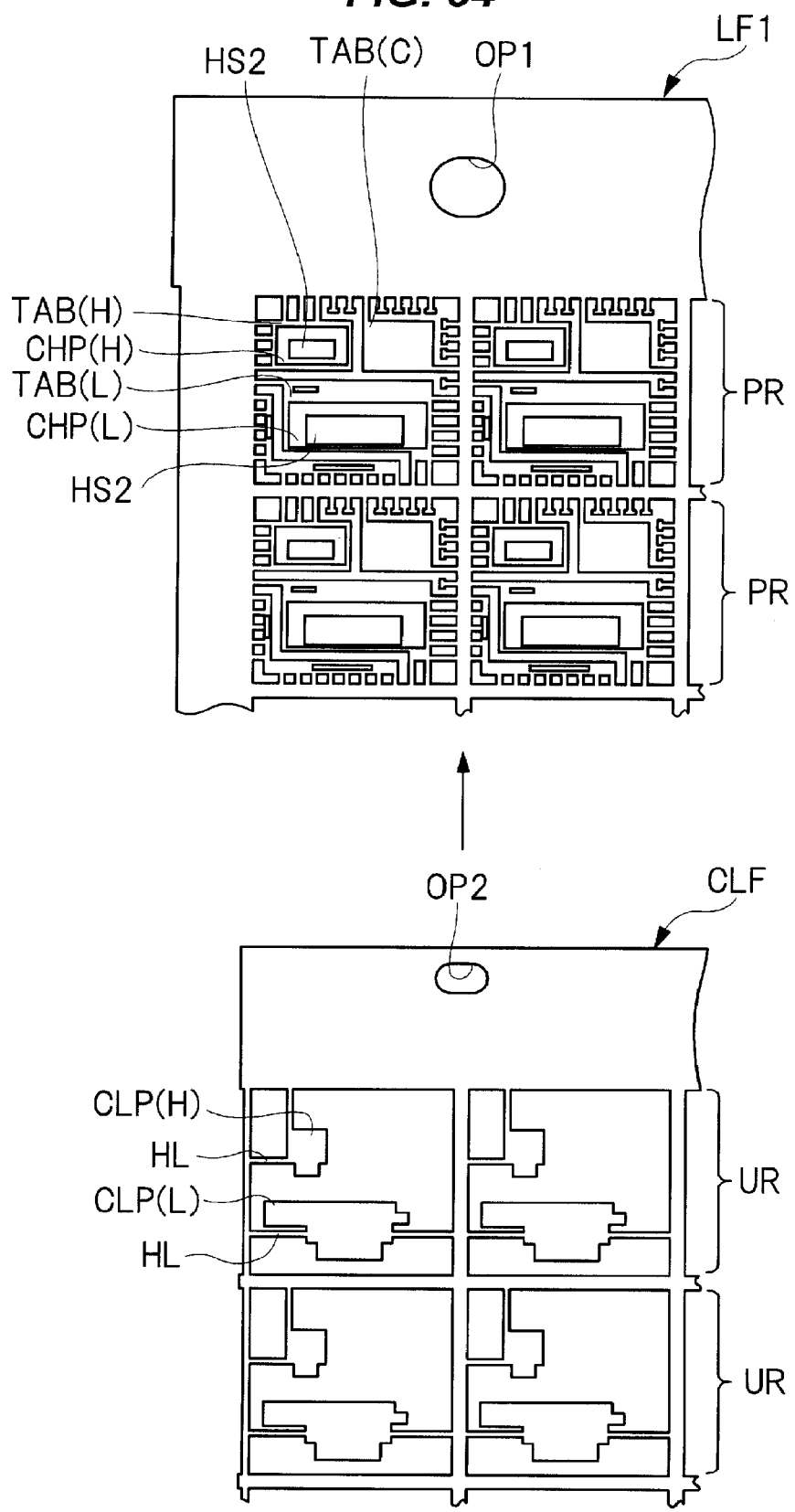
FIG. 54 is a plan view showing the manufacturing process of the semiconductor device following FIG. 53.

Thereafter, as shown in FIG. 54, the clip frame CLF is set to the positioning dedicated-jig (S308 of FIG. 48). Specifically, as shown in FIG. 54, the opening OP2 formed in the clip frame CLF is further inserted into the protruding pin, which has been inserted into the opening OP1 formed in the lead frame LF1. Thus, according to the present third embodiment, the clip frame CLF can be arranged over the lead frame LF1 so as to overlap with each other. That is, as described above, by inserting the opening OP1 formed in the lead frame LF1 and the opening OP2 formed in the clip frame CLF into the protruding pin provided in the dedicated jig, it is possible to overlap each of the product regions PR formed in the lead frame LF1 and each of the unit regions UR formed in the clip frame CLF with each other in a planar manner.

Thus, according to the present third embodiment, simply by overlapping the lead frame LF1 with the clip frame CLF, it is possible to overlap each of the product regions PR and each of the unit regions UR with each other in a planar manner. This means that the High-MOS clip CLP(H) formed in each of the unit regions UR can be mounted over the High-MOS chip CHP(H) formed in each of the product regions PR, at once. Similarly, this means that the Low-MOS clip CLP(L) formed in each of the unit regions UR can be mounted over the Low-MOS chip CHP(L) formed in each of the product regions PR, at once. As a result, according to the present third embodiment, the manufacturing process can be simplified and thus the manufacturing cost of the semiconductor device PK3 can be reduced.

In this manner, the source electrode pad formed in the High-MOS chip CHP(H) and the chip mounting portion TAB(L) will be electrically coupled to each other by the High-MOS clip CLP(H). Moreover, the source electrode pad formed in the Low-MOS chip CHP(L) and the lead, to which the reference potential is supplied, will be electrically coupled to each other by the Low-MOS clip CLP(L).

Subsequently, the reflow is carried out with respect to the high melting point solder HS1 and the high melting point solder HS2 (S309 of FIG. 48). Specifically, the lead frame LF1 including the high melting point solder HS1 and the high melting point solder HS2 is heated at a temperature (a first temperature) of approximately 350° C., for example. Thus, the high melting point solder HS1 and the high melting point solder HS2 can be melted.

Then, in the present third embodiment, a heat treatment (reflow) for melting the high melting point solder HS1 and the high melting point solder HS2 is carried out in a state where a tape is not applied to the rear surface of the lead frame LF1 that is prepared in advance. Accordingly, in the case of the present third embodiment, even if the reflow temperature of the high melting point solder HS1 and the high melting point solder HS2 is higher than the heat-resisting temperature of the tape, the heat resistance of the tape will not pose a problem because the tape is originally not applied to the rear surface of the lead frame LF1. That is, according to the present third embodiment, because the heat treatment (reflow) of the high melting point solder is carried out before the tape is applied to the rear surface of the lead frame LF1, the heat resistance of the tape can be secured regardless of the temperature of the heat treatment (reflow).

Thereafter, in order to remove the flux contained in the high melting point solder HS1 and the high melting point solder HS2, flux cleaning is carried out (S310 of FIG. 49). Then, from a viewpoint of improving the bonding characteristics of a wire in the wire bonding step carried out in a subsequent step, the upper surface of the lead frame LF1 is cleaned by carrying out plasma processing with respect to the upper surface of the lead frame LF1 (S311 of FIG. 49).

Next, as shown in FIG. 55A and FIG. 55B, the tape TP is applied to the rear surface of the lead frame LF1 (S312 of FIG. 49). That is, among the faces of the lead frame LF1, the tape TP is applied to a face opposite to a face, on which the High-MOS chip CHP(H) and the Low-MOS chip CHP(L) are mounted. At this time, as described above, the heat treatment (reflow) at approximately 350° C. with respect to the high melting point solder HS1 and the high melting point solder HS2 is already completed in a step prior to the step of applying the tape TP, and therefore in the present third embodiment, the heat resistance of the tape TP will not appear as a problem.

That is, the reflow temperature of the above-described high melting point solder HS1 and high melting point solder HS2 is approximately 350° C., for example, and exceeds the heat-resisting temperature (e.g., approximately 250° C.) of the tape TP. Therefore, if the heat treatment for melting the high melting point solder HS1 and the high melting point solder HS2 is carried out in the state where the tape TP is applied to the rear surface of the lead frame LF, the tape TP will not be able to withstand the heat treatment. Regarding this point, in the present third embodiment, in a step prior to the step of applying the tape TP, the heat treatment (reflow) at approximately 350° C. with respect to the high melting point solder HS1 and the high melting point solder HS2 is already completed. For this reason, in the present third embodiment, the heat resistance of the tape TP will not appear as a problem.

Here, in the present third embodiment, in carrying out the step of applying the tape TP to the current rear surface of the lead frame LF1, the driver IC chip CHP(C) has not been mounted over the chip mounting portion TAB(C) yet. For this reason, in the present third embodiment, the chip mounting portion TAB(C), in which the driver IC chip CHP(C) is not mounted, can be also pressed. Therefore, the present third embodiment is characterized in that the region for pressing the lead frame LF1 increases and thus the tape TP can be reliably applied to the rear surface of the lead frame LF1. The detail of this feature is described later.

Figure 56:
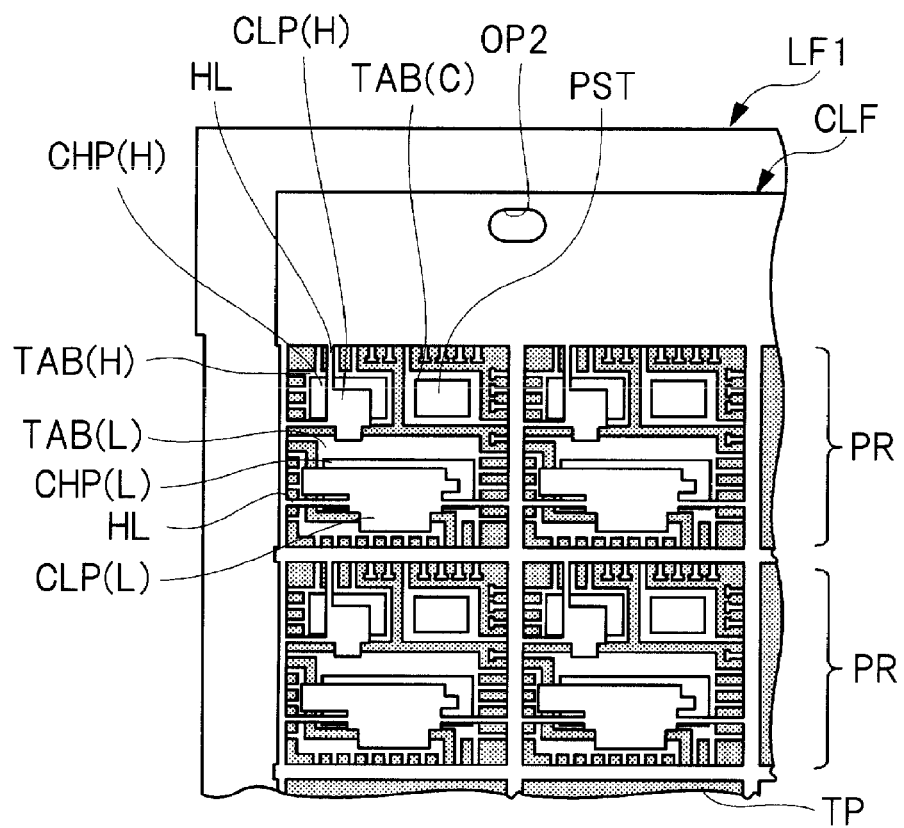
FIG. 56 is a plan view showing the manufacturing process of the semiconductor device following FIGS. 55A and 55B.

Subsequently, as shown in FIG. 56, in each of the product regions PR formed in the lead frame LF1, the silver paste PST is formed over the chip mounting portion TAB(C) (S313 of FIG. 49). Specifically, for example, the silver paste PST is applied over the chip mounting portion TAB(C).

Figure 57:
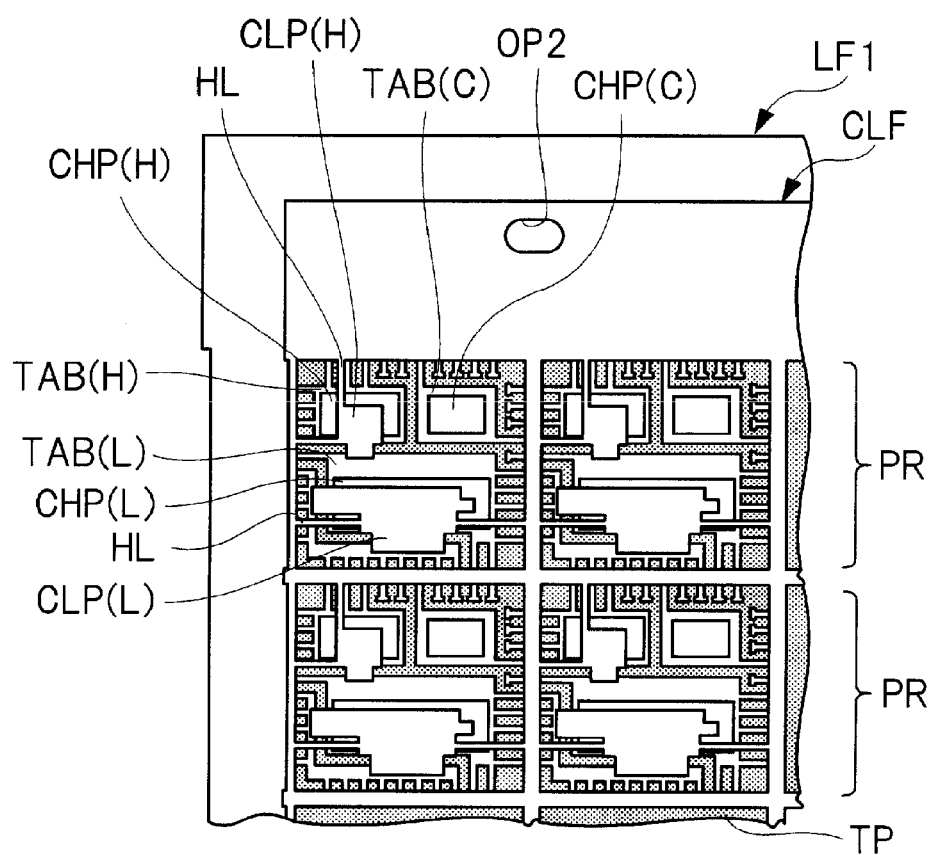
FIG. 57 is a plan view showing the manufacturing process of the semiconductor device following FIG. 56.

Next, as shown in FIG. 57, in each of the product regions PR formed in the lead frame LF1, the driver IC chip CHP(C) is mounted over the chip mounting portion TAB(C) (S314 of FIG. 49). Thereafter, a heat treatment (bake treatment) is carried out in order to cure the silver paste PST (S315 of FIG. 49). This heat treatment is carried out at approximately 125° C. to approximately 200° C., for example. Here, because the tape TP is already applied to the rear surface of the lead frame LF1 and the heat-resisting temperature of this tape TP is approximately 250° C., the heat treatment applied in the above-described curing step of the silver paste PST may not cause a problem in the heat resistance of the tape TP.

That is, in the present third embodiment, in a step after applying the tape TP to the rear surface of the lead frame LF1, the driver IC chip CHP(C) is mounted over the chip mounting portion TAB(C). The purpose of this is to support the chip mounting portion TAB(C) itself without damaging the driver IC chip CHP(C), by configuring such that in applying the tape TP to the rear surface of the lead frame LF1, the driver IC chip CHP(C) is not yet mounted over the chip mounting portion TAB(C) at this stage.

That is, in the present third embodiment, in applying the tape TP to the rear surface of the lead frame LF1, the mounting of the driver IC chip CHP(C) to the chip mounting portion TAB(C) is carried out in a step after applying the tape TP to the rear surface of the lead frame LF1 so that the upper surface itself of the chip mounting portion TAB(C) can be also pressed. Thus, according to the present third embodiment, because the area for supporting the upper surface side of the lead frame LF1 can be increased, the tape TP can be reliably applied to the rear surface of the lead frame LF1.

In the case of this configuration, if the high melting point solder HS1 is used for the connection between the chip mounting portion TAB(C) and the driver IC chip CHP(C), the heat treatment (reflow) applied to the high melting point solder HS1 will cause a problem in the heat resistance of the tape TP. Then, in the present third embodiment, the silver paste PST is used for the connection between the chip mounting portion TAB(C) and the driver IC chip CHP(C).

In this case, the heat treatment (bake treatment) is carried out in order to cure the silver paste PST, and this heat treatment is carried out at approximately 125° C. to approximately 200° C., for example. On the other hand, because the tape TP is already applied to the rear surface of the lead frame LF1 and the heat-resisting temperature of this tape TP is approximately 250° C., the heat treatment applied in the curing step of the silver paste PST does not cause a problem in the heat resistance of the tape TP.

As described above, in the present third embodiment, in applying the tape TP to the rear surface of the lead frame LF1, the mounting of the driver IC chip CHP(C) to the chip mounting portion TAB(C) is carried out in a step after applying the tape TP to the rear surface of the lead frame LF1 so that the upper surface itself of the chip mounting portion TAB(C) can be also pressed. Then, taking into consideration a fact that if the high melting point solder HS1 is used for the connection between the chip mounting portion TAB(C) and the driver IC chip CHP(C), then the heat treatment (reflow) applied to the high melting point solder HS1 causes a problem in the heat resistance of the tape TP, the silver paste PST is used for the connection between the chip mounting portion TAB(C) and the driver IC chip CHP(C).

Here, even if not the high melting point solder HS1, but the silver paste PST, is used for the connection between the chip mounting portion TAB(C) and the driver IC chip CHP(C), there is no problem in the characteristics. Hereinafter, the reason for this is described. For example, a power MOSFET is formed inside the High-MOS chip CHP(H) and inside the Low-MOS chip CHP(L), and the rear surface of the chip functions as a drain electrode (drain region) of this power MOSFET. Therefore, in order to reduce the on-resistance, the high melting point solder HS1 having a low electric resistance needs to be used for a connection member that connects the rear surface of the High-MOS chip CHP (H) or of the Low-MOS chip CHP(L) to the chip mounting portion (the chip mounting portion TAB(H) or the chip mounting portion TAB(L)).

On the other hand, in the driver IC chip CHP(C), although a MOSFET (field effect transistor) and a wiring layer constituting the control circuit CC are formed, a power MOSFET is not formed and thus the rear surface of the driver IC chip CHP(C) is not used as the drain electrode. That is, a current does not flow through the rear surface of the driver IC chip CHP(C). Therefore, in the driver IC chip CHP(C), the necessity for reduction of the on-resistance is lower than in the High-MOS chip CHP(H) and in the Low-MOS chip CHP(L). That is, in the driver IC chip CHP(C), for the connection between the chip mounting portion TAB(C) and the rear surface of the driver IC chip CHP(C), the high melting point solder HS1 does not necessarily need to be used and the silver paste PST is enough for this purpose.

Focusing on this fact, in the present third embodiment the high melting point solder HS1 is not used for the connection between the chip mounting portion TAB(C) and the driver IC chip CHP(C), but the silver paste PST is used for the connection between the chip mounting portion TAB(C) and the driver IC chip CHP(C). As a result, according to the present third embodiment, because the heat resistance of the tape TP can be secured, the driver IC chip CHP(C) can be mounted over the chip mounting portion TAB(C) in a step after applying the tape TP to the rear surface of the lead frame LF1.

This means that in applying the tape TP to the rear surface of the lead frame LF1, the driver IC chip CHP(C) can be configured so as not to be mounted over the chip mounting portion TAB(C) at this stage. Thus, according to the present third embodiment, it is possible to support the chip mounting portion TAB(C) itself without damaging the driver IC chip CHP(C). Therefore, according to the present third embodiment, the area for supporting the upper surface side of the lead frame LF1 can be increased and thus the tape TP can be reliably applied to the rear surface of the lead frame LF1.

Subsequently, as with the above-described second embodiment, the wire bonding step is carried out (S316 of FIG. 49). Here, also in the present third embodiment, in a step prior to carrying out the wire bonding step, the tape TP is applied to the rear surface of the lead frame LF1. Therefore, according to the present third embodiment, the lead frame LF1 having the tape TP applied thereto can be easily vacuum-sucked. As a result, even with the lead frame LF1 corresponding to the MAP molding technique, it is possible to carry out the wire bonding step while reliably fixing the lead frame LF1 by vacuum suction. As a result, according to the present third embodiment, the reliability in the wire bonding step can be improved.

Note that, the wire bonding step is carried out in the state where the lead frame LF1 is heated to approximately 200° C. to approximately 250° C. for stabilization of the joint of the wire W. However, because the heat-resisting temperature of the tape TP applied to the rear surface of the lead frame LF1 is approximately 250° C., the heat treatment applied in the wire bonding step may not cause a problem in the heat resistance of the tape TP.

Here, in the present third embodiment, in a step after carrying out the flux cleaning, the driver IC chip CHP(C) is mounted over the chip mounting portion TAB(C), and in the subsequent step a wire is bonded to an electrode pad formed in the driver IC chip CHP(C). One of the characteristics of the present third embodiment is such a process order.

That is, as the cleaning fluid used in the flux cleaning, a cleaning fluid containing hydrocarbon is used, for example. At this time, if the flux cleaning step is carried out at a stage after the driver IC chip CHP(C) is mounted over the chip mounting portion TAB(C), the electrode pad formed in the driver IC chip CHP(C) will be exposed to the cleaning fluid. As a result, the electrode pad formed in the driver IC chip CHP(C) will be contaminated by the cleaning fluid, which might adversely affect the coupling between these electrode pad and wire.

In contrast, in the present third embodiment, in a step after carrying out the flux cleaning, the driver IC chip CHP(C) is mounted over the chip mounting portion TAB(C). Therefore, there is no need to worry about the contamination of the electrode pad formed in the driver IC chip CHP(C) due to the cleaning fluid used in the flux cleaning. That is, according to the present third embodiment, because there is no adverse effect on the electrode pad formed in the driver IC chip CHP(C) due to the flux cleaning, the reliability of coupling between the electrode pad formed in the driver IC chip CHP(C) and the wire can be improved.

Next, the product regions formed in the lead frame LF1 are collectively sealed (molded) by a resin (S317 of FIG. 49). In other words, the product regions PR in the lead frame LF1 are collectively sealed by the resin MR so as to cover the driver IC chip CHP(C), the High-MOS chip CHP(H), and the Low-MOS chip CHP(L) and thereby a sealing body is formed. That is, in the present third embodiment, what is employed is as the technique for sealing a semiconductor chip by a resin, is the so-called MAP molding technique, in which the product regions PR are included in a cavity and the product regions PR are collectively sealed by a resin. According to this MAP molding technique, because there is no need to provide a path for injecting resin for each product region PR, the product regions PR can be densely arranged. Thus, according to the MAP molding technique, the acquisition number of products can be increased and thereby a cost reduction of the product can be achieved.

Then, in the present third embodiment, in a step prior to the resin sealing step (molding step) by the MAP molding technique, the adhesive tape TP is applied to the rear surface of the lead frame LF1. Therefore, according to the present third embodiment, the tape TP can be reliably applied to the rear surface terminal (lead) formed in the rear surface of the lead frame LF1. As a result, also in the resin sealing step employing the MAP molding technique, a gap is not formed between the rear surface terminal and the tape TP and thus the resin leakage (resin burr) into the rear side of the rear surface terminal can be sufficiently suppressed.

Note that, as the resin used in the resin sealing step, a thermosetting resin is used, for example. Therefore, the resin sealing step is carried out in a state of being heated to approximately 160° C. to approximately 200° C., in order to cure the thermosetting resin. However, because the heat-resisting temperature of the tape TP applied to the rear surface of the lead frame LF1 is approximately 250° C., the heat treatment applied in the resin sealing step may not cause a problem in the heat resistance of the tape TP.

Thereafter, the tape TP applied to the rear surface of the lead frame LF1 is peeled off from the lead frame LF1 (S318 of FIG. 49). Then, a plating film is formed on the upper surface of the chip mounting portion TAB(C), the chip mounting portion TAB(H), the chip mounting portion TAB (L), and the rear surface terminal BTE which are exposed from the rear surface of the resin MR (sealing body) (see FIG. 33) (S319 of FIG. 50). Furthermore, a mark is formed in the upper surface of the sealing body formed by the resin MR (marking step) (S320 of FIG. 50).

Subsequently, a dicing tape is applied to the upper surface of the sealing body formed by the resin (S321 of FIG. 50). Then, the sealing body formed by the resin is cut for each product region (package dicing) (S322 of FIG. 50). Specifically, the partition region (boundary region) partitioning the product regions PR formed in the lead frame LF1 is cut with a dicing blade, and each product region is singulated. Thus, for example, the semiconductor device PK3 in the third embodiment as shown in FIG. 47 can be acquired. Then, the suspension lead HL formed in the clip frame CLF is cut. As a result, the cross-section of the suspension lead HL will be exposed from the side surface of the semiconductor device PK3.

Thereafter, the singulated individual semiconductor device PK3 is sorted by an electric test (S323 of FIG. 50), and the semiconductor device PK3 determined to be non-defective is packaged and shipped (S324 of FIG. 50). In this manner, the semiconductor device in the present third embodiment can be manufactured.

Note that, in the present third embodiment, for example, an example using the clip frame CLF shown in FIG. 38A and FIG. 38B has been described, but not limited thereto, and the clip subassembly CLP shown in FIG. 15A and FIG. 15B, for example, may be used.

Characteristics of Third Embodiment

Next, the features in the present third embodiment are described with reference to the accompanying drawings. The present third embodiment is characterized in the method of fixing the lead frame LF1 in applying the tape TP to the rear surface of the lead frame LF1. In particular, the technical idea in the present third embodiment is that after applying the tape TP to the rear surface of the lead frame LF1, the driver IC chip CHP(C) is mounted over the chip mounting portion TAB(C) so as to be able to press the top of the chip mounting portion TAB(C) by the support member SU. Hereinafter, the technical idea in the present third embodiment is specifically described.

Figure 58A:
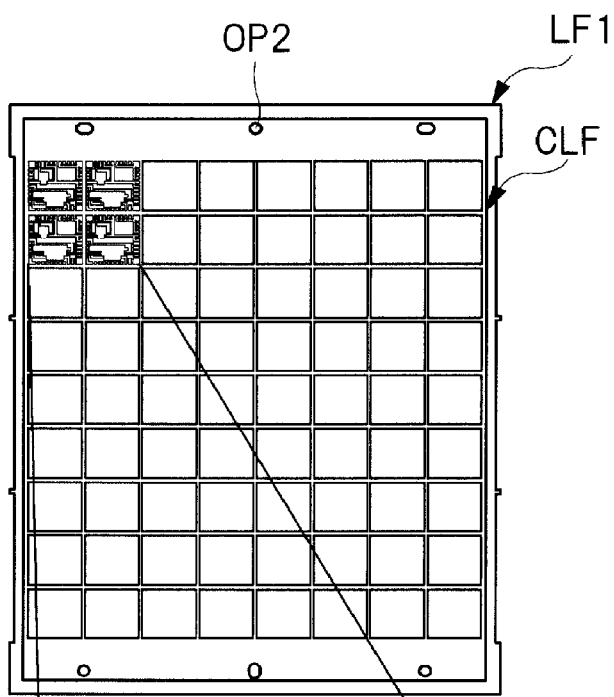
FIG. 58A is a view showing the configuration of a lead frame immediately before applying a tape to the rear surface of the lead frame.
Figure 58B:
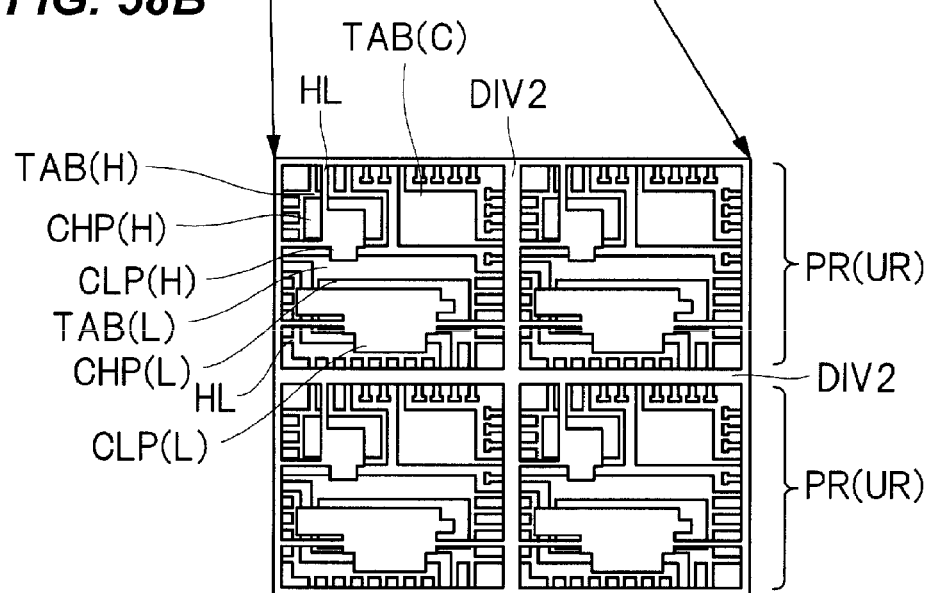
FIG. 58B is an enlarged view showing a part of FIG. 58A.

FIG. 58A is a view showing the configuration of the lead frame LF1 immediately before the tape TP is applied to the rear surface of the lead frame LF1, and FIG. 58B is an enlarged view showing a part of FIG. 58A. As shown in FIG. 58B, in the lead frame LF1 in the present third embodiment, the product regions PR are arranged in a matrix, and each of the product regions PR is partitioned by the partition region (boundary region). Now, attention is focused on each of the product regions PR. The chip mounting portion TAB(C), the chip mounting portion TAB(H), and the chip mounting portion TAB(L) are arranged in each of the product regions PR, the High-MOS chip CHP(H) is mounted over the chip mounting portion TAB(H), and the Low-MOS chip CHP(L) is mounted over the chip mounting portion TAB(L). On the other hand, in the present third embodiment, the driver IC chip CHP(C) is not mounted over the chip mounting portion TAB(C).

In the present third embodiment, the clip frame CLF is mounted so as to overlap with the lead frame LF1 in a planar manner. In this clip frame CLF, the unit regions UR are arranged in a matrix, and each of the unit regions UR is partitioned by a partition region (boundary region) DIV2. Now, attention is focused on each of the unit regions UR. The High-MOS clip CLP(H) and the Low-MOS clip CLP(L) are arranged in each of the unit regions UR. Thus, in the present third embodiment, the High-MOS clip CLP(H) is arranged so as to span from over the High-MOS chip CHP(H) to over the chip mounting portion TAB(L), and the Low-MOS clip CLP(L) is arranged so as to span from over the Low-MOS chip CHP(L) to over the lead. Then, the High-MOS clip CLP(H) and the Low-MOS clip CLP(L) are coupled to the partition region DIV2 of the clip frame CLF by the suspension lead HL.

Figure 59A:
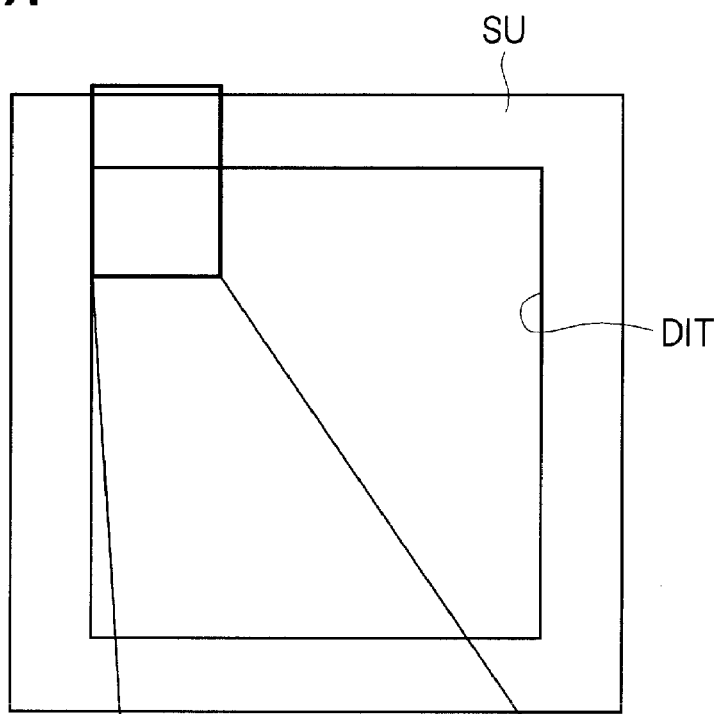
FIG. 59A is a plan view showing a schematic entire configuration of a support member used in the third embodiment.
Figure 59B:
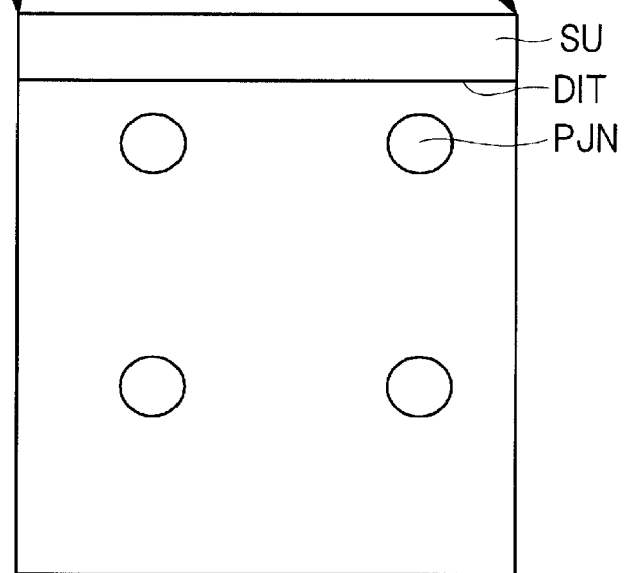
FIG. 59B is an enlarged view showing a part of FIG. 59A.

FIG. 59A is a plan view showing the schematic entire configuration of the support member SU used in the present third embodiment, and FIG. 59B is an enlarged view of a part of FIG. 59A. As shown in FIG. 59A and FIG. 59B, the support member SU includes an outer frame portion, and the ditch DIT is formed in an inner region of this outer frame portion. Then, the ditch DIT provided in the support member SU is arranged so as to include the product regions PR formed in the lead frame LF1. Then, as shown in FIG. 59B, in the support member SU used in the present third embodiment, a plurality of protrusions PJN is provided inside the ditch DIP. Each of these protrusions PJN is provided corresponding to the chip mounting portion TAB(C) arranged in each of the product regions PR of the lead frame LF1. In other words, the protrusion PJN is provided inside the ditch DIT so that the protrusion PJN and the chip mounting portion TAB(C) overlap with each other in a planar manner.

Figure 60:
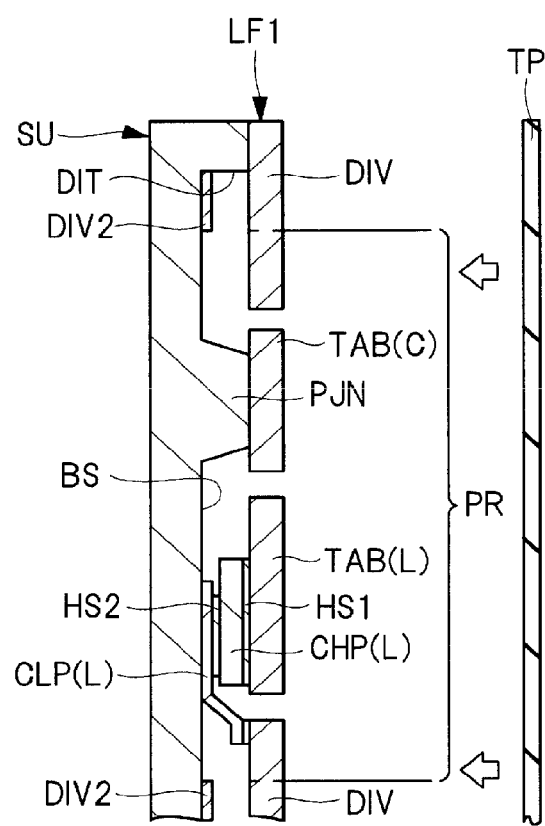
FIG. 60 is a cross-sectional view showing how a tape is applied to the rear surface of a lead frame in a state where the upper surface side of the lead frame is supported with a support member.

FIG. 60 is a cross-sectional view showing how the tape TP is applied to the rear surface of the lead frame LF1 in a state where the upper surface side of the lead frame LF1 is supported by the support member SU. As shown in FIG. 60, the product region PR provided in the lead frame LF1 is sandwiched by the partition regions DIV. Then, the chip mounting portion TAB(C) and the chip mounting portion TAB(L) are provided in the product region PR. Then, the Low-MOS chip CHP(L) is mounted over the chip mounting portion TAB(L) via the high melting point solder HS1, and the Low-MOS clip CLP(L) is arranged over this Low-MOS chip CHP(L) via the high melting point solder HS2. Note that, although not shown in FIG. 60, for example as can be seen also from FIG. 58B, the chip mounting portion TAB(H) is also arranged in the product region PR, the High-MOS chip CHP(H) is mounted over this chip mounting portion TAB(H) via the high melting point solder HS1, and the High-MOS clip CLP(H) is arranged over this High-MOS chip CHP(H) via the high melting point solder HS2. On the other hand, in the present third embodiment, the driver IC chip CHP(C) is not mounted over the chip mounting portion TAB(C).

Here, above the partition region DIV of the lead frame LF1, the partition region DIV2 of the clip frame CLF is arranged, and the upper surface side of the lead frame LF1 is supported by the support member SU so that this partition region DIV2 contacts the support member SU. Thus, the ditch DIT of the support member SU will be arranged at a location where it overlaps with the product region PR formed in the lead frame LF1 in a planar manner.

Then, in the present third embodiment, as shown in FIG. 60, the protrusion PJN formed in the ditch. DIT provided in the support member SU is configured so as to press the chip mounting portion TAB(C). As a result, according to the present third embodiment, the support member SU will support the upper surface side of the lead frame LF1 while pressing the chip mounting portion TAB(C). Therefore, according to the present third embodiment, the area for supporting the upper surface side of the lead frame LF1 can be increased. Thus, according to the present third embodiment, the tape TP can be reliably applied to the rear surface of the lead frame LF1 (in particular, to the rear surface of the product region PR). In particular, in the present third embodiment, the chip mounting portion TAB(C) can be sufficiently pressed by the protrusion PJN. Therefore, also in the rear surface of the chip mounting portion TAB(C), the tape TP can be reliably applied. That is, according to the present third embodiment, the adhesion of the tape TP in the rear surface of the chip mounting portion TAB(C) can be improved.

Thus, the following effects can be obtained. That is, over the chip mounting portion TAB(C), the driver IC chip CHP(C) is mounted in a subsequent step. In this driver IC chip CHP(C), a large number of electrode pads are formed, and a wire is electrically coupled to these electrode pads in the wire bonding step. This wire bonding step is carried out while vacuum-sucking the lead frame LF1 to a heat block, for example. At this time, for example, if the adhesion between the chip mounting portion TAB(C) and the tape TP is insufficient due to a sandwiched void (air bubble) and the like, then the chip mounting portion TAB(C) cannot be securely fixed, and also the transmission of ultrasonic vibration used in the wire bonding step cannot be sufficiently realized and thus the reliability of wire connection to the driver IC chip CHP(C) might be reduced.

Regarding this point, in the present third embodiment, particularly because the chip mounting portion TAB(C) is directly pressed by the protrusion PJN, a sufficient reaction force (repulsive force) can be obtained from the chip mounting portion TAB(C) side in applying the tape TP to the rear surface of the chip mounting portion TAB(C). As a result, according to the present third embodiment, the tape TP can be reliably applied to the rear surface of the chip mounting portion TAB(C). Thus, according to the present third embodiment, also in the wire bonding step, the chip mounting portion TAB(C) can be securely fixed to the heat block, and the transmission of ultrasonic vibration can be also sufficiently realized and the reliability of wire connection to the driver IC chip CHP(C) can be improved.

In particular, the present third embodiment has an advantage in pressing the chip mounting portion TAB(C), over which the driver IC chip CHP(C) is to be mounted, by the protrusion PJN. This is because among the High-MOS chip CHP(H), the Low-MOS chip CHP(L), and the driver IC chip CHP(C), the number of electrode pads formed in the driver IC chip CHP(C) is the largest and thus the wire connection reliability in the wire bonding step here is important. Also from this point, the configuration of the present third embodiment, in which the chip mounting portion TAB(C) on which the driver IC chip CHP(C) is to be mounted is directly pressed by the protrusion PJN, is highly advantageous.

On the other hand, also in the present third embodiment, as shown in FIG. 60, the upper surface side of the lead frame LF1 is supported by the support member SU so that the bottom surface BS of the ditch DIT contacts the upper surface of the Low-MOS clip CLP(L) mounted over the Low-MOS chip CHP(L).

Because this increases the area for supporting the product region PR formed in the lead frame LF1, the stability in fixing the product region PR can be improved. As a result, also in the product region PR of the lead frame LF1, a sufficient reaction force (repulsive force) from the lead frame LF1 generated in applying the tape TP to the rear surface of the lead frame LF1 can be secured. Therefore, according to the present third embodiment, it is possible to reliably apply the tape TP to the rear surface of the product region PR formed in the lead frame LF1 without involving a void and the like. That is, according to the present third embodiment, even in a state where the High-MOS chip CHP(H) and the Low-MOS chip CHP(L) are mounted on the upper surface side of the lead frame LF1, the tape TP can be reliably applied to the rear surface of the lead frame LF1 (in particular, to the rear surface of the product region PR).

Here, the Low-MOS chip CHP(L) is not configured so as to cause the bottom surface BS of the ditch DIT to directly contact the upper surface of the Low-MOS chip CHP(L) but is configured so that the Low-MOS clip CLP(L) is interposed between the Low-MOS chip CHP(L) and the bottom surface BS of the ditch DIT. That is, in the Low-MOS chip CHP(L), the bottom surface BS of the ditch DIT does not directly contact the upper surface of the Low-MOS chip CHP(L). That is, in the present third embodiment, the Low-MOS clip CLP(L) interposed between the Low-MOS chip CHP(L) and the bottom surface BS of the ditch DIT functions as a buffer material. For this reason, even if the upper surface side of the lead frame LF1 is supported by the support member SU so that the bottom surface BS of the ditch DIT contacts the Low-MOS clip CLP(L), the damage to the Low-MOS chip CHP(L) can be reduced to a level having no problem.

From the above, in the present third embodiment, the protrusion PJN protruding from the ditch DIT is configured so as to directly press the chip mounting portion TAB(C). Furthermore, in the present third embodiment, the bottom surface BS of the ditch DIT formed in the support member SU contacts the upper surface of the Low-MOS clip CLP(L) mounted over the Low-MOS chip CHP(L).

Thus, according to the present third embodiment, such a remarkable effect that it is possible to reliably apply the tape TP to the rear surface of the lead frame LF1 (in particular, to the rear surface of the product region PR) while reducing the damage to the High-MOS chip CHP(H) and the Low-MOS chip CHP(L), can be obtained.

<Modification>

Figure 61:
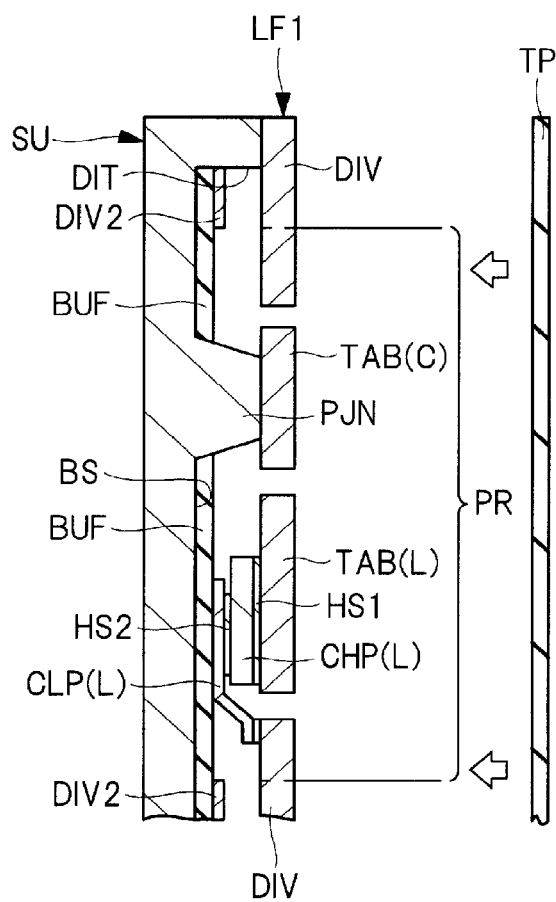
FIG. 61 is a cross-sectional view showing how a tape is applied to the rear surface of a lead frame in a state where the upper surface side of the lead frame is supported with a support member, in a modification of the third embodiment.

Subsequently, a modification in the present third embodiment is described. FIG. 61 is a cross-sectional view showing how the tape TP is applied to the rear surface of the lead frame LF1 in a state where the upper surface side of the lead frame LF1 is supported by the support member SU, in the present modification.

As shown in FIG. 61, in the present modification, as with the third embodiment, the protrusion PJN is provided inside the ditch DIT, and furthermore in the present modification the buffer material BUF is interposed between the upper surface of the Low-MOS clip CLP(L) and the bottom surface BS of the ditch DIT provided in the support member SU. That is, in the present modification, the Low-MOS clip CLP(L) and the buffer material BUF are interposed between the Low-MOS chip CHP(L) and the bottom surface BS of the ditch DIT. That is, in the present modification, the Low-MOS clip CLP(L) interposed between the Low-MOS chip CHP(L) and the bottom surface BS of the ditch DIT functions as a buffer material and further the buffer material BUF is also provided between the Low-MOS clip CLP(L) and the bottom surface BS of the ditch DIT. For this reason, even if the upper surface side of the lead frame LF1 is supported by the support member SU, the damage to the Low-MOS chip CHP(L) can be further reduced to a level having no problem.

From the above, also with the present modification, such a remarkable effect that it is possible to reliably apply the tape TP to the rear surface of the lead frame LF1 (in particular, to the entire rear surface of the product region PR) while reducing the damage to the High-MOS chip CHP(H) and the Low-MOS chip CHP(L), can be obtained.

Fourth Embodiment

In the above-described first embodiment to third embodiment, a semiconductor device, in which the driver IC chip CHP(C), the High-MOS chip CHP(H), and the Low-MOS chip CHP(L) are sealed by a sealing body, has been described, but the technical idea in the above-described first embodiment to third embodiment can be also applied, for example, to a semiconductor device, in which the High-MOS chip CHP(H) and the Low-MOS chip CHP(L) are sealed by a sealing body.

Figure 62:
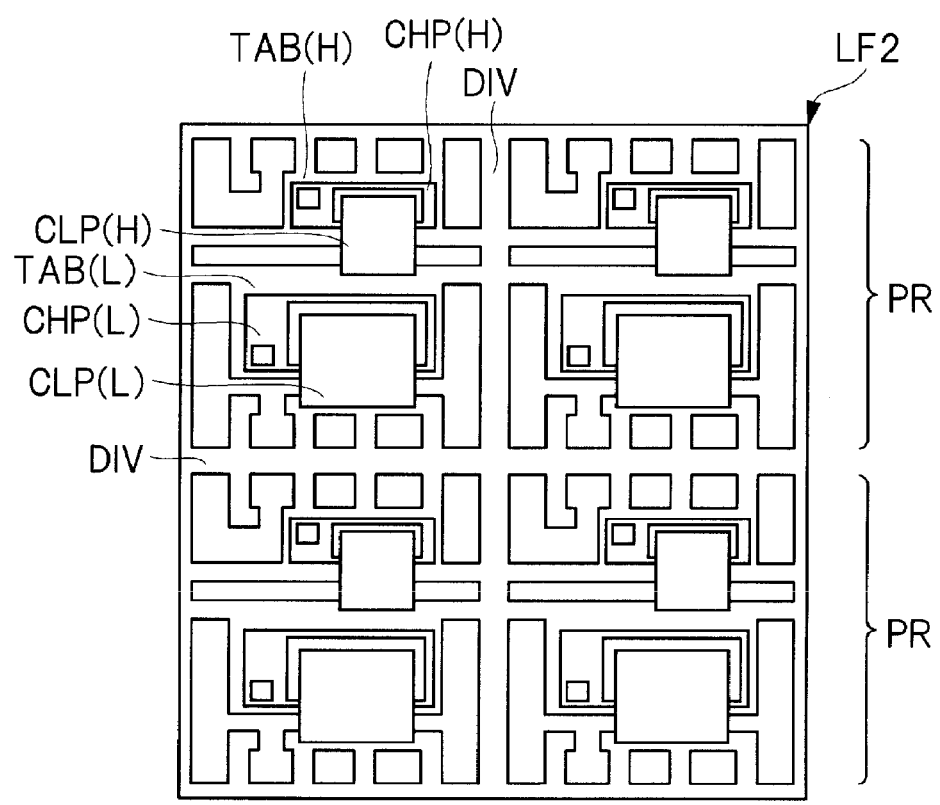
FIG. 62 is a view showing the configuration of a lead frame immediately before applying a tape to the rear surface of a lead frame in a fourth embodiment.

FIG. 62 is a view showing the configuration of a lead frame LF2 immediately before the tape TP is applied to the rear surface of the lead frame LF2 in the present fourth embodiment. As shown in FIG. 62, in the lead frame LF2 in the present fourth embodiment, the product regions PR are arranged in a matrix, and each of the product regions PR is partitioned by the partition region (boundary region) DIV. Then, focusing on each of the product regions PR, the chip mounting portion TAB(H) and the chip mounting portion TAB(L) are arranged in each of the product regions PR. At this time, the High-MOS chip CHP(H) is mounted over the chip mounting portion TAB(H) and the Low-MOS chip CHP(L) is mounted over the chip mounting portion TAB(L). Furthermore, the High-MOS clip CLP(H) is arranged so as to span from over the High-MOS chip CHP(H) to over the chip mounting portion TAB(L), and the Low-MOS clip CLP(L) is arranged so as to span from over the Low-MOS chip CHP(L) to over the lead.

Figure 63:
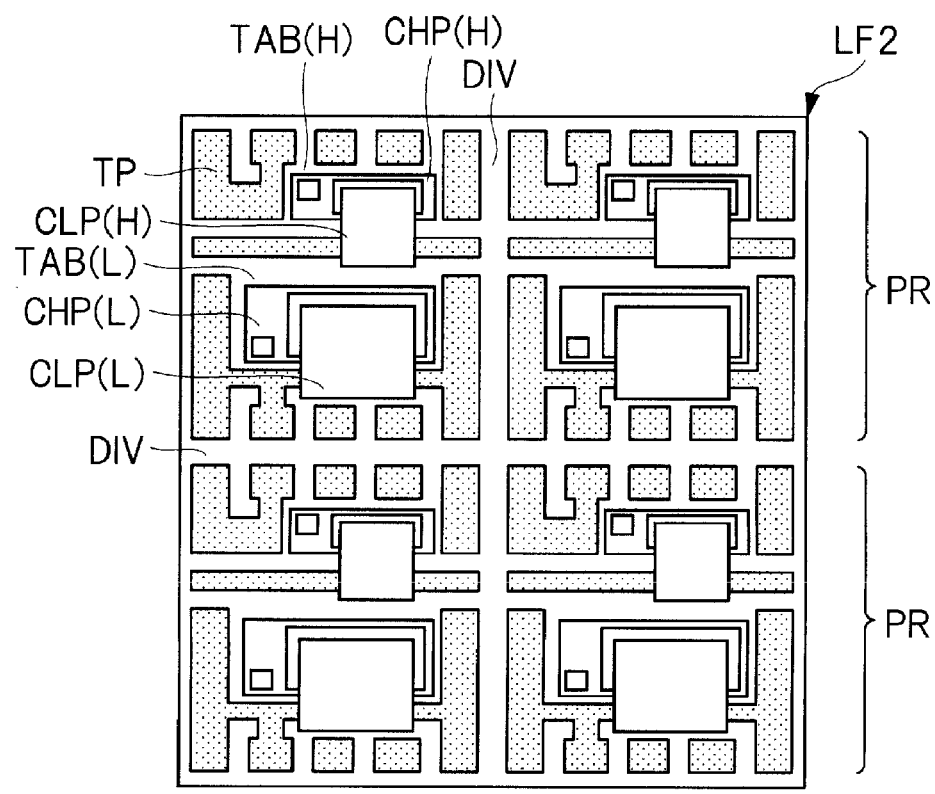
FIG. 63 is a view showing a state where a tape is applied to the rear surface of the lead frame in the fourth embodiment.

In the present fourth embodiment, the tape TP will be applied to the rear surface of the lead frame LF2 configured in this manner. FIG. 63 is a view showing a state of having applied the tape TP to the rear surface of the lead frame LF2 in the present fourth embodiment. As shown in FIG. 63, the tape TP is applied across the entire rear surface of the lead frame LF2.

Then, in the present fourth embodiment, among the faces of the lead frame LF2, the tape TP will be applied to the rear surface of the lead frame LF2 while the upper surface opposite to the rear surface, to which the tape TP is applied, is supported by a support member. Here, in the present fourth embodiment, the upper surface side of the lead frame LF2 will be supported by the support member, but the High-MOS chip CHP(H) and the Low-MOS chip CHP(L) are already mounted on the upper surface side of the lead frame LF2 as described above. Therefore, also in the present fourth embodiment, as with the above-described first embodiment to the present third embodiment, the upper surface side of the lead frame LF2 needs to be supported by the support member without damaging the High-MOS chip CHP(H) and the Low-MOS chip CHP(L).

Figure 64:
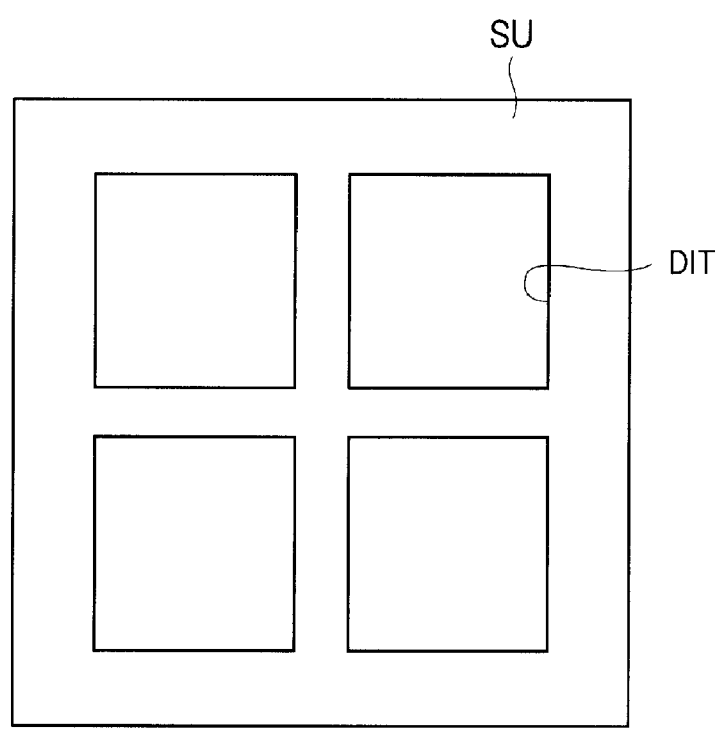
FIG. 64 is a plan view showing a schematic entire configuration of a support member used in the fourth embodiment.

FIG. 64 is a plan view showing a schematic entire configuration of the support member SU used in the present fourth embodiment. As shown in FIG. 64, the support member SU includes a plurality of frame portions, and the ditch DIT is partitioned by the frame portions. Then, for example, corresponding to the product region PR of the lead frame LF2 shown in FIG. 62, the ditch DIT provided in the support member SU shown in FIG. 64 is arranged.

Figure 65:
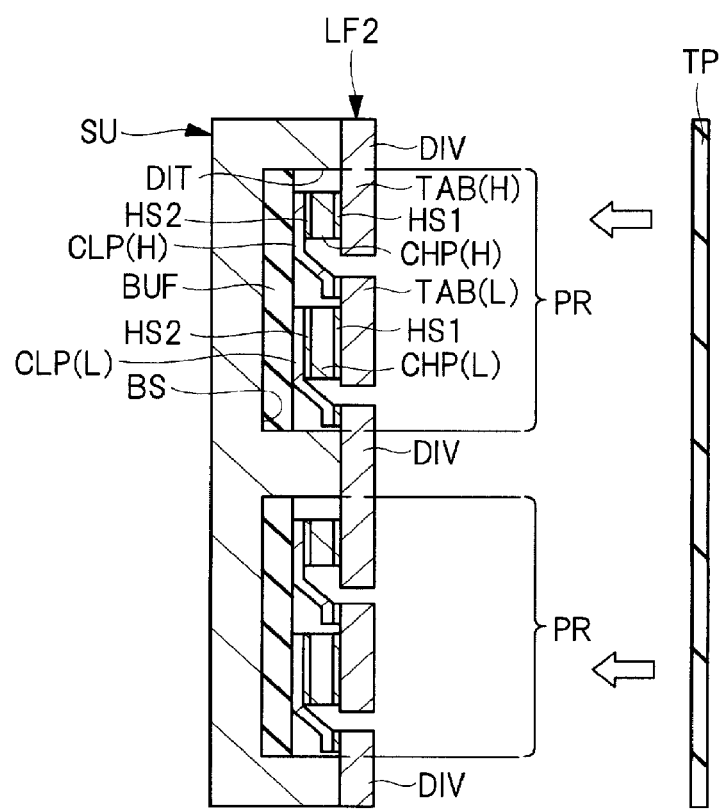
FIG. 65 is a cross-sectional view showing how a tape is applied to the rear surface of a lead frame in a state where the upper surface side of the lead frame is supported with the support member, in a modification of the fourth embodiment.

FIG. 65 is a cross-sectional view showing how the tape TP is applied to the rear surface of the lead frame LF2 in a state where the upper surface side of the lead frame LF2 is supported by the support member SU, in the present fourth embodiment.

As shown in FIG. 65, in the present fourth embodiment, the buffer material BUF is interposed also between the upper surface of the High-MOS clip CLP(H) and the bottom surface BS of the ditch DIT provided in the support member SU. That is, in the present fourth embodiment, the High-MOS clip CLP(H) and the buffer material BUF are interposed between the High-MOS chip CHP(H) and the bottom surface BS of the ditch DIT. That is, in the present fourth embodiment, the High-MOS clip CLP(H) interposed between the High-MOS chip CHP(H) and the bottom surface BS of the ditch DIT functions as a buffer material, and furthermore the buffer material BUF is also provided between the High-MOS clip CLP(H) and the bottom surface BS of the ditch DIT. For this reason, even if the upper surface side of the lead frame LF2 is supported by the support member SU, the damage to the High-MOS chip CHP(H) can be further reduced to a level having no problem.

Similarly, in the present fourth embodiment, the buffer material BUF is interposed also between the upper surface of the Low-MOS clip CLP(L) and the bottom surface BS of the ditch DIT provided in the support member SU. That is, in the present fourth embodiment, the Low-MOS clip CLP(L) and the buffer material BUF are interposed between the Low-MOS chip CHP(L) and the bottom surface BS of the ditch DIT. That is, in the present fourth embodiment, the Low-MOS clip CLP(L) interposed between the Low-MOS chip CHP(L) and the bottom surface BS of the ditch DIT functions as a buffer material, and furthermore the buffer material BUF is also provided between the Low-MOS clip CLP(L) and the bottom surface BS of the ditch DIT. For this reason, even if the upper surface side of the lead frame LF2 is supported by the support member SU, the damage to the Low-MOS chip CHP(L) can be further reduced to a level having no problem.

From the above, also with the present fourth embodiment, such a remarkable effect that it is possible to reliably apply the tape TP to the rear surface of the lead frame LF2 (in particular, to the entire rear surface of the product region PR) while reducing the damage to the High-MOS chip CHP(H) and the Low-MOS chip CHP(L), can be obtained.

Note that, in the present fourth embodiment, an example using the buffer material BUF has been described, but as with the above-described first embodiment, without using the buffer material BUF, the bottom surface BS of the ditch DIT may be configured so as to contact the top of the High-MOS clip CLP(H) and the top of the Low-MOS clip CLP(L).

Figure 66:
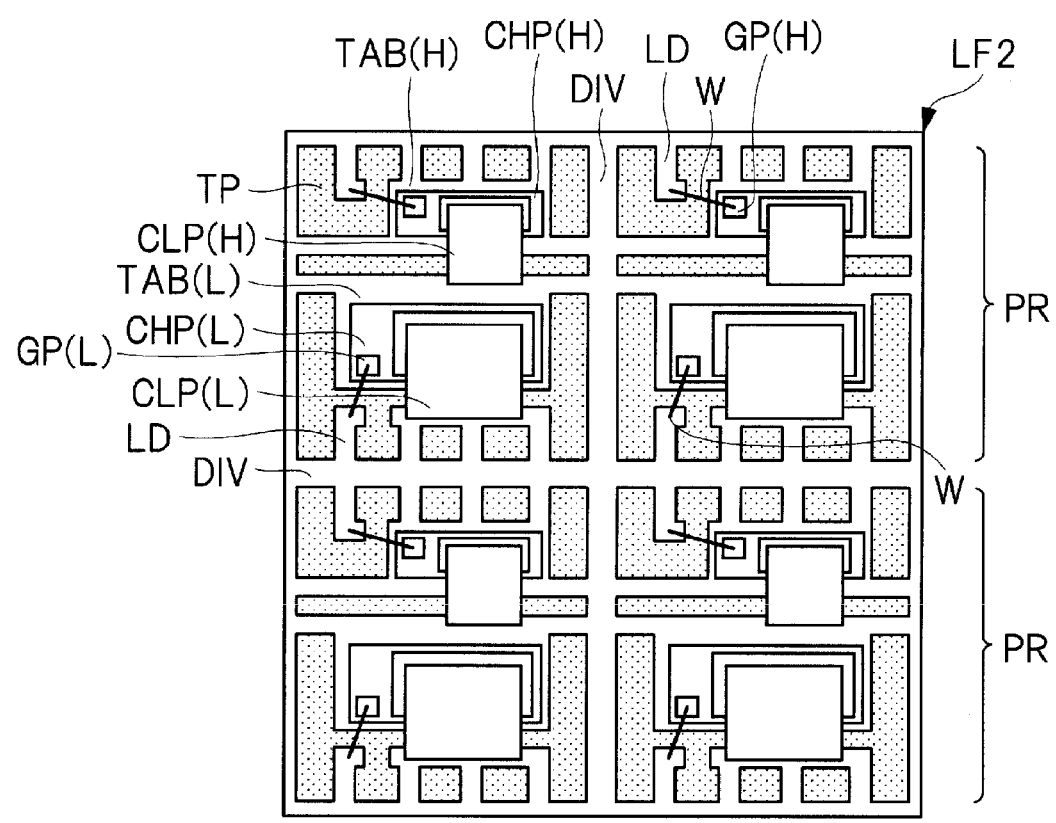
FIG. 66 is a view for illustrating a wire bonding step in the fourth embodiment.

Subsequently, as shown in FIG. 66, the gate electrode pad GP(H) formed in the High-MOS chip CHP(H) and the lead LD are electrically coupled to each other by the wire W, and the gate electrode pad GP(L) formed in the Low-MOS chip CHP(L) and the lead LD are electrically coupled to each other by the wire W. The subsequent step is the same as that of the above-described first embodiment. In this manner, the semiconductor device in the present fourth embodiment can be manufactured.

<Modification 1>

A Modification 1, as with the fourth embodiment, is also directed to a semiconductor device, in which the High-MOS chip CHP(H) and the Low-MOS chip CHP(L) are sealed by a sealing body, but in particular in the present Modification 1, an example, in which the High-MOS clip CLP(H) is not mounted over the High-MOS chip CHP(H), is described.

Figure 67:
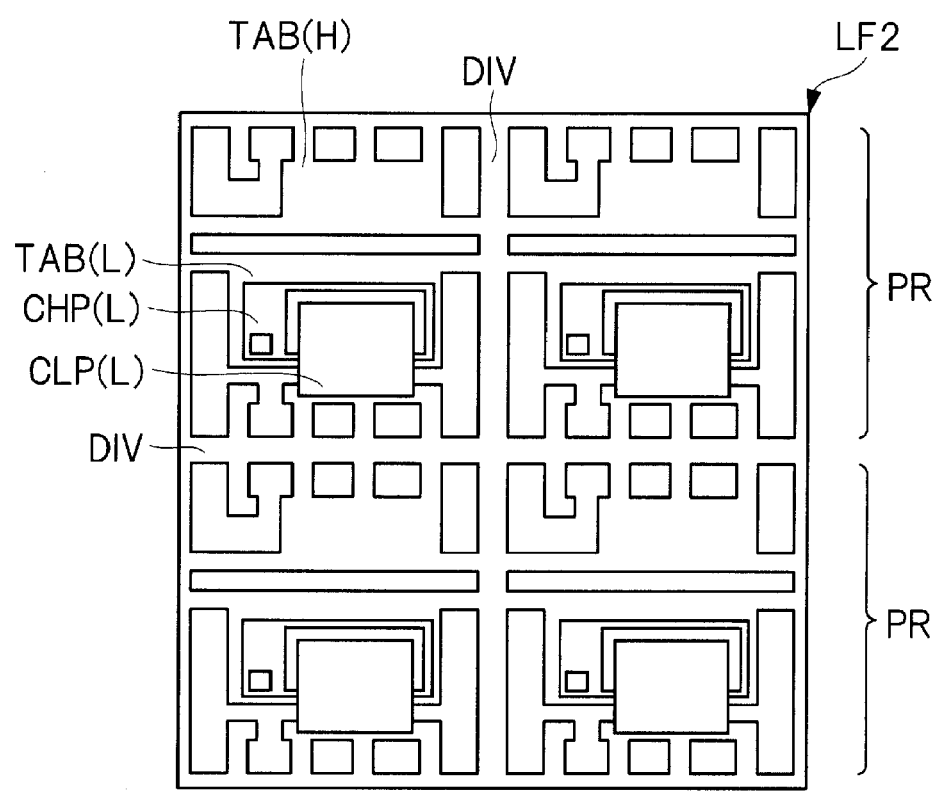
FIG. 67 is a view showing the configuration of a lead frame immediately before applying a tape to the rear surface of the lead frame, in a Modification 1 of the fourth embodiment.

FIG. 67 is a view showing the configuration of the lead frame LF2 immediately before the tape TP is applied to the rear surface of the lead frame LF2 in the present Modification 1. As shown in FIG. 67, in the lead frame LF2 in the present Modification 1, the product regions PR are arranged in a matrix, and each of the product regions PR is partitioned by the partition region (boundary region) DIV. Then, focusing on each of the product regions PR, the chip mounting portion TAB(H) and the chip mounting portion TAB(L) are arranged in each of the product regions PR. At this time, the High-MOS chip CHP(H) is not mounted over the chip mounting portion TAB(H), while the Low-MOS chip CHP(L) is mounted over the chip mounting portions TAB(L). Furthermore, the Low-MOS clip CLP(L) is arranged so as to span from over the Low-MOS chip CHP(L) to over the lead.

Figure 68:
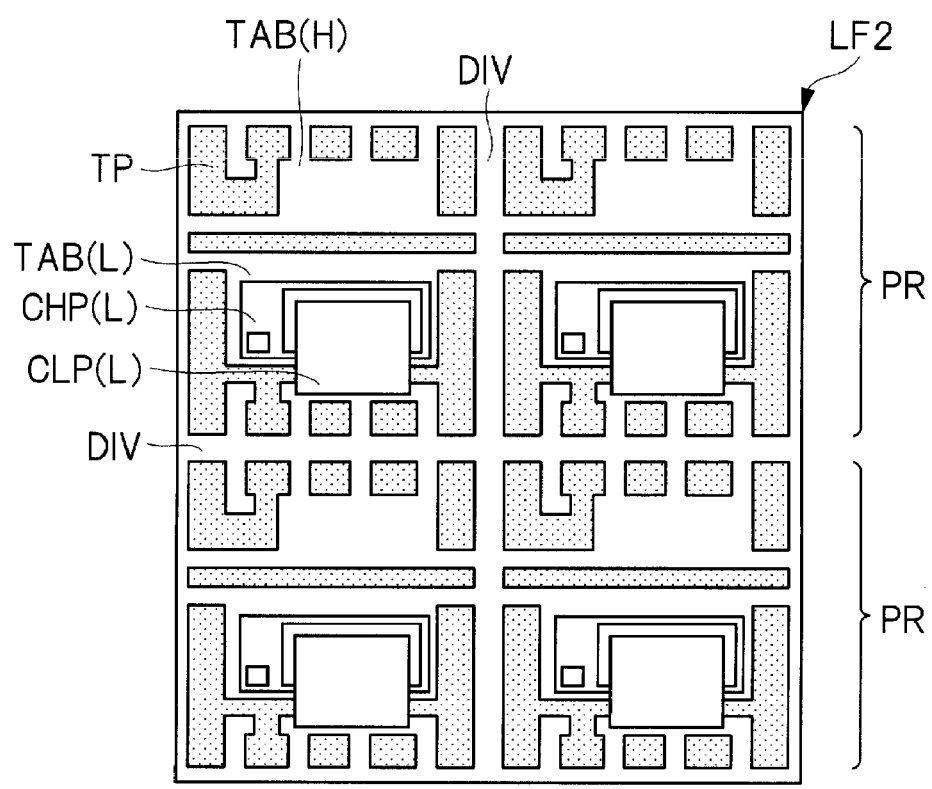
FIG. 68 is a view showing a state where a tape is applied to the rear surface of the lead frame in the Modification 1.

In the present Modification 1, the tape TP will be applied to the rear surface of, the lead frame LF2 configured in this manner. FIG. 68 is a view showing a state of having applied the tape TP to the rear surface of the lead frame LF2 in the present Modification 1. As shown in FIG. 68, the tape TP is applied across the entire rear surface of the lead frame LF2.

Then, in the present Modification 1, among the faces of the lead frame LF2, the tape TP will be applied to the rear surface of the lead frame LF2 while the upper surface opposite to the rear surface, to which the tape TP is applied, is supported by a support member. Here, in the present Modification 1, although the upper surface side of the lead frame LF2 will be supported by a support member, the driver IC chip CHP(C) is already mounted on the upper surface side of the lead frame LF2 as described above. Therefore, also in the present Modification 1, the upper surface side of the lead frame LF2 needs to be supported by a support member without damaging the Low-MOS chip CHP(L).

Figure 69:
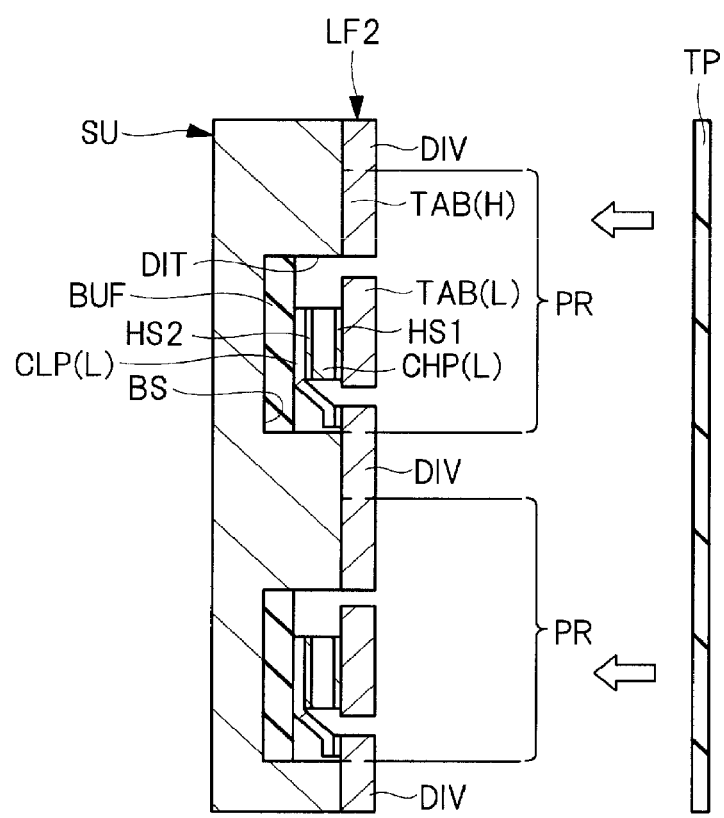
FIG. 69 is a cross-sectional view showing how a tape is applied to the rear surface of a lead frame in a state where the upper surface side of the lead frame is supported with a support member, in the Modification 1.

FIG. 69 is a cross-sectional view showing how the tape TP is applied to the rear surface of the lead frame LF2 in a state where the upper surface side of the lead frame LF2 is supported by the support member SU, in the present Modification 1. As shown in FIG. 69, in carrying out the step of applying the tape TP to the current rear surface of the lead frame LF2, the High-MOS chip CHP(H) has not been mounted over the chip mounting portion TAB(H) yet. For this reason, in the present Modification 1, the chip mounting portion TAB(H), over which the High-MOS chip CHP(H) is not mounted, can be pressed by the support member SU. Therefore, in the present Modification 1, the region for pressing the lead frame LF2 increases and thus the tape TP can be reliably applied to the rear surface of the lead frame LF2.

Furthermore, in the present Modification 1, the buffer material BUF is interposed also between the upper surface of the Low-MOS clip CLP(L) and the bottom surface BS of the ditch DIT provided in the support member SU. That is, in the present Modification 1, the Low-MOS clip CLP(L) and the buffer material BUF are interposed between the Low-MOS chip CHP(L) and the bottom surface BS of the ditch DIT. That is, in the present Modification 1, the Low-MOS clip CLP(L) interposed between the Low-MOS chip CHP(L) and the bottom surface BS of the ditch DIT functions as a buffer material, and furthermore the buffer material BUF is also provided between the Low-MOS clip CLP(L) and the bottom surface BS of the ditch DIT. For this reason, even if the upper surface side of the lead frame LF2 is supported by the support member SU, the damage to the Low-MOS chip CHP(L) can be reduced to a level having no problem.

Note that, also in the present Modification 1, an example using the buffer material BUF has been described, but for example, without using the buffer material BUF, the bottom surface BS of the ditch DIT may be configured so as to contact the top of the Low-MOS clip CLP(L).

Figure 70:
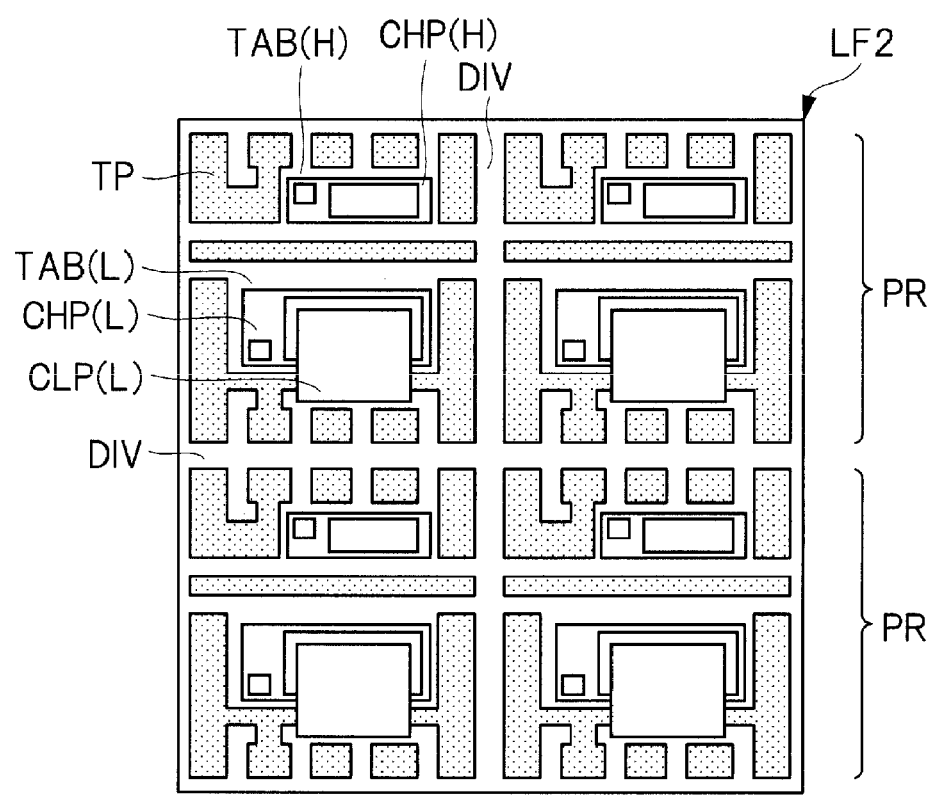
FIG. 70 is a view showing how a High-MOS chip is mounted in the Modification 1.
Figure 71:
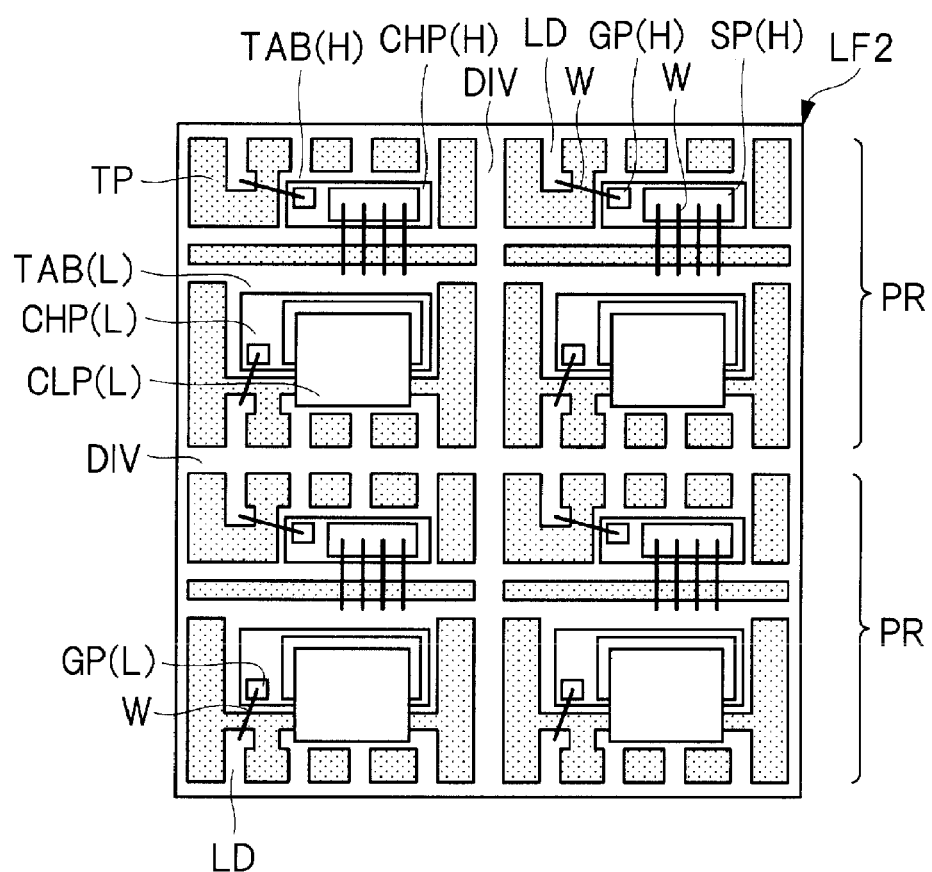
FIG. 71 is a view for illustrating a wire bonding step in the Modification 1.

Subsequently, in each of the product regions PR formed in the lead frame LF2, a silver paste is applied over the chip mounting portion TAB(H). Then, as shown in FIG. 70, in each of the product regions PR formed in the lead frame LF2, the High-MOS chip CHP(H) is mounted over the chip mounting portion TAB(H). Subsequently, as shown in FIG. 71, the gate electrode pad GP(H) formed in the High-MOS chip CHP(H) and the lead LD are electrically coupled to each other by the wire W, and the source electrode pad SP(H) formed in the High-MOS chip CHP(H) and the chip mounting portion TAB(L) are electrically coupled to each other by the wire W. Furthermore, the gate electrode pad GP(L) formed in the Low-MOS chip CHP(L) and the lead LD are electrically coupled to each other by the wire W. The subsequent step is the same as that of the above-described first embodiment. In this manner, the semiconductor device in the present Modification 1 can be manufactured.

<Modification 2>

In a Modification 2 is described a semiconductor device, in which for example a single semiconductor chip having a power MOSFET (a switching field effect transistor) formed therein is sealed by a sealing body.

Figure 72:
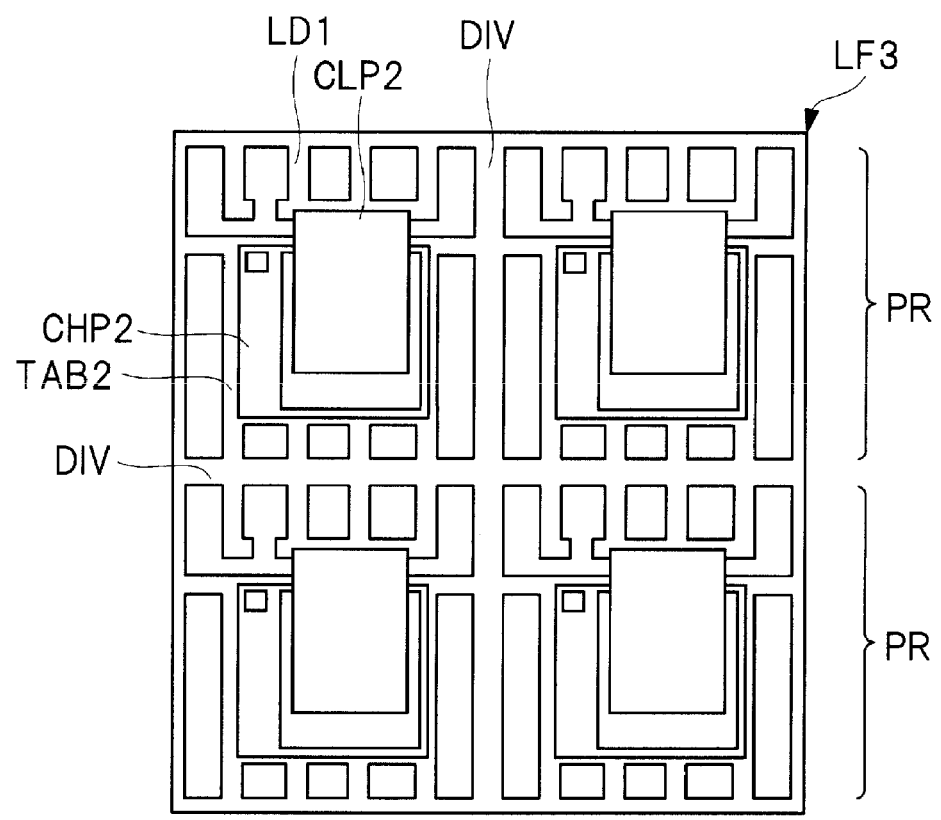
FIG. 72 is a view showing the configuration of a lead frame immediately before applying a tape to the rear surface of a lead frame in a Modification 2 of the fourth embodiment.

FIG. 72 is a view showing the configuration of a lead frame LF3 immediately before the tape TP is applied to the rear surface of the lead frame LF3 in the present Modification 2. As shown in FIG. 72, in the lead frame LF3 in the present Modification 2, the product regions PR are arranged in a matrix, and each of the product regions PR is partitioned by a partition region (boundary region) DIV. Focusing on each of the product regions PR, a chip mounting portion TAB2 is arranged in each of the product regions PR. Then, a semiconductor chip CHP2 is mounted over the chip mounting portion TAB2, and a clip CLP2 is arranged so as to span from over the semiconductor chip CHP2 to over the lead LD1.

Figure 73:
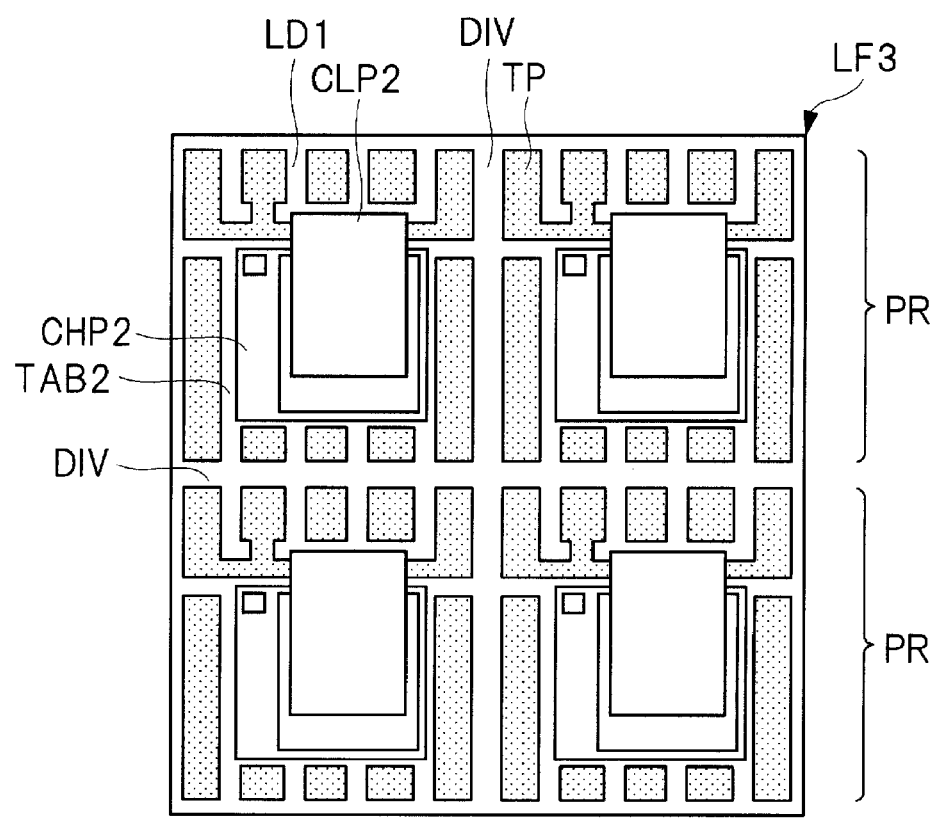
FIG. 73 is a view showing a state where a tape is applied to the rear surface of the lead frame in the Modification 2.

In the present Modification 2, the tape TP will be applied to the rear surface of the lead frame LF3 configured in this manner. FIG. 73 is a view showing a state of having applied the tape TP to the rear surface of the lead frame LF3, in the present Modification 2. As shown in FIG. 73, the tape TP is applied across the entire rear surface of the lead frame LF3.

Then, in the present Modification 2, among the faces of the lead frame LF3, the tape TP will be applied to the rear surface of the lead frame LF3 in a state where the upper surface opposite to the rear surface, to which the tape TP is applied, is supported by a support member. Here, in the present Modification 2, the upper surface side of the lead frame LF3 will be supported by a support member, but the semiconductor chip CHP2 is already mounted on the upper surface side of the lead frame LF3 as described above. Therefore, also in the present Modification 2, the upper surface side of the lead frame LF3 needs to be supported by a support member without damaging the semiconductor chip CHP2.

Figure 74:
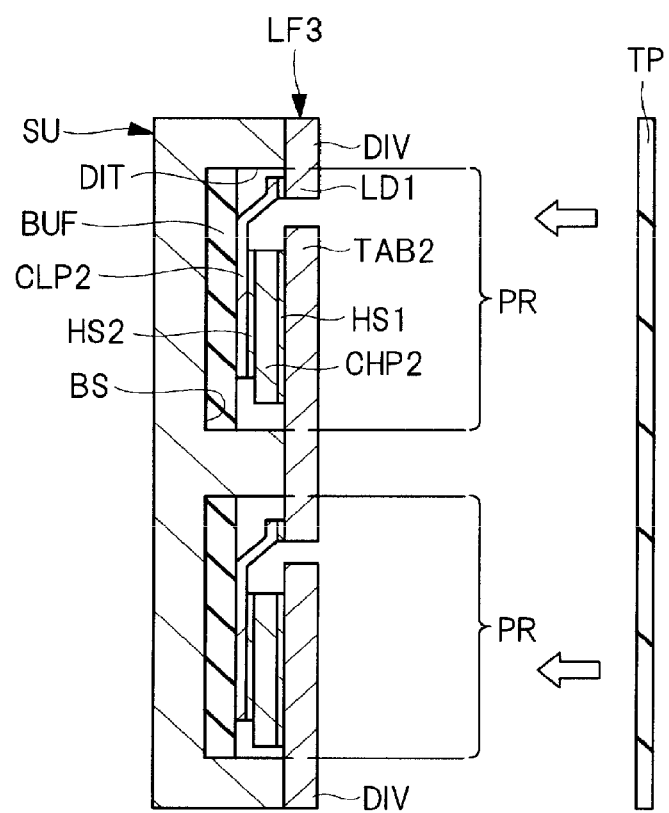
FIG. 74 is a cross-sectional view showing how a tape is applied to the rear surface of a lead frame in a state where the upper surface side of the lead frame is supported with a support member, in the Modification 2.

FIG. 74 is a cross-sectional view showing how the tape TP is applied to the rear surface of the lead frame LF3 in a state where the upper surface side of the lead frame LF3 is supported by the support member SU, in the present Modification 2. As shown in FIG. 74, in the present Modification 2, the buffer material BUF is interposed also between the upper surface of the clip CLP2 and the bottom surface BS of the ditch DIT provided in the support member SU. That is, in the present Modification 2, the clip CLP2 and the buffer material BUF are interposed between the semiconductor chip CHP2 and the bottom surface BS of the ditch DIT. That is, in the present Modification 2, the clip CLP2 interposed between the semiconductor chip CHP2 and the bottom surface BS of the ditch DIT functions as a buffer material, and furthermore the buffer material BUF is also provided between the clip CLP2 and the bottom surface BS of the ditch DIT. For this reason, even if the upper surface side of the lead frame LF3 is supported by the support member SU, the damage to the semiconductor chip CHP2 can be reduced to a level having no problem.

Note that, also in the present Modification 2, an example using buffer material BUF has been described, but for example, without using the buffer material BUF, the bottom surface BS of the ditch DIT may be configured so as to contact the top of the clip CLP2.

Figure 75:
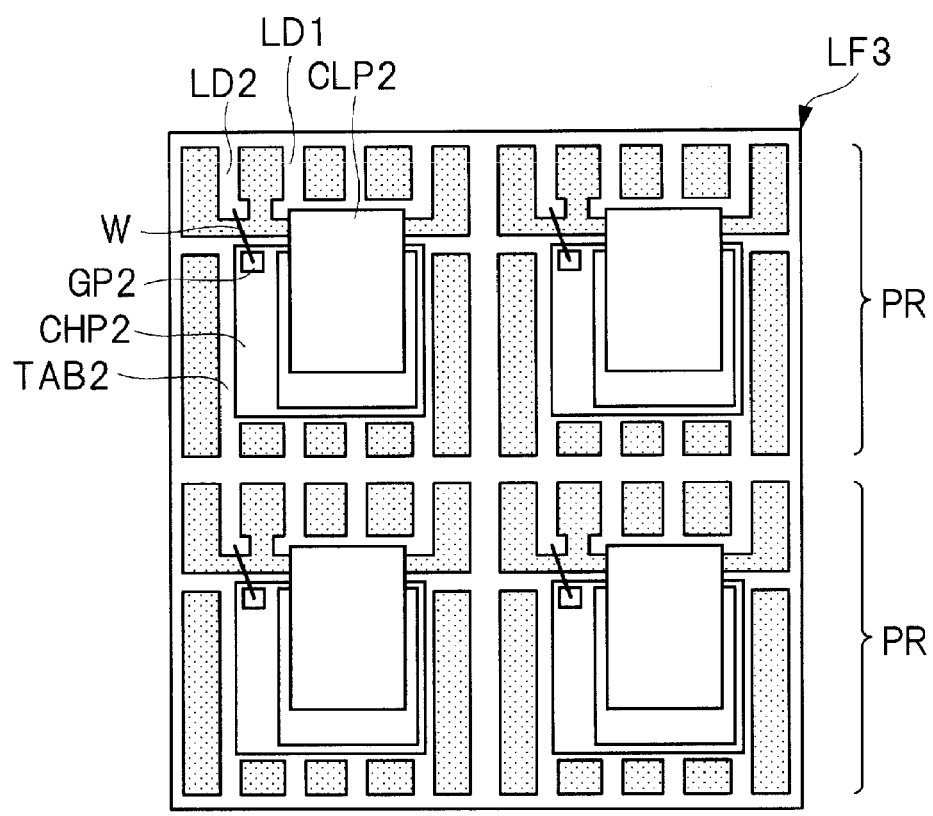
FIG. 75 is a view for illustrating a wire bonding step in the Modification 2.

Thereafter, as shown in FIG. 75, a gate electrode pad GP2 formed in the semiconductor chip CHP2 and a lead LD2 are electrically coupled to each other by the wire W. The subsequent step is the same as that of the above-described first embodiment. In this manner, the semiconductor device in the present Modification 2 can be manufactured.

The present invention of the present inventors has been described specifically according to the embodiments. However, it is obvious that the present invention is not limited to the embodiments, but various modifications are possible without departing from the scope of the invention.

What is claimed is:

1. A method of manufacturing a semiconductor device, comprising the steps of:
   (a) providing a lead frame having a plurality of product areas, each of the plurality of product areas including a first chip mounting portion, a second chip mounting portion, a first lead and a second lead;
   (b) after the step (a), forming first and second conductive materials over a first upper surface of the first chip mounting portion and a second upper surface of the second chip mounting portion, respectively;
   (c) after the step (b), mounting first and second semiconductor chips over the first and second upper surfaces via the first and second conductive materials, respectively;
   (d) after the step (c), forming a third conductive material over a first electrode pad of the first semiconductor chip;
   (e) after the step (d), mounting a metal plate over the first electrode pad via the third conductive material, and electrically connecting the first electrode pad with the first lead via the metal plate;
   (f) after the step (e), heating the lead frame including the first, second and third conductive materials;
   (g) after the step (f), attaching a tape to a rear surface of the lead frame including a first lower surface of the first chip mounting portion, which is opposite to the first upper surface, and a second lower surface of the second chip mounting portion, which is opposite to the second upper surface;
   (h) after the step (g), electrically connecting a second electrode pad of the first semiconductor chip with a third electrode pad of the second semiconductor chip via a first wire, and electrically connecting a fourth electrode pad of the second semiconductor chip with the second lead via a second wire; and
   (i) after the step (h), sealing a front surface of the lead frame, which is opposite to the rear surface and including the plurality of product areas, with resin,
   wherein a reflow temperature of each of the first, second and third conductive materials is higher than a heat-resisting temperature of the tape,
   wherein, in the step (f), the lead frame is heated at a temperature higher than the heat-resisting temperature of the tape, and
   wherein, in the step (g), the tape is attached to the first lower surface and the second lower surface by contacting a support member with the metal plate and also by pressing the metal plate with the support member, while not contacting the support member with the second semiconductor chip.

2. The method according to claim 1, further comprising the following steps (j)-(l),
   (j) after the step (i), peeling the tape off from the rear surface of lead frame so as to expose the first lower surface and the second lower surface from the resin;
   (k) after the step (j), forming a plating film over each of the first and second lower surfaces exposed from the resin; and
   (l) after the step (k), cutting the lead frame and the resin so as to cingulate the plurality of product areas.

3. The method according to claim 1, wherein, in the step (g), a buffer material is interposed between the support member and the second semiconductor chip.

4. The method according to claim 1, wherein, in plan view, an area of the second semiconductor chip is smaller than an area of the first semiconductor chip.

5. The method according to claim 4,
   wherein the first semiconductor chip includes a field effect transistor, and
   wherein the second semiconductor chip includes a control circuit to control the field effect transistor.

6. The method according to claim 1,
   wherein each of the first, second and third conductive materials is comprised of solder,
   wherein the tape is comprised of a base material part and a paste part, and
   wherein the base material is comprised of a polyimide resin.

7. A method of manufacturing a semiconductor device, comprising the steps of:
   (a) providing a lead frame including a first chip mounting portion, a second chip mounting portion, a first lead and a second lead;
   (b) after the step (a), forming first and second conductive materials over a first upper surface of the first chip mounting portion and a second upper surface of the second chip mounting portion, respectively;
   (c) after the step (b), mounting first and second semiconductor chips over the first and second upper surfaces via the first and second conductive materials, respectively;
   (d) after the step (c), forming a third conductive material over a first electrode pad of the first semiconductor chip;
   (e) after the step (d), mounting a metal plate over the first electrode pad via the third conductive material, and electrically connecting the first electrode pad with the first lead via the metal plate;
   (f) after the step (e), heating the lead frame including the first, second and third conductive materials;
   (g) after the step (f), attaching a tape to a rear surface of the lead frame including a first lower surface of the first chip mounting portion, which is opposite to the first upper surface, and a second lower surface of the second chip mounting portion, which is opposite to the second upper surface;
   (h) after the step (g), electrically connecting a second electrode pad of the first semiconductor chip with a third electrode pad of the second semiconductor chip via a first wire, and electrically connecting a fourth electrode pad of the second semiconductor chip with the second lead via a second wire; and
   (i) after the step (h), sealing a front surface of the lead frame, which is opposite to the rear surface and including the first semiconductor chip, the second semiconductor chip, the metal plate, the first wire and the second wire, with resin,
   wherein a reflow temperature of each of the first, second and third conductive materials is higher than a heat-resisting temperature of the tape,
   wherein, in the step (f), the lead frame is heated at a temperature higher than the heat-resisting temperature of the tape, and
   wherein, in the step (g), the tape is attached to the first lower surface and the second lower surface by contacting a support member with the metal plate and also by pressing the metal plate with the support member, while not contacting the support member with the second semiconductor chip.

8. The method according to claim 7, further comprising the following steps (j)-(k), (j) after the step (i), peeling the tape off from the rear surface of lead frame so as to expose the first lower surface and the second lower surface from the resin; and (k) after the step (j), forming a plating film over each of the first and second lower surfaces exposed from the resin.

9. The method according to claim 7, wherein, in the step (g), a buffer material is interposed between the support member and the second semiconductor chip.

10. The method according to claim 7, wherein, in plan view, an area of the second semiconductor chip is smaller than an area of the first semiconductor chip.

11. The method according to claim 10, wherein the first semiconductor chip includes a field effect transistor, and wherein the second semiconductor chip includes a control circuit to control the field effect transistor.

12. The method according to claim 7, wherein each of the first, second and third conductive materials is comprised of solder, wherein the tape is comprised of a base material part and a paste part, and wherein the base material is comprised of a polyimide resin.

13. A method of manufacturing a semiconductor device, comprising the steps of:

(a) providing a lead frame including a first chip mounting portion;

(b) after the step (a), forming a first conductive material over a first upper surface of the first chip mounting portion;

(c) after the step (b), mounting a first semiconductor chip over the first upper surface via the first conductive material;

(d) after the step (c), heating the lead frame including the first conductive material;

(e) after the step (d), attaching a tape to a first lower surface of the first chip mounting portion, which is opposite to the first upper surface; and (f) after the step (e), sealing the first semiconductor chip with resin, wherein a reflow temperature of the first conductive material is higher than a heat-resisting temperature of the tape, wherein, in the step (d), the lead frame is heated at a temperature higher than the heat-resisting temperature of the tape, wherein the first conductive material is comprised of solder, wherein the tape is comprised of a base material part and a paste part, wherein the base material is comprised of a polyimide resin, wherein the lead frame further includes a first lead, and wherein, after the step (c) and before the step (d), a second conductive material is formed over a first electrode pad of the first semiconductor chip, a metal plate is mounted over the first electrode pad via the second conductive material, and electrically connecting the first electrode pad with the first lead via the metal plate.

14. The method according to claim 13, wherein a reflow temperature of the second conductive material is higher than the heat-resisting temperature of the tape, and wherein, in the step (d), the lead frame is heated at the temperature higher than the heat-resisting temperature of the tape.

* * * * *